(12) United States Patent
Ichihara et al.

(10) Patent No.: US 12,034,877 B2
(45) Date of Patent: Jul. 9, 2024

(54) OUTER SHELL MEMBER FOR COMMUNICATION EQUIPMENT

(71) Applicant: Yamamoto Printing Co., Ltd., Osaka (JP)

(72) Inventors: Keiko Ichihara, Osaka (JP); Michiyo Hattori, Osaka (JP)

(73) Assignee: YAMAMOTO PRINTING CO., LTD., Osaka (JP)

( * ) Notice: Subject to any disclaimer, the term of this patent is extended or adjusted under 35 U.S.C. 154(b) by 315 days.

(21) Appl. No.: 17/616,791

(22) PCT Filed: Jul. 14, 2020

(86) PCT No.: PCT/JP2020/027328
§ 371 (c)(1),
(2) Date: Dec. 6, 2021

(87) PCT Pub. No.: WO2021/145012
PCT Pub. Date: Jul. 22, 2021

(65) Prior Publication Data
US 2022/0353353 A1    Nov. 3, 2022

(30) Foreign Application Priority Data
Jan. 16, 2020   (JP) .................................. 2020-005514

(51) Int. Cl.
*H04M 1/02*     (2006.01)
*B32B 7/023*    (2019.01)
(Continued)

(52) U.S. Cl.
CPC .......... *H04M 1/0202* (2013.01); *B32B 7/023* (2019.01); *H01Q 1/243* (2013.01); *H01Q 1/425* (2013.01); *H05K 5/03* (2013.01); *H05K 9/0007* (2013.01)

(58) Field of Classification Search
CPC ..... H04M 1/0202; B32B 7/023; H01Q 1/243; H01Q 1/425; H05K 5/03; H05K 9/0007
See application file for complete search history.

(56) References Cited

U.S. PATENT DOCUMENTS

2013/0323579 A1* 12/2013 Hwang .............. H01Q 15/0013
156/242

FOREIGN PATENT DOCUMENTS

| JP | 2003-289355 A | 10/2003 |
| JP | 2004-327306 A | 11/2004 |

(Continued)

OTHER PUBLICATIONS

International Search Report dated Sep. 8, 2020 issued in corresponding PCT/JP2020/027328 application (2 pages).

*Primary Examiner* — Keith Ferguson
(74) *Attorney, Agent, or Firm* — MILLEN, WHITE, ZELANO & BRANIGAN, P.C.; Ryan R. Pool

(57) ABSTRACT

Provided is an outer shell member for communication equipment, capable of enhancing metallic luster design while suppressing the generation of radio wave shielding that affects communication. A metallic tone print sheet 51 is arranged at least on a portion of an outer shell member for communication equipment including a mobile device 1 with a communication device and a protective case mounted thereon. The metallic tone print sheet 51 includes, when viewed from the front, a metallic portion equipped with a metallic reflective layer and a transmission portion not equipped with a metallic reflective layer. The metallic reflective layer is provided with a metallic concave reflective surface that is curved in a cross-section in the thickness direction of the metallic tone print sheet. The transmission portion has a radio wave permeability that transmits radio waves to the communication device.

14 Claims, 42 Drawing Sheets

(51) Int. Cl.
 *H01Q 1/24* (2006.01)
 *H01Q 1/42* (2006.01)
 *H05K 5/03* (2006.01)
 *H05K 9/00* (2006.01)

(56) References Cited

FOREIGN PATENT DOCUMENTS

| | | |
|---|---|---|
| JP | 2006-203520 A | 8/2006 |
| JP | 2009-164029 A | 7/2009 |
| JP | 5260486 B2 | 8/2013 |
| JP | 2014-179614 A | 9/2014 |
| JP | 6409153 B1 | 10/2018 |
| WO | 2017/141556 A1 | 8/2017 |
| WO | 2019/044048 A1 | 3/2019 |

* cited by examiner (A)

(B)

(A)

(B)

(A)

(B)

(A)

(B)

A1

A2

A3

A4

A5

A6

A7

A8

B1
 B2
 C1
 C2

D5

D6

D7

D8

D9

D10

D11

D12

OUTER SHELL MEMBER FOR COMMUNICATION EQUIPMENT

TECHNICAL FIELD

The present invention relates to a casing for various types of communication equipment typified by a mobile device for communication, such as, e.g., a mobile phone and a personal digital assistant (PDA) and a protective case used for the communication equipment by being attached thereto. Further, the present invention relates to an outer shell member including a casing for various communication equipment and a protective case for various communication equipment, and also relates to a metallic tone print sheet for these outer shell members.

BACKGROUND OF THE INVENTION

Various proposals have been made for decorating an outer shell member for communication equipment. For example, Patent Document 1 proposes a decorative means by metal plating of a plastic component for communication equipment. Patent Document 1 discloses a multi-color resin molded article for communication equipment, which is formed by integrally molding a key-top of a push-button switch and a different type of a resin material of a decorative component. In this multi-color resin molded article, a plating film of the same metal or different metals is affixed to a plurality of regions separated from each other on the surface of the article.

Patent Document 2 proposes a method of producing a corrosion-protected, in particular very glossy, metallic or non-metallic support, and a method of using the support. In designs for cell phones and smartphones, metallic luster designs are popular and there is a strong demand to make the housing and/or the keypad metallic luster. Patent Document 3 proposes a key-sheet including a decorative layer formed using bright ink containing metal components to further enhance the metal tone and the metallic luster. Patent Document 4 proposes a laminate film for a keypad member with metallic luster which is excellent in radio wave permeability.

Further, the invention according to Patent Document 5 was made to solve the following problems. That is, when a plating-like cover component is selected as a case of a portable communication terminal, it is charged by receiving high-voltage static electricity. Therefore, the static electricity is discharged to the internal circuits of the portable communication terminal, which may cause operation failure or damage. Further, in the case of a plated cover component, the metal-plated layer shields radio waves. Therefore, in a case where an inner antenna is provided therein, the metal-plated layer reduces the sensitivity of the inner antenna. This results in a mounting constraint such that it is difficult to provide an inner antenna inside. Further, even in the case of an in-mold cover component or in the case of a vapor deposition type cover component, the metal deposition layer shields radio waves. Therefore, when an inner antenna is installed therein, the sensitivity of the inner antenna deteriorates. In order to solve this problem, Patent Document 5 proposes an electric appliance equipped with a covering component including a base portion made of a transparent material and a discontinuous metal film formed on the base portion, the metal film being formed in an island-like structure not continuously connected.

The problem related to shielding of radio waves may become more prominent in the fifth-generation (5G) mobile communication system. On the other hand, from the viewpoint of metallic luster design, in the proposals of Patent Documents 1 to 5, the metallic reflective layers, such as, e.g., a plated layer and a metal deposition layer, that cause metallic luster, are all formed in a flat shape, and there were limitations in exerting metallic luster. In particular, as disclosed in Patent Document 5, in a case where a discontinuous metal film in which a metal film is formed in an island-like structure to suppress the decrease in the sensitivity of the inner antenna is employed, the deterioration in the luxuriousness and the metallic luster design cannot be avoided as compared with a case in which a metal film is arranged on an entire surface. Further, the applicant of the present application has proposed inventions related to a molded product provided with a decorative resin sheet disclosed by Patent Documents 6 and 7 and a method of producing the same. In these inventions, a three-dimensional metallic reflective layer is formed. However, these inventions fail to show any knowledge regarding the shielding of radio waves and fail to disclose a structure with a minute region having a metallic portion smaller in plane area than a colored layer.

PRIOR ART DOCUMENT

Patent Document

Patent Document 1: Japanese Unexamined Patent Application Publication No. 2004-327306
Patent Document 2: Japanese Patent No. 6,409,153
Patent Document 3: Japanese Patent No. 5,260,486
Patent Document 4: Japanese Unexamined Patent Application Publication No. 2009-164029
Patent Document 5: Japanese Unexamined Patent Application Publication No. 2006-203520
Patent Document 6: WO 2019/044048
Patent Document 7: WO 2017/141556

SUMMARY OF THE INVENTION

Problems to be Solved by the Invention

The present invention aims to provide an outer shell member for communication equipment capable of improving metallic luster design while suppressing the occurrence of radio wave shielding on communication.

Means for Solving the Problem

The present invention relates to an improvement of an outer shell member for communication equipment, the outer shell member including a communication device having an antenna for radio communication and a protective case to be attached to the communication device. In the present invention, a metallic tone print sheet is arranged at least a part of the outer shell member. The metallic tone print sheet is provided with, when viewed from a front surface side, a metallic portion provided with a metallic reflective layer on a rear surface side of the base sheet and a transmission portion not provided with a metallic reflective layer.

The transmission portion has radio wave permeability that allows transmission of radio waves to the communication device.

The metallic portion is provided with, at least at a part of the metallic portion, a colored layer with light permeability and a thickened portion with light permeability, the colored layer and the thickened portion being arranged on a rear surface side of the base sheet. The metallic reflective layer is provided with a metallic concave reflective surface curved in accordance with a change in a thickness of the thickened portion in a cross-section in a thickness direction of the metallic tone print sheet by being arranged at least on a rear surface side of the thickened portion.

The metallic tone print sheet is provided with a minute region having the metallic portion smaller in a plane area than the colored layer at least in a partial region as viewed from the front surface side.

The minute region has, when viewed from the front surface side, a sea-island structure composed of a sea-like portion in which the transmission portions are continuously connected and an island-like portion in which the metallic portion is surrounded by the transmission portion.

Note that it should be understood that the sea-island structure according to the present invention includes a structure in which the island-like portions are in point contact with each other.

With such a sea-island structure, it is possible to give a fine and three-dimensional decoration effect to the metallic tone print sheet and enhance the radio wave transmittance as well.

According to a preferred embodiment of the present invention, the metallic tone print sheet can exhibit extremely excellent wave transparency in which an electric field shielding property is 1 (dB) or less in a band of 1 MHz to 1 GHz according to a KEC method.

According to an embodiment of the present invention, it may be configured such that in the minute region, there exist three or more dot-like or linear-like fine metallic portions per square centimeter and that the transmission portion is arranged between the metallic portions.

According to an embodiment of the present invention, the island-like portion may be formed in a dot-like or line-like shape having an average length of 20 mm or less.

According to the present invention, in the minute region, it may be configured such that a width of the sea-like portion between the island-like portions is a fine width of 10 mm or less.

According to an embodiment of the present invention, it may be configured such that the island-like portion is formed in a dot-like or line-like shape having an average length of 20 mm or less.

Further, it may be configured such that among of the island-like portions, an island-like portion having the longest length is 40 mm or less in length.

Further, according to an embodiment of the present invention, it may be configured such that a plurality of minute regions is provided and that the metallic portion having a length exceeding 40 mm is arranged between the plurality of minute regions.

According to the embodiment of the present invention, it may be configured such that the colored layer has light permeability and radio wave permeability and gives color to the metallic tone print sheet when viewed from the front surface side.

It may be configured such that the thickened portion has light permeability and radio wave permeability and gives a three-dimensional decorative effect to the metallic tone print sheet when viewed from the front surface side. With this, when the metallic tone print sheet is viewed from the front, the reflected light from the metallic curved reflective surface can be visually recognized, thereby exerting a three-dimensional effect.

It may be configured such that the metallic reflective layer is arranged on a rear surface side of the colored layer and the thickened portion.

It may be configured such that the thickened portion protrudes rearward in a cross-section in a thickness direction of the base sheet and that a periphery of the thickened portion forms a curved portion.

It may be configured such that the metallic concave reflective surface is configured by arranging the metallic reflective layer on a rear surface of the curved portion of at least a part of the thickened portion to enable visual recognition of reflected light from the metallic concave reflective surface when the metallic tone print sheet is viewed from a front surface side.

According to an embodiment of the present invention, the metallic reflective layer and the colored layer superposed on a front surface side of the metallic reflective layer in the minute region may be shifted from each other when viewed from the front surface side. When viewed from the front surface side, the metallic portion may be configured by an overlapped portion in which the colored layer, the thickened portion, and the metallic reflective layer are overlapped and a non-colored metallic reflective portion in which only the thickened portion and the metallic reflective layer exist and the colored layer does not exist.

When viewed from the front surface side, the transmission portion may be configured by a plane colored portion in which only the colored layer exists and the thickened portion and the metallic reflective layer exist and a non-colored non-reflective portion in which none of the colored layer, the thickened portion, and the metallic reflective layer exist.

Further, according to an embodiment of the present invention, a rear surface side colored layer formed by coloring ink may be provided at least at a portion between the minute regions on a rear surface side of the base sheet when viewed from the front surface side.

The present invention provides communication equipment equipped with a communication device having an antenna. In the communication equipment according to the present invention, as an outer shell member for communication equipment, the above-described outer shell member is used, and the metallic tone print sheet is arranged on the front surface side of the antenna.

The present invention provides a protective case to be mounted to communication equipment in which as the outer shell member to be arranged at least on the front surface of the protective case, the outer shell member for communication equipment as recited in any one of claims 1, 2, 3, 4, 5, 6, 7, and 11 is used, and the metallic tone print sheet is arranged at a position located on the front surface side of the antenna.

The present invention provides a metallic tone print sheet for use at least in a part of an outer shell member for communication equipment, the outer shell member including a casing of communication equipment equipped with a communication device having an antenna for radio communication and a protective case to be attached to the communication device. The metallic tone print sheet includes a base sheet on which metallic tone printing is applied. The metallic tone print sheet includes, when viewed from a front surface side, a metallic portion provided with a metallic reflective layer on a rear surface side of the base sheet and a transmission portion not provided with a metallic reflective layer. The transmission portion has radio wave permeability that allows transmission of radio waves to the communication device. The metallic portion includes a colored layer having light permeability and a thickened portion having light permeability at least at a part of the metallic portion, the colored layer and the thickened portion being arranged on a rear surface side of the base sheet. The metallic reflective layer is provided with a metallic concave reflective surface curved in accordance with a change in a thickness of the thickened portion in a cross-section in a thickness direction of the metallic tone print sheet by being arranged at least on a rear surface side of the thickened portion. The metallic tone print sheet is provided with a minute region having the metallic portion smaller in a plane area than the colored layer at least in a partial region as viewed from the front surface side. The minute region has, when viewed from the front surface side, a sea-island structure composed of a sea-like portion in which the transmission portions are continuously connected and an island-like portion in which the metallic portion is surrounded by the transmission portion.

Effects of the Invention

In the present invention, the metallic tone print sheet is provided with the metallic portion and the transmission portion. The transmission portion can improve radio wave permeability that allows transmission of radio waves to the antenna of the communication device. On the other hand, the metallic reflective layer is provided with the metallic concave reflective surface curved in the cross-section in the thickness direction of the metallic tone print sheet. Therefore, the metallic reflective layer not only two-dimensionally reflects the reflected light capable of providing metallic luster but also three-dimensionally reflects the reflected light. In other words, when viewed from the front, changing in the position of the viewer's eyes from the front causes the change in the reflected position and angle with respect to the metallic concave reflective surface, thereby enhancing the three-dimensional decorative effect.

With this, the present invention can provide an outer shell member for communication equipment capable of enhancing the metallic luster design while improving the radio wave permeability that has a significant impact on communication.

Further, the present invention can provide communication equipment capable of enhancing the metallic luster design while improving the radio wave permeability that has a significant impact on communication.

Further, the present invention can provide a protective case for communication equipment capable of enhancing the metallic luster design while improving the radio wave permeability that has a significant impact on communication.

Furthermore, the present invention can provide a metallic tone print sheet capable of suitably being used in an outer shell member for communication equipment and its protective case.

EMBODIMENTS FOR CARRYING OUT THE INVENTION

Hereinafter, with reference to the attached drawings, some embodiments of the present invention will be described.

Figure 3:
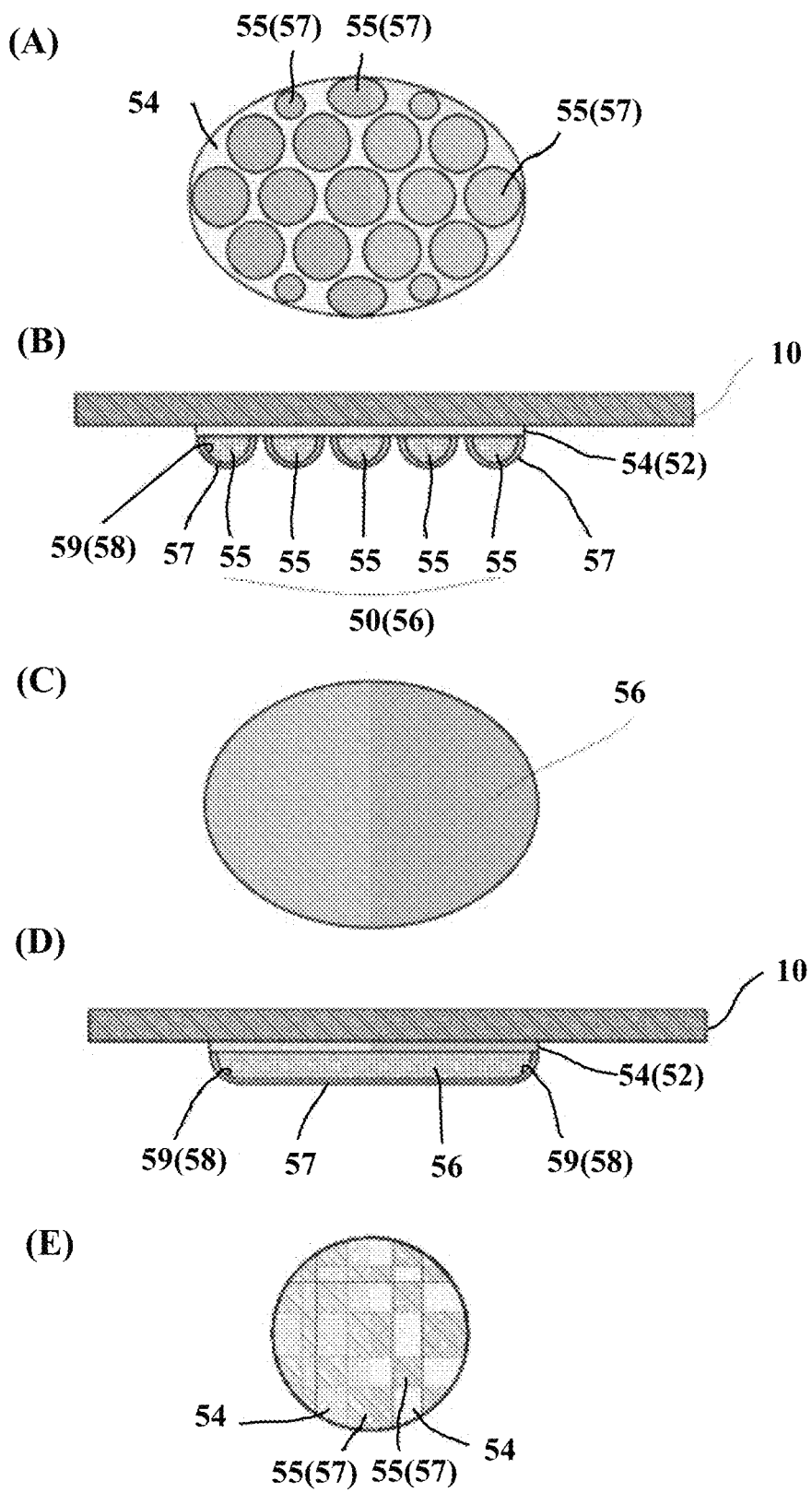
FIG. 3(A) is an enlarged plan view of a main part of a metallic tone print sheet according to one embodiment of the present invention.
FIG. 3(B) is a central cross-sectional view of the metallic tone print sheet of FIG. 3(A).
FIG. 3(C) is an enlarged plan view of a main part showing another embodiment of the metallic tone print sheet.
FIG. 3(D) is a central cross-sectional view of the metallic tone print sheet of FIG. 3(C).

Note that each figure, such as, e.g., FIG. 3, is not intended to accurately show the dimension, such as, e.g., the thickness of each layer, because it is a diagram for explanation.

In the following description, a side closer to the user's eyes will be referred to as a front side, and a side farther to the user's eyes will be referred to as a rear side. The expression "on the rear surface side" is used to mean that "rearward than". For example, the expression "arranging the member Y on the rear surface side of the member X" means that the member Y may be directly arranged on the rear surface (farther from the user's eyes) of the member X, and a third member Z may be interposed between the rear surface of the member X and the front surface of the member Y. The expression "front surface side" is similarly used to mean "forward than" (a side closer to the user's eyes). Note that in this embodiment, the front-rear direction is used to mean the same meaning as the thickness direction of the metallic tone print sheet 51. In each cross-sectional view of the metallic tone print sheet 51 in FIG. 3 and FIG. 4, it is drawn by arranging the front surface side upward and the rear surface side downward.

Outer Shell Member 71

The present invention relates to an outer shell member for communication equipment, the outer shell member including a communication device equipped with a communication device having an antenna for radio communication and a protective case to be attached to the communication equipment. The communication equipment means various devices equipped with a communication device by radio waves. The communication devices include mobile communication equipment including a mobile terminal, such as, e.g., a smartphone and a tablet, as well as various devices including a communication device having an antenna for radio communication regardless of its name or main application. The protective case includes a case to be used to protect communication equipment, such as, e.g., a smartphone and a tablet, by being attached thereto, and various protective cases to be used by being attached to the communication equipment. The outer shell member denotes a member to be arranged on the entire or at least the front surface side of the communication equipment or the protective case. The outer shell member includes a casing and a switch of various communication equipment, such as, e.g., a smartphone and a tablet, and a component that appears on various surfaces or a case body of the protective case. The present invention can be applied to the above-described various members.

Figure 1:
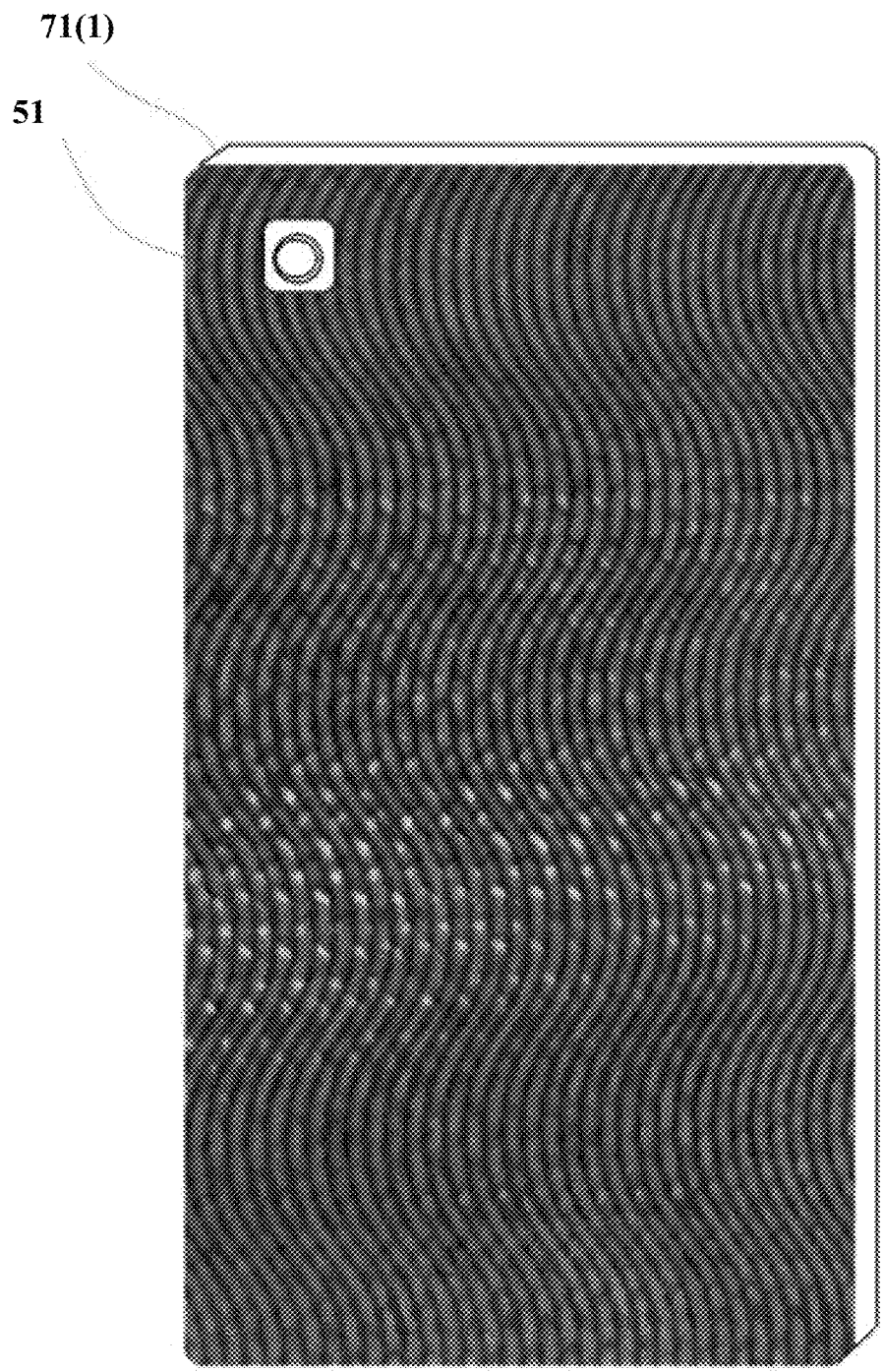
FIG. 1 is a perspective view of communication equipment (smartphone) according to one embodiment of the present invention.

FIG. 1 is a perspective view of a smartphone 1 as viewed from its rear surface side (a side opposite to the front surface side provided with a display). A metallic tone print sheet 51 is arranged on the surface of the casing of the smartphone 1 as an outer shell member 71.

Figure 2:
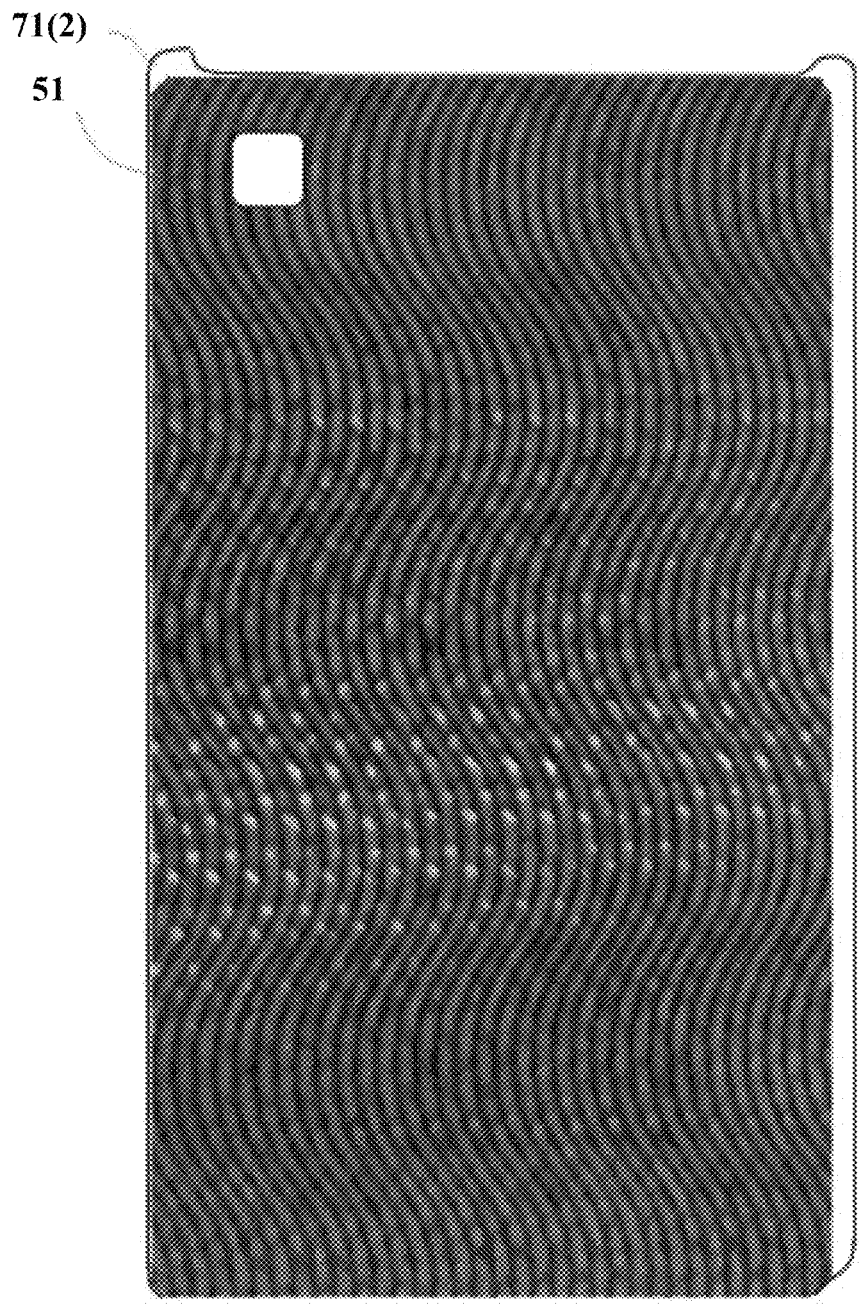
FIG. 2 is a perspective view of a protective case of communication equipment (smartphone) according to another embodiment of the present invention.

FIG. 2 is a perspective view of a protective case 2 for a smartphone as viewed from its rear surface side. A metallic tone print sheet 51 is arranged on the surface of the protective case 2 as an outer shell member 71.

The metallic tone print sheet 51 may be fixedly arranged on the surface of the main body of the outer shell member 71 by bonding or the like, or may be integrally molded by injection molding or the like. In a case where the body of the outer shell member 71 is a transparent member, the metallic tone print sheet 51 may be arranged on the inner surface of the body. In other words, the metallic tone print sheet 51 is to be arranged at a position visible from the outside of the body of the outer shell member 71.

Metallic Tone Print Sheet

Referring to FIG. 3, a metallic tone print sheet according to one embodiment of the present invention will be described.

The metallic tone print sheet shown in FIG. 3 is provided with a base sheet 10 having light permeability and radio wave permeability, a colored layer 52 formed of coloring ink having light permeability arranged on the rear surface side of the base sheet 10, a thickened portion 56, and a metallic reflective layer 57. Note that, in the present invention, the expression "having light permeability" means having a property of transmitting light, and a transparent or translucent material can be used. Further, the terminology "radio wave transparency" means having a property of transmitting radio waves, and in particular, it is preferable that high-frequency radio waves be satisfactorily transmitted. Note that in the following embodiments, each of the members and layers other than the metallic reflective layer 57 is implemented as having light permeability and radio wave permeability unless otherwise specified.

In this example, as shown in FIG. 3(A), a sea-island structure is provided. Specifically, the transmission portion (in the example in FIG. 3(A), the portion including only the second colored region 54) having radio wave permeability configures a continuous sea-like portion. The island-like portion has a configuration in which the metallic portion including the metallic reflective layer 57 is surrounded by the sea-like portion. Here, as shown in FIG. 3(A), the island-like portion may be an island-like portion in which the metallic reflective layers 57 are not in contact with each other. Further, as shown in FIG. 3(E), the metallic reflective layers 57 may be in point contact with each other. In FIG. 3(E), a metallic portion including a checker flag-shaped rectangular metallic reflective layer 57 is shown. However, metallic portions including a circular metallic reflective layer 57 as shown in FIG. 3(A) may be in point contact with each other.

Base Sheet 10

The base sheet 10 having radio wave permeability may be a film or a sheet made of synthetic resin, such as, e.g., cellulose acetobutyrate (CAB) resin, polyethylene terephthalate resin, polycarbonate resin, acrylic resin, olefin resin, ABS resin, or may be a glass plate or the like. The base sheet 10 may be a single layer or a laminate of two or more layers. The thickness of the base sheet 10 is not particularly limited, but is generally about 50 μm to about 500 μm, preferably about 100 μm to about 200 μm.

The base sheet 10 has light permeability. As will be described later, the base sheet 10 is not limited in material and thickness as long as the colored layer 52, the thickened portion 56, and the metallic reflective layer 57 can be formed by a method using, e.g., printing or a transfer foil. The base sheet 10 has preferably appropriate strength, durability, print characteristics, and the like, as a base material. The base sheet 10 may be an optimal sheet selected considering the physical properties and the processing method of the metallic tone print sheet 51 and the outer shell member.

Colored Layer 52

The colored layer 52 formed of coloring ink having radio wave permeability and light permeability is arranged on the rear surface side of the base sheet 10. The colored layer 52 is arranged in a planar shape along the planar base sheet 10. The coloring ink having light permeability may be printing ink having color and light permeability and may include colorless transparent ink. The thickness of the colored layer 52 is preferably within the range of about 1 μm to about 20 μm but may be appropriately changed. The colored layer 52 gives one or more colors on the front surface side of the metallic tone print sheet 51 and makes a visual representation of characters, graphics, patterns, and the like by making them multi-colored. One or a plurality of printings is made in accordance with a conventional printing technique to form the colored layer 52 of a monochrome or multicolor printed layer.

The colored layer 52 may include a first colored region 53 (see FIG. 4(A) and FIG. 4(B)) in which a thickened portion 56, which will be described later, is not arranged on the rear surface side and a second colored region 54 in which a thickened portion 56 is arranged on the rear surface side. The first colored region 53 and the second colored region 54 may be colored so as to be different at least in one of hue, lightness, and saturation. The colored layer 52 in the first colored region 53 and the second colored region 54 is not limited to one color and may be a plurality of colors.

The colored layer 52 is configured to cause the light inputted to and outputted from the metallic reflective layer 57 (to be described later) to reach the viewer in front using coloring ink having light permeability. The colored layer 52 can be formed by partially using ink having no light permeability. For example, in a case of mixing a portion having metallic luster and a portion having no metallic luster from the viewpoint of enhancing the decorative effect, or in the case of concealing a device or the like which is not desired to be visually recognized by a user, ink having no light permeability can be used in a part of the colored layer 52.

Thickened Portion 56

The thickened portion 56 having radio wave permeability and light permeability is arranged at a position including at least a part of the rear surface of the colored layer 52 and projects rearward from the rear surface side of the colored layer 52. The thickened portion 56 having light permeability is formed of, for example, thick coating ink made of synthetic resin, such as, e.g., epoxy-based resin, acryl-based resin, urethane-based resin, or a mixture or a compound thereof. The thickened portion 56 may be transparent as long as it has light permeability and may be transparent and colored with a pigment or the like as in the case of the coloring ink.

In the thickened portion 56, the thickness and the width thereof are major factors influencing the decorative effects of the metallic tone print sheet 51. Therefore, the thickness of the thickened portion 56 is preferably 75 µm or more, more preferably 80 µm or more. This thickness can enhance the three-dimensional decorative effect as it increases, but increasing the thickness makes it difficult to maintain the accuracy and perform the mass production thereof and/or causes a limitation on the usable material. Therefore, it is appropriate that the thickness of the thickened portion 56 is 150 µm or less, and when it is 100 µm or less, it becomes more stable. However, it is not prevented from forming the thickened portion having a thickness exceeding 150 µm. The width of the thickened portion 56 is suitably between 0.3 mm and 3 mm to enhance sharp decorative effects. However, the width is determined by a figure or a character to be expressed, and therefore in the case of obtaining metallic reflection and/or three-dimensional decorative effect in a large area, the width of the thickened portion 56 is not limited to the above. Note that the width of the thickened portion 56 denotes the base end width of the thickened portion 56 in contact with the base sheet 10.

Arranging only the colored layer 52 and the metallic reflective layer 57 merely exerts a planner decorative effect, but arranging the thickened portion 56 in addition to the colored layer and the metallic reflective layer can exert a three-dimensional decorative effect.

Metallic Reflective Layer 57

The metallic reflective layer 57 may include a reflective foil, such as, e.g., a metal foil and a hologram foil, or metallic colored ink. The metallic reflective layer 57 is arranged on a rear surface of at least a part of the thickened portion 56. The metallic reflective layer 57 causes mirror-surface reflection and metallic luster.

When viewed from the front side, the metallic tone print sheet 51 is divided into a metallic portion 3 provided with the metallic reflective layer 57 and a transmission portion 4 not provided with the metallic reflective layer 57. Each layer located at the transmission portion 4 has radio wave permeability and transmits radio waves required for communication well. On the other hand, the metallic portion 3 provided with the metallic reflective layer 57 does not transmit radio waves required for communication or attenuates the radio waves. The metallic tone print sheet 51 includes the metallic portion 3 and the transmission portion 4. Therefore, the metallic tone print sheet 51 can transmit radio waves required for communication as a whole and impart a metallic-like decoration having high-grade feeling to the outer shell member of the smartphone 1, the protective case 2, or the like.

The metallic reflective layer 57 is preferably formed by transferring a reflective foil containing metal, such as, e.g., a metal foil and a holographic foil, by a transfer foil method. The metallic reflective layer 57 may be formed by silk printing (using silver paste ink or mirror ink), hot stamping, vapor deposition, or sputtering but is preferably formed using a transfer foil in that a higher metallic reflection effect can be obtained. More specifically, it is advantageous to use a transfer foil in that the transfer foil has a higher specular property than silk printing (using silver paste ink or mirror ink) and in that a hologram foil which cannot be produced by silk printing can also be used. When forming the metallic reflective layer 57 by using a transfer foil method, a transfer binder layer (not shown) may be formed. The binder layer may be any layer capable of fixing the reflective foil and may be formed of, for example, transparent silk ink. In particular, it is suitable to use ink that does not cause breakage or cracking of the binder layer over time. The thickness of the metallic reflective layer 57 may be appropriately changed and is preferably within the range from about 0.03 µm to about 0.05 µm.

Metallic Concave Reflective Surface 59

As described above, the thickened portion 56 is arranged at a position including at least a part of the rear surface of the colored layer 52 and protrudes rearward from the rear surface side of the colored layer 52. Further, at least the peripheral edge of the thickened portion 56 protruding rearward from the rear surface side of the colored layer 52 is provided with a concave curved portion 58 curved rearward by the surface tension in the cross-section in the thickness direction of the base sheet 10. The metallic reflective layer 57 is arranged at least on a part of the rear surface of the concave curved portion 58. The metallic reflective layer 57 constitutes a metallic concave reflective surface 59. Therefore, the metallic concave reflective surface 59 is a surface curved rearward in the cross-section in the thickness direction of the base sheet 10.

The metallic reflective layer 57 may be arranged at least on a part of the rear surface of the concave curved portion 58, as described above. The metallic reflective layer 57 may be arranged at the portion that completely coincides with the rear face of the thickened portion 56. Further, the metallic reflective layer 57 may be arranged at least on a part of the rear surface of the concave curved portion 58 and at least on a part of the rear surface of the colored layer 52 adjacent to the thickened portion 56.

The reflected light from the metallic concave reflective surface 59 is visually recognized when the metallic tone print sheet 51 is viewed from the front side. Since the metallic reflective layer 57 is arranged at least on a part of the rear surface of the thickened portion 56 protruding rearward from the rear surface of the colored layer 52, the reflected light from the metallic concave reflective surface 59 can be visually recognized with a sense of depth.

Further, the metallic reflective layer 57 is arranged at least on a part of the rear surface of the concave curved portion 58, and therefore a concave mirror-shaped reflecting surface is formed. When the metallic tone print sheet 51 is viewed from the front side, as the position on the plane of the metallic concave reflective surface 59 changes, the depth to the metallic concave reflective surface 59 changes. Therefore, light reflected from the metallic concave reflective surface 59 in various directions is visually recognized according to this change, which changes the portion where reflected light is visible due to the changes in the position of the viewer's eyes.

Furthermore, it is possible to differentiate the metallic reflection to give a difference in the decorative impression between the region having a metallic reflection effect colored with the metallic tone print sheet 51 in which the thickened portion 56 and the metallic reflective layer 57 are arranged on the rear surface side and the planar region not having a metallic reflection effect with the metallic tone print sheet 51 in which the thickened portion 56 and the metallic reflective layer 57 are not arranged on the rear surface side.

In addition, when the region where the thickened portion 56 is not arranged on the rear surface side and the region where the thickened portion 56 is arranged on the rear surface side are colored so as to be different at least in one of hue, lightness, and saturation, the difference in decorative expression is further emphasized, which in turn can further enhance the three-dimensional decorative effects.

From the above, configuring the thickened portion 56 and the metallic reflective layer 57 as described above enables to exert a new decorative effect on the metallic tone print sheet 51.

The second colored region 54, the thickened portion 56, and the metallic reflective layer 57 are not required such that the outer edges (the outer peripheral lines in plan view) thereof do not substantially coincide to each other and may be shifted in plan view when viewed the metallic tone print sheet 51 from the front side as long as the thickened portion 56 is arranged on the rear surface side of the second colored region 54 and that the metallic reflective layer 57 is arranged at least on a part of the rear surface of the concave curved portion 58. The examples in which the outer edges of these three members are shifted in plan view include a case in which the metallic reflective layer 57 is arranged on a part of the rear surface of the concave curved portion 58 and a case in which the second colored region 54 is formed to exceed the width of the base end of the thickened portion 56. However, there are various ways of shifting the outer edges.

When the metallic tone print sheet 51 is viewed from the front side, it is desirable that the outer edges of the three of them substantially coincide with each other, and it is most desirable that the outer edges of the three of them completely coincide with each other. However, when it is recognized that only the second colored region 54 emits light caused by metallic reflection when the metallic tone print sheet 51 is viewed from the front side even if the outer edges of the three of them do not coincide perfectly, it can be said that they substantially coincide with each other, and therefore, they need not coincide perfectly.

In this case, more specifically, the shifting of the three outer edges (peripheral lines) in plan view is preferably within 3 mm, more preferably within 1 mm. In a case where the outer edges of the three of them substantially coincide with each other when the metallic tone print sheet 51 is viewed from the front side, the second colored region 54, the thickened portion 56, and the metallic reflective layer 57 as a whole can exert metallic reflective effects.

The colored layer 52, the thickened portion 56, and the metallic reflective layer 57 are preferably arranged on the rear surface side of the base sheet 10. In a case where the metallic tone print sheet 51 is composed of a multi-layer laminate, the colored layer 52, the thickened portion 56, and the metallic reflective layer 57 may be arranged between the layers. The colored layer 52, the thickened portion 56, and the metallic reflective layer 57 can display various pictorial patterns and characters, such as, e.g., illustrations and photographs, on the front surface of the metallic tone print sheet 51.

Adjustment Layer

Although not shown, an adjustment layer (not shown) may be arranged on a rearmost surface of the metallic tone print sheet 51. The adjustment layer may be of any color. The adjustment layer may be transparent and may be colored with a pigment or the like as in coloring ink. The adjustment layer is composed of a layer of a pressure-sensitive adhesive or an adhesive and a resin film, such as, e.g., a polyethylene terephthalate resin film or a polycarbonate resin film arranged on a rear surface of the adhesive or resin layer. When forming an outer shell member provided with the metallic tone print sheet 51, it is desirable to arrange an adjustment layer on the rearmost surface of the metallic tone print sheet 51. By arranging the adjustment layer on the rearmost surface of the metallic tone print sheet 51, it is possible to suppress the color flow of the rear member. The formation of the adjustment layer may be performed by application with a coater, offset printing, or silk printing.

The adjustment layer, the pressure-sensitive adhesive, or the adhesive can also alleviate the unevenness of the rear surface of the metallic tone print sheet 51 (unevenness due to the presence or absence of the thickened portion 56 of the metallic tone print sheet 51). The adjustment layer, the pressure-sensitive adhesive, or the adhesive can reduce the difference in the height of the unevenness on the rear surface of the metallic tone print sheet 51, the pressure-sensitive adhesive, or the adhesive than the difference in the unevenness due to the thickened portion. It is possible to use the adjustment layer and the pressure-sensitive adhesive or the adhesive in combination.

Surface Smoothness

In this embodiment, the front surface of the metallic tone print sheet 51 is smooth, and therefore it is not necessary to arrange a separate smooth sheet (not illustrated) having a surface. Further, in a case where an outer shell member is formed by attaching the metallic tone print sheet 51 to a rear member, it is conceivable that the unevenness of the rear surface affects the smoothness of the front surface side due to the change with time. However, by relieving the unevenness of the rear surface of the metallic tone print sheet 51 as described above, it is possible to suppress the occurrence of impact against the smoothness.

The metallic tone print sheet 51 according to this embodiment has a high degree of flexibility in selecting a material such as a material having heat resistance capable of withstanding a high temperature of 135° C.

At least a portion of the thickened portion 56 may include a minute thickened portion 50.

As shown in FIG. 3(A) and FIG. 3(B), the minute thickened portion 50 is a portion in which a plurality of fine thickened portions 55 smaller than a single second colored region 54 on the front surface side thereof is gathered. The shape of the fine thickened portion 55 is not particularly limited, but it is appropriate that the shape is fine in a dot shape or in a line shape.

On the rear surface of all or at least a plurality of fine thickened portions 55, the metallic reflective layer 57 described above is provided. Thereby, at least the peripheral edge of each fine thickened portion 55 is provided with a concave curved portion 58 curved rearward in the cross-section in the thickness direction of the base sheet 10. A metallic reflective layer 57 is arranged at least on a part of the rear surface of the concave curved portion 58. This metallic reflective layer 57 constitutes the metallic concave reflective surface 59.

With this, a plurality of metallic concave reflective surfaces 59 configured by the plurality of fine thickened portions 55 can be arranged within a single second colored region 54. As a result, a plurality of metallic concave reflective surfaces 59 is arranged by the plurality of fine thickened portions 55 even if the figure is a single figure with no change in the second colored region 54. Therefore, a complicated three-dimensional effect or shine can be given to the surface of the metallic tone print sheet 51.

Further, the metallic portion 3 provided with the metallic reflective layer 57 and the transmission portion 4 not provided with the metallic reflective layer 57 exist in a finely mixed manner. Therefore, even in a case where the metallic tone print sheet 51 is arranged on substantially the entire surface of a casing or a protective case 2 of a smartphone 1, regardless of the position of an antenna of a communication device provided therein, it is possible to suppress the hindrance to the transmission/reception state of the antenna.

Of course, as shown in FIG. 3(C) and FIG. 3(D), the metallic tone print sheet 51 can be implemented as a sheet not having a minute thickened portion 50 provided with a plurality of fine thickened portions 55. The sheet shown in FIG. 3(C) and FIG. 3(D) is simpler than that shown in FIG. 3(A) and FIG. 3(B), and the area constituted only by the metallic portion 3 provided with the metallic reflective layer 57 is wider. However, by affixing the metallic portion 3 so as to avoid the antenna, it is possible to avoid radio wave disturbance to the antenna. Therefore, in implementing the present invention, in addition to that shown in FIG. 3(A) and FIG. 3(B), that shown in FIG. 3(C) and FIG. 3(D) can also be used in combination. Further note that it can be carried out with only that shown in FIG. 3(C) and FIG. 3(D) by providing it so as to avoid the position of the antenna.

The above-described minute thickened portion 50 is preferably provided with three or more metallic portions 3 (fine thickened portions 55 provided with the metallic tone reflective layer 57) per square centimeter.

In a case where the metallic portion 3 (the fine thickened portion 55 provided with the metallic reflective layer 57) is linear, it is preferable that its length be 30 mm or less, more preferably 20 mm or less, from the viewpoint of radio wave permeability. In a case where the metallic portions 3 are irregular in length, their average length is suitably 20 mm or less, and the average length of the island-like portion is preferably 10 mm or less, more preferably 20 mm or less. However, the metallic portion 3 may include an island-like portion having an average length exceeding 30 mm. The width of the metallic portion 3 is preferably 10 mm or less, more preferably 5 mm or less, from the viewpoint of radio wave permeability. In a case where their widths are uneven, their average width is suitably 20 mm or less, preferably 40 mm or less in maximum. However, the metallic portion 3 may include an island-like portion having a width exceeding the above-described width.

In order to enhance the radio wave permeability, it is appropriate that the width of the transmission portion 4 (in other words, the distance between the metallic portion 3 and the metallic portion 3 arranged adjacently in the vertical and horizontal directions) not provided with the metallic reflective layer 57 be 0.3 mm or more, preferably 0.4 mm, more preferably 0.6 mm or more. However, in order to enhance the fine decorative feeling, the width is suitably 10 mm or less, preferably 5 mm or less, and more preferably 1 mm or less.

In a case where the metallic portion 3 (the fine thickened portion 55 provided with the metallic reflective layer 57) is punctate, it is more preferred that there exist nine or more metallic portions 3 per square centimeter. The largest diameter of one point is preferably 10 mm or less, more preferably 3 mm or less, from the viewpoint of enhancing the fine decorative feeling and enhancing the radio wave permeability. In order to enhance the radio wave permeability, it is appropriate that the width of the transmission portion 4 not provided with the metallic reflective layer 57 (in other words, the distance between the metallic portion 3 and the metallic portion 3 arranged adjacently in the vertical and horizontal directions) is 0.3 mm or more, preferably 0.4 mm or more, more preferably 0.6 mm or more. However, in order to enhance the fine decorative feeling, it is appropriate that the width is 10 mm or less, preferably 5 mm or less, and more preferably 1 mm or less.

Figure 5:
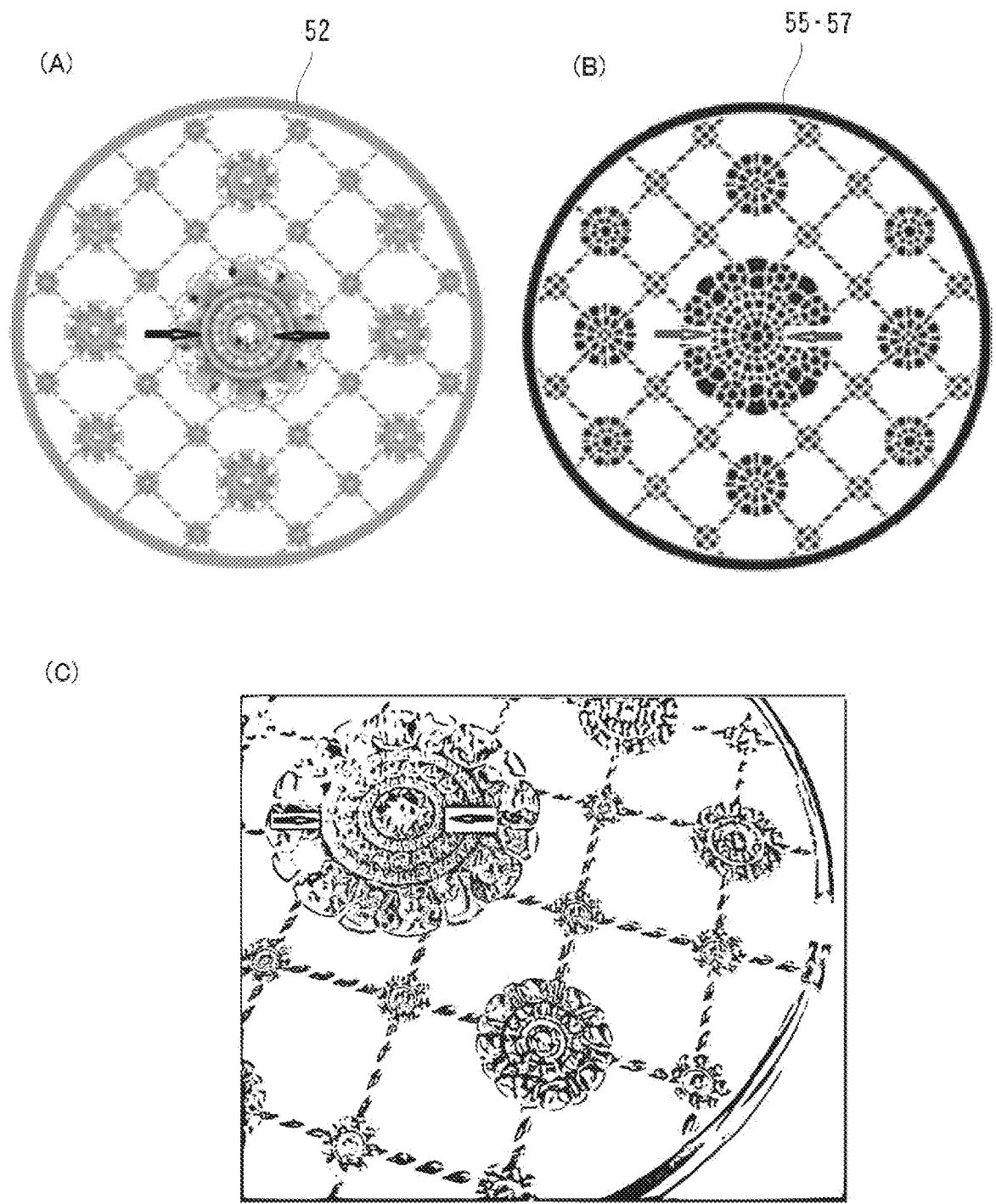
FIG. 5(A) is a plan view showing an example of a colored layer that can be applied to an embodiment of the present invention.
FIG. 5(B) is a plan view showing an example of a thickened portion and a metallic reflective layer that can be applied to an embodiment.
FIG. 5(C) is an enlarged plan view of a main part showing an example of a metallic tone print sheet according to an embodiment.

For example, as shown in FIG. 5, a variety of three-dimensional effects can be provided in a minute figure.

Specifically, the colored layer 52 of the double circle indicated by the arrow in FIG. 5(A) merely shows a double circle figure shown in one color. However, the minute thickened portion 50 of the double circle indicated by the arrow in FIG. 5(B) is configured by a set of fine thickened portions 55. As a result, the double circle indicated by the arrow in FIG. 5(C) represents a detailed figure with a deep three-dimensional feeling as if it were composed of many treasure balls.

As shown in FIG. 3, the shapes and sizes of the fine thickened portions 55 need not be uniform, and various shapes can be used as shown in FIG. 5(B) depending on the figure to be represented.

Figure 4:
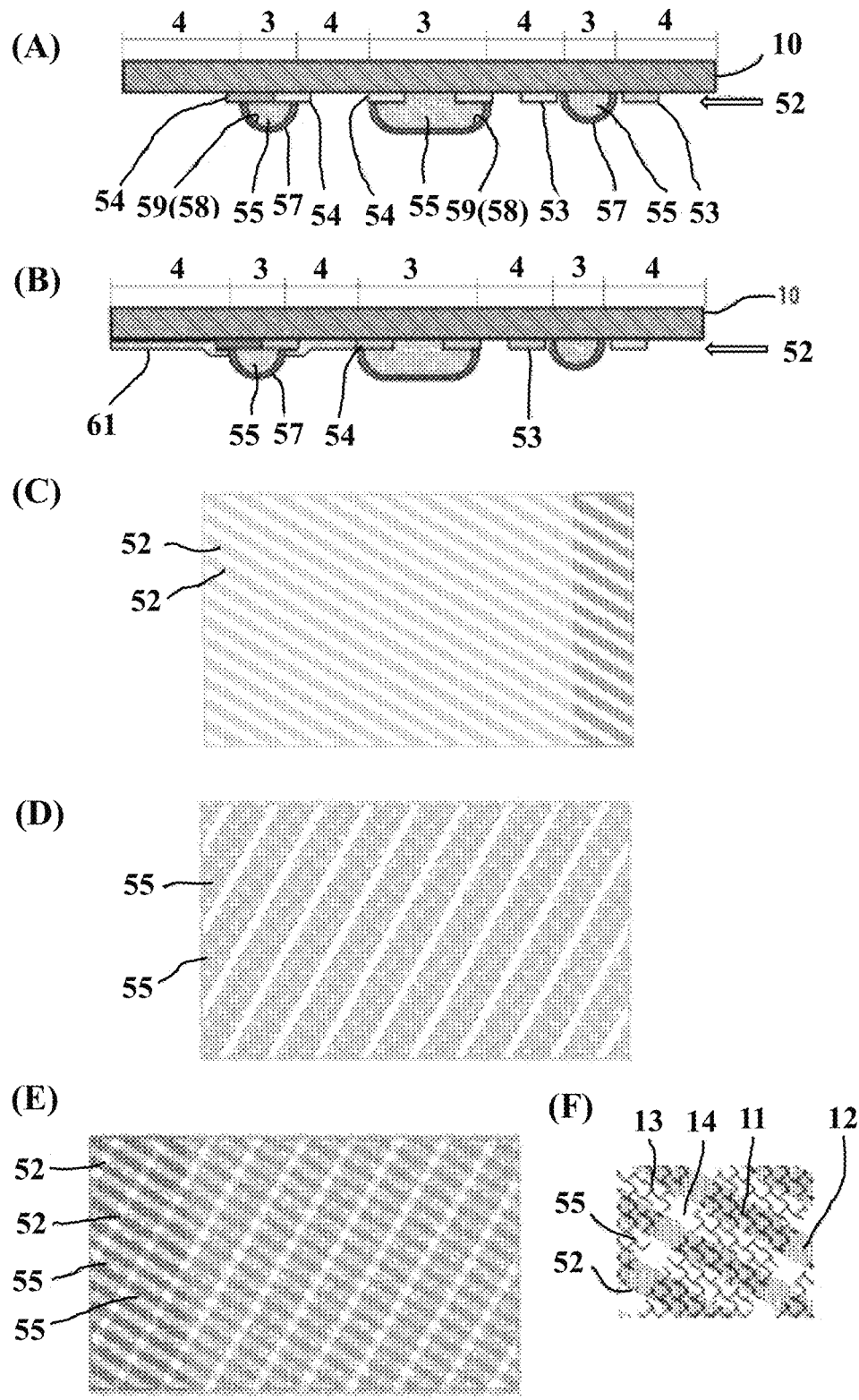
FIG. 4(A) is an enlarged cross-sectional view of a main part of a metallic tone print sheet according to another embodiment of the present invention.
FIG. 4(B) is an enlarged cross-sectional view of a main part of a metallic tone print sheet according to still another embodiment of the present invention.
FIG. 4(C) is a plan view of a colored layer applicable to these embodiments.
FIG. 4(D) is a plan view of a thickened portion and a metallic reflective layer applicable to these embodiments.
FIG. 4(E) is a plan view showing a state in which a colored layer, a thickened portion, and a metallic reflective layer, which can be applied to these embodiments, are combined.
FIG. 4(F) is an enlarged view of a main part of FIG. 4(E).

FIG. 4 shows another embodiment. In this embodiment, the fine thickened portion 55 and the second colored region 54 superposed on the front face of the fine thickened portion 55 are displaced in plan view.

As a result, as shown in FIG. 4(E) and FIG. 4(F), the following four portions are provided in the plane.

1) Overlapped portion 11: a portion where the colored layer, the thickened portion, and the metallic reflective layer are overlapped with each other 2) Plane colored portion 12: a portion in which only the colored layer exists and the thickened portion and the metallic reflective layer do not exist 3) Non-colored metallic reflective portion 13: a portion in which only the thickened portion and the metallic reflective layer exist but no colored layer exist 4) Non-colored non-reflective portion 14: a portion in which none of the colored layer, the thickened portion, and the metallic reflective layer exist As a result, it is possible to express a variety of expressions more than before. In particular, by deliberately providing the non-colored non-reflective portion 14, the contrast between the overlapped portion 11, the plane colored portion 12, and the non-colored metallic reflective portion 13 is further emphasized.

In the embodiment of FIG. 4, the minute thickened portion 50 is a set of a plurality of linear fine thickened portions 55. The colored layer 52 superimposed on the front surface side of the fine thickened portion 55 is also a set of a plurality of line segments. In this embodiment, the fine thickened portion 55 is thicker than the colored layer 52. However, to the contrary, the colored layer 52 may be thicker than the fine thickened portion 55 or may have the same thickness as the fine thickened portion 55.

The colored layer 52 and the fine thickened portion 55 are shifted in plan view, thereby forming the above-described four portions.

As shown in FIG. 4(B), it is also possible to provide 62 formed of coloring ink between the fine thickened portions 55 in plan view.

Figure 6:
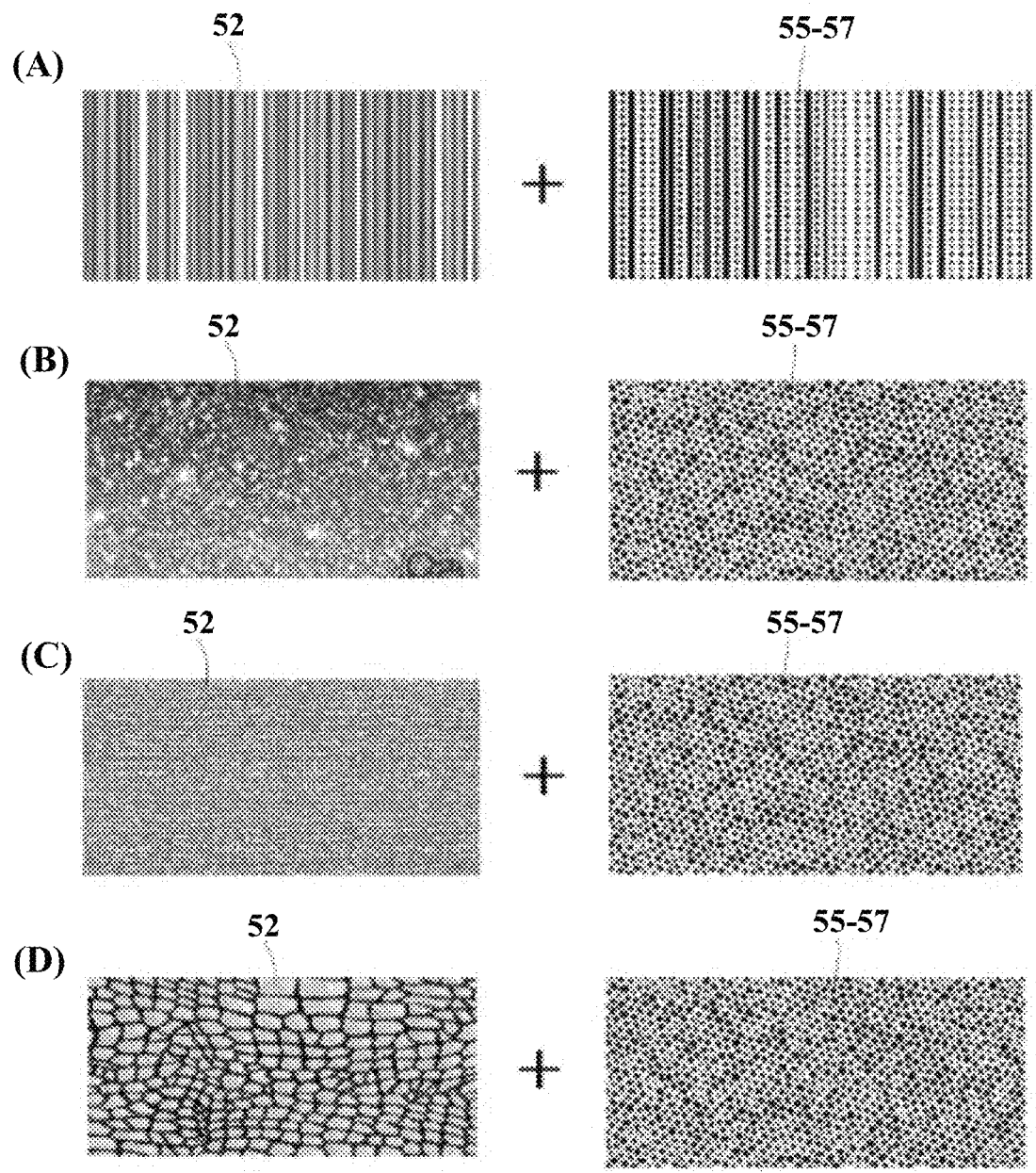
FIG. 6(A) to FIG. 6(D) are plan views of concrete examples of a combination of a colored layer, a thickened portion, and a metallic reflective layer that can be applied to an embodiment of the present invention.

As shown in FIG. 6(A), the colored layer 52 may be composed of line segments, and the fine thickened portion 55 may be composed of a combination of line segments and points.

Further, as shown in FIG. 6(B), FIG. 6(C), and FIG. 6(D), the fine thickened portion 55 may be composed of an aggregation of irregular dots.

Figure 7:
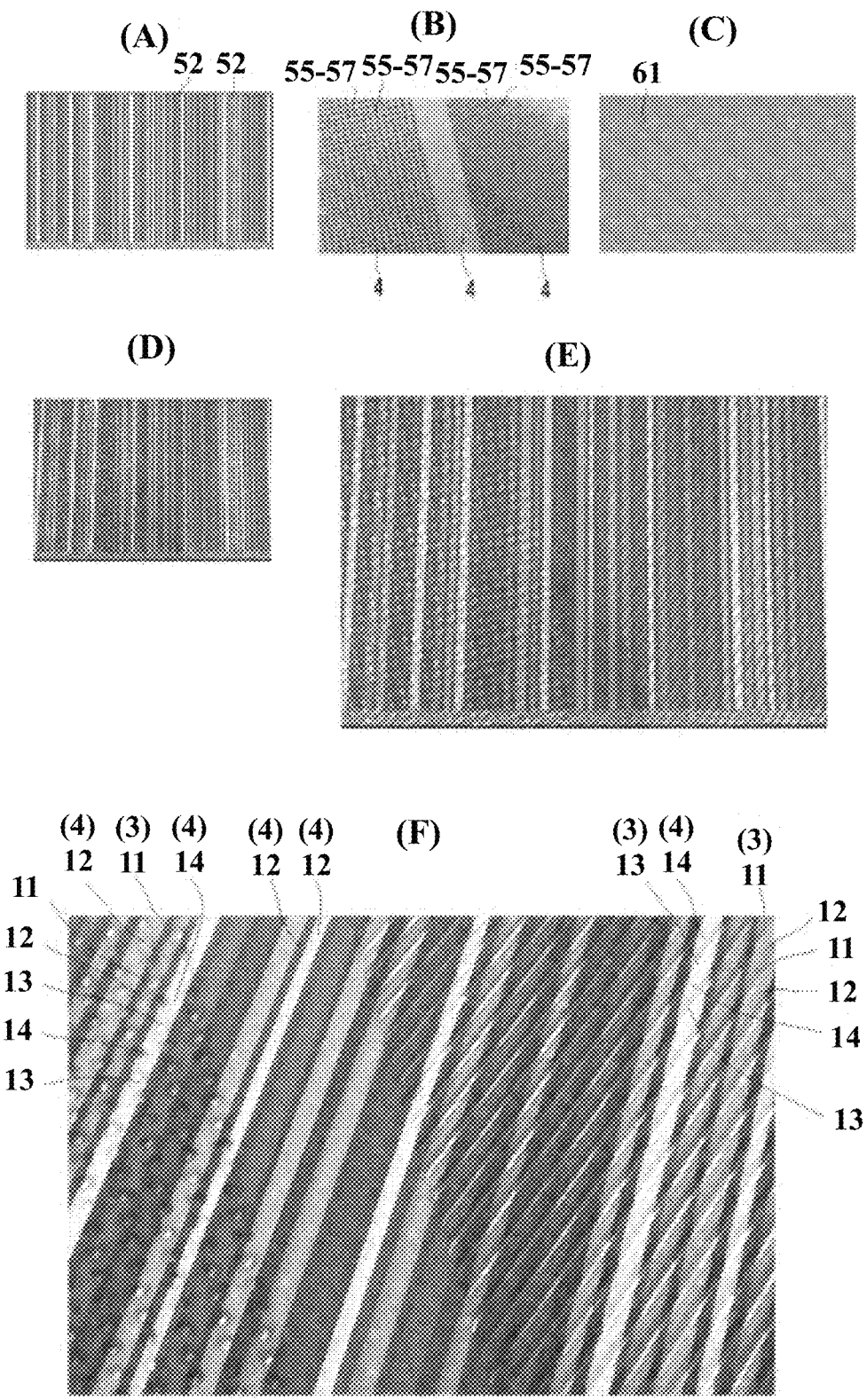
FIG. 7(A) is a plan view showing an example of a colored layer in a metallic tone print sheet that can be applied to an embodiment of the present invention.
FIG. 7(B) is a plan view showing an example of a thickened portion and a metallic reflective layer that can be applied to an embodiment.
FIG. 7(C) is a plan view showing an example of a rear surface side colored layer that can be applied to an embodiment.
FIG. 7(D) is a plan view showing an example of a metallic tone print sheet according to an embodiment.
FIG. 7(E) is an enlarged plan view showing an example of a metallic tone print sheet according to the embodiment.
FIG. 7(F) is a plan view showing a metallic tone print sheet according to an embodiment in a further enlarged scale.

FIG. 7 shows an example in which the colored layer 52 is composed of line segments, and the fine thickened portion 55 is composed oof an aggregation of dots and an aggregation of line segments. FIG. 7(A) is a plan view of the colored layer. Line segments different in color are arranged so as to form a vertical stripe pattern. The line segment shown in white is a non-colored portion, and coloring ink does not exist in this portion. FIG. 7(B) is a plan view of the thickened portion and the metallic reflective layer. An oblique band-shaped blank portion arranged in the central, an aggregate portion of dots arranged on the left side of the blank portion, an aggregate portion of the inclined line segments arranged on the right side of the blank portion are arranged so as to constitute three types of regions. The portion interposed between the blank portion and the aggregate portion of the dots and the portion interposed between the blank portion and the aggregate portion of the line segments each constitute the transmission portion 4 in which there exists none of the thickened portion and the metallic reflective layer at all. FIG. 7(C) is a plan view of the colored layer 61 on the rear surface side. The entire surface is uniformly colored with relatively pale-colored ink. By combining them, metallic tone print sheets of various expressions as shown in FIG. 7(D), FIG. 7(E), and FIG. 7(F) can be obtained.

In FIG. 7(A), only a vertical stripe pattern by the colored layer is merely shown. However, in the metallic tone print sheets shown in FIG. 7(D), FIG. 7(C), and FIG. 7(F), the metallic portion 3 is configured by the overlapped portion 11 in which the colored layer, the thickened portion, and the metallic reflective layer are overlapped and the non-colored metallic reflective portion 13 in which only the thickened portion and the metallic reflective layer exist and no colored layer exists. On the other hand, the transmission portion 4 is configured by a plane colored portion 12 in which only the colored layer exists and the thickened portion and the metallic reflective layer do not exist and a non-colored non-reflective portion 14 in which none of the colored layer, the thickened portion, and the metallic reflective layer exist. As a result, a variety of fine patterns can be formed without hindering the good transmission/reception of radio waves.

Figure 8:
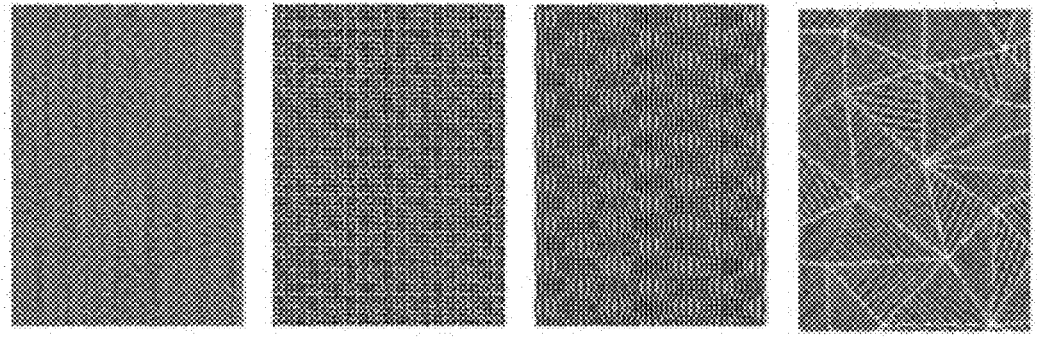
FIG. 8 is a plan view showing concrete examples of a thickened portion and a metallic reflective layer that can be applied to an embodiment of the present invention.
Figure 8:
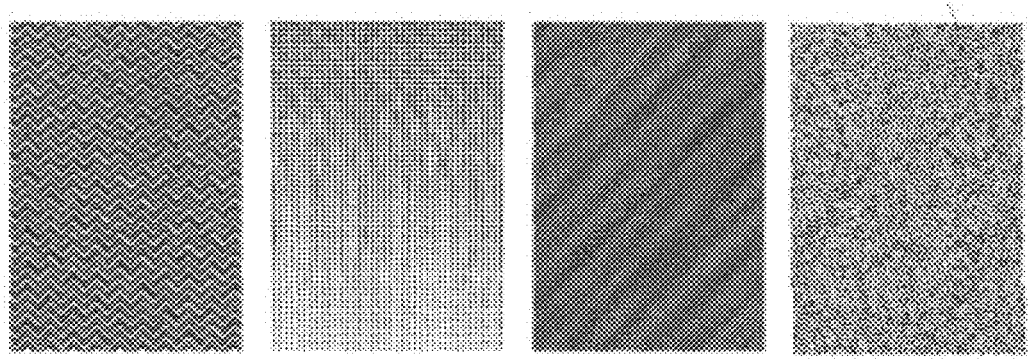
Figure 8:
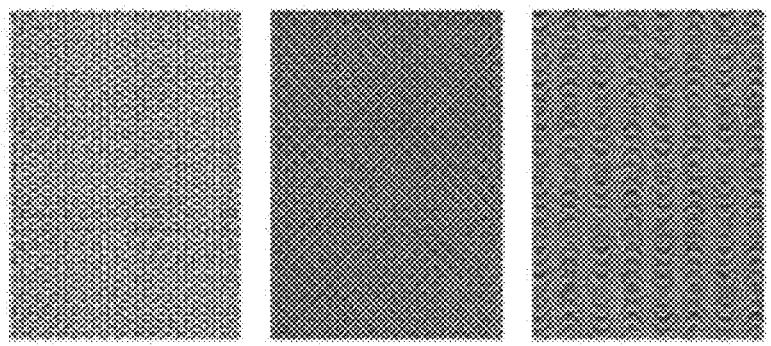
Figure 9:
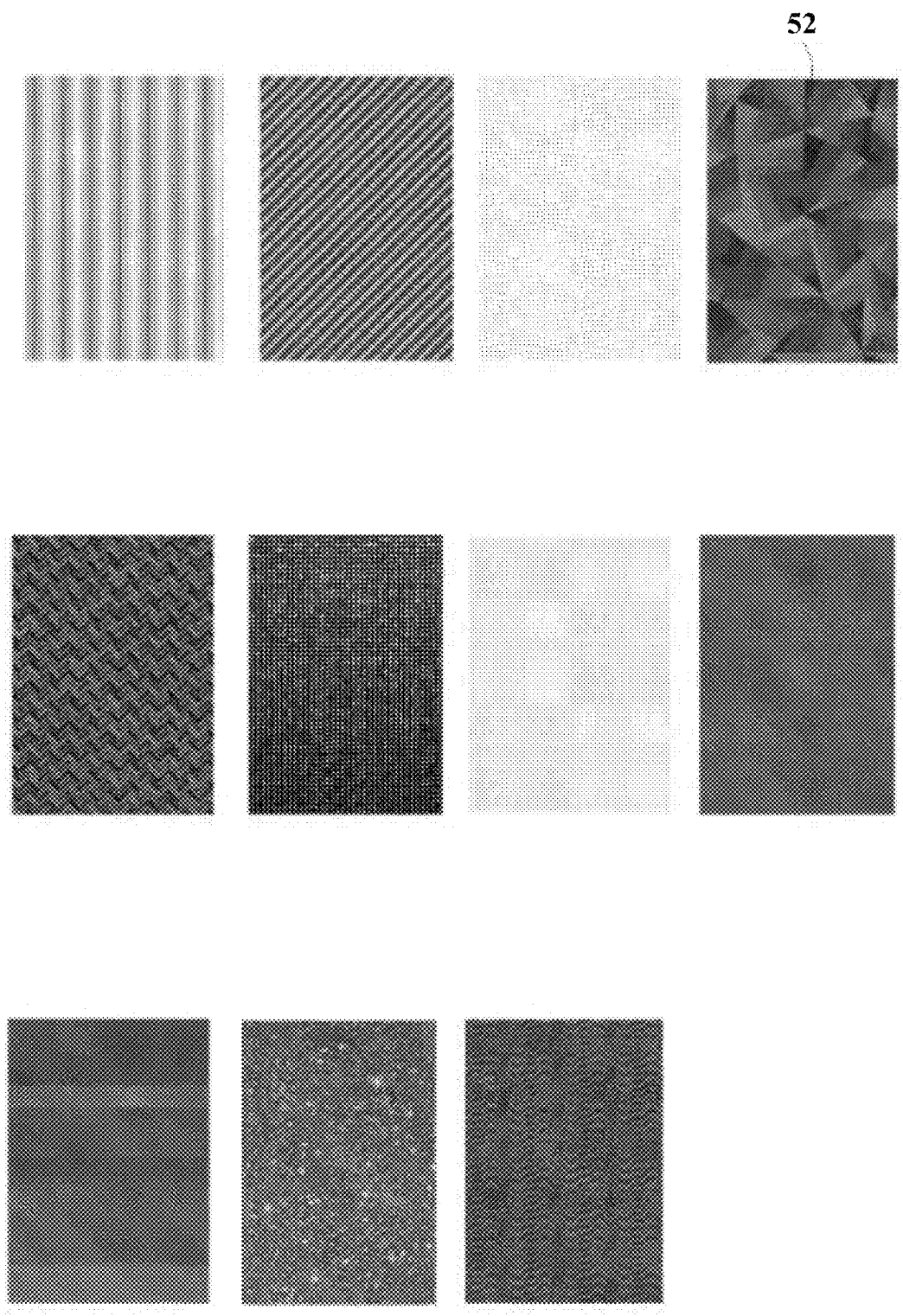
FIG. 9 is a plan view showing a concrete example of a colored layer that can be applied to an embodiment of the present invention.
Figure 10:
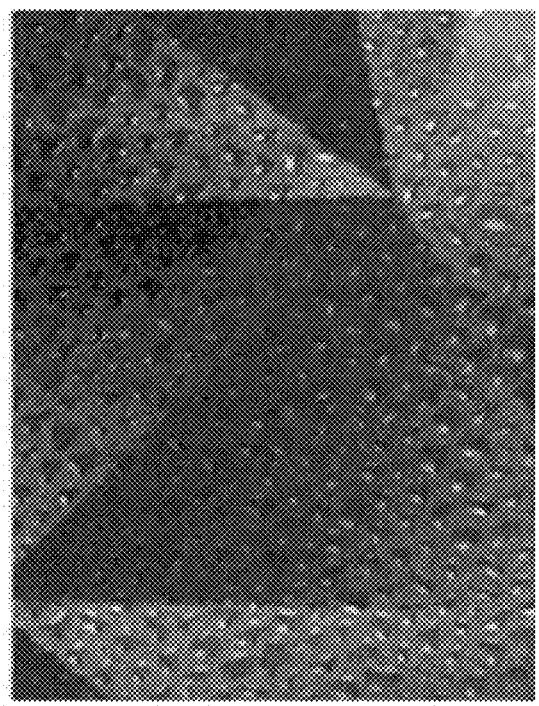
FIG. 10(A) and FIG. 10(B) are photographs showing examples of a metallic tone print sheet according to an embodiment of the present invention.
Figure 10:
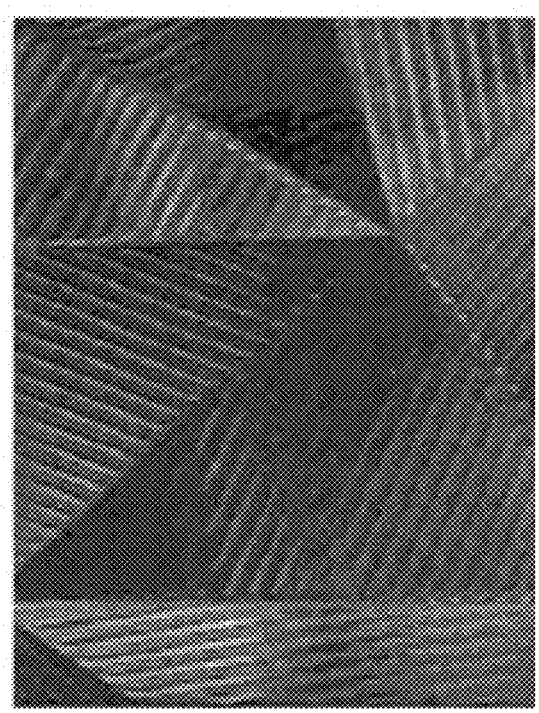

FIG. 8 shows an example of the minute thickened portion 50 composed of an aggregation of fine thickened portions 55, and the minute thickened portion 50 can be implemented in various designs. FIG. 9 shows an example of the colored layer 52, and the colored layer 52 can be implemented in a variety of designs. By combining them, a variety of designs can be created. For example, FIG. 10 shows an example in which two types of metallic reflective layers 57 are arranged with respect to the figure of the colored layer 52 in the upper right of FIG. 9. FIG. 10(A) shows an example in which the metallic reflective layer 57 on the middle right side of FIG. 8(B) is arranged with respect to the figure of the colored layer 52. FIG. 10(B) shows an example in which the metallic reflective layer 57 on the upper right side of FIG. 8 is arranged with respect to the figure of colored layer 52. In this manner, by merely changing the form of the metallic reflective layer 57, various expressions can be made even if the same colored layer 52 is used.

Figure 11:
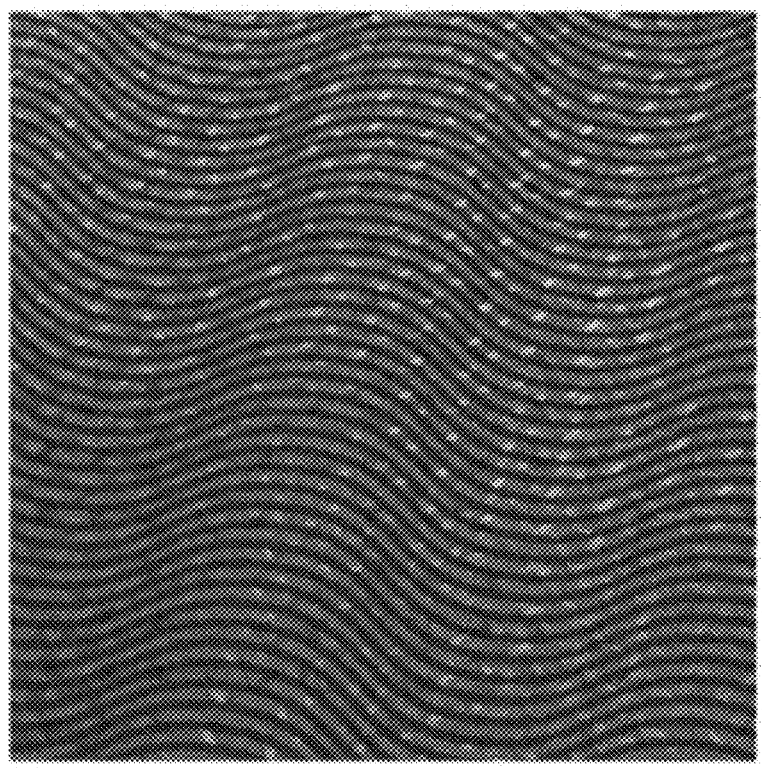
FIG. 11(A) and FIG. 11(B) are photographs showing examples of a metallic tone print sheet according to an embodiment of the present invention.
Figure 11:
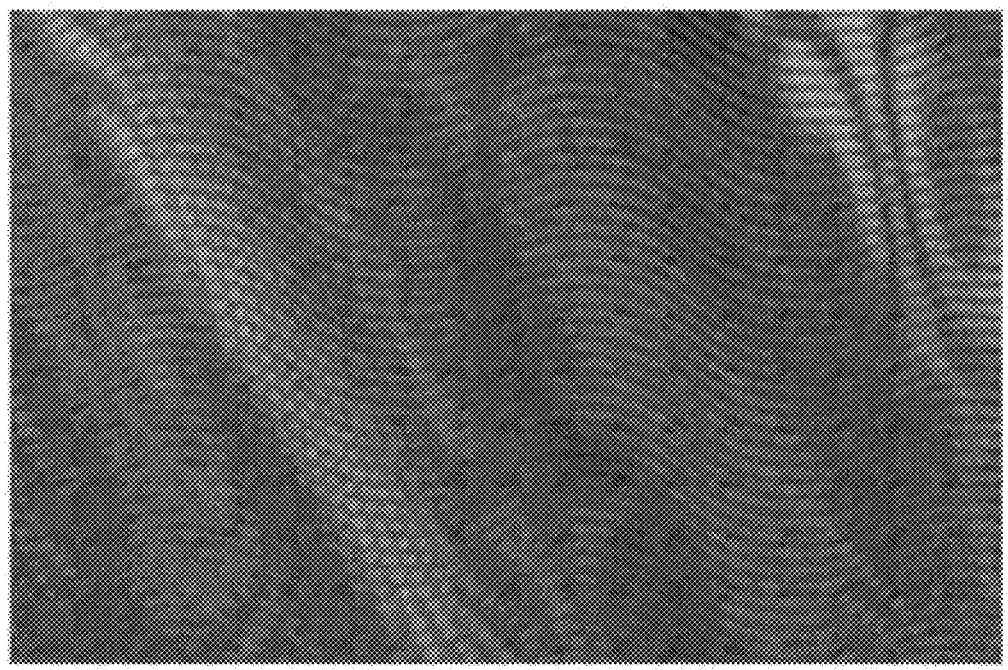

Further, the minute thickened portion 50 can constitute a figure causing illusion, moire, or fringes by the aggregation of fine dot-shaped or line-shaped fine thickened portions 55. As an illusion, various geometric illusions are known, and the figure may cause any illusion. However, it is particularly preferable that the figure cause a three-dimensional illusion. Examples of geometric illusions include Muller-Lyer illusions, Zerner illusions, Herring illusions, Ponzo illusions, Fick illusions, Podgendorff illusions, Derbuff illusions, Oppel-Kunto illusions, Frazier illusions, Munsterberg illusions, Cafewall illusions, Evinghouse illusions, and Justroe diagrams. Checker shadow illusions may also be used. The moire or a figure as shown in FIG. 11 that causes interference fringes may also be exemplified.

Production of Metallic Tone Print Sheet 51

Next, a method for producing the above-described metallic tone print sheet 51 will be described.

Outline of Steps of Producing Metallic Tone Print Sheet 51: First Example

The steps of producing the metallic tone print sheet 51 include a coloring step, a thickening step, and a decoration step. The coloring step is a step of forming the colored layer 52 by coloring ink having light permeability on the rear surface side of the base sheet 10 having light permeability. The thickening step is a step of forming the thickened portion 56 having light permeability on the back side of colored layer 52. The decoration step is a step of forming the metallic reflective layer 57 on the rear surface side of the thickened portion 56.

Coloring Step

The coloring step is a step of forming the colored layer 52 by printing coloring ink having light permeability on the rear surface side of the base sheet 10 having light permeability in various methods. The printing can be performed by offset printing, silk printing, or ink jet printing, but can also be performed by other printing methods, such as, e.g., gravure printing.

The thickness of the colored layer 52 is suitably about 1 μm in the case of offset printing and about 10 μm in the case of silk printing. The thickness is preferably in the range of about 1 μm to about 20 μm, more preferably in the range of about 4 μm to about 20 μm, but may be appropriately changed to be carried out.

Further, as the colored layer 52, a first colored region 53 in which the thickened portion 56 is not arranged on the rear surface side and a second colored region 54 in which the thickened portion 56 is arranged on the rear surface side may be formed. The first colored region 53 and the second colored region 54 may be colored so as to be different at least in one of hue, lightness, and saturation.

Thickening Step

The thickening step is a step of forming the thickened portion 56 at a position including at least a part of the rear surface of the colored layer 52.

The thickened portion 56 may be formed by printing thickening ink having light permeability in the same manner as in the case of the colored layer 52, but may be formed by other methods. As recited above, the thickness (t) and the width (l) of the thickened portion 56 are major factors influencing the decorative effects of the metallic tone print sheet 51. For this reason, the thickness (t) thereof is preferably 75 μm to 150 μm, more preferably 80 μm to 100 μm, and the width (l) thereof is preferably 0.3 mm to 3.0 mm, but they are not limited thereto. In order to obtain this thickness, it is advantageous to carry out silk-screen printing with a large layer thickness. At this time, printing may be performed once or a plurality of times, such as, e.g., five times. A plurality of types of thickened portions 56 different in thicknesses may be formed by partially changing the number of times of printing. On the other hand, by making the thickness of the thickened portion 56 the same, printing plates can be commonly used when printing is performed, thereby increasing the productivity.

Decoration Step

The decoration step is a step of forming the metallic reflective layer 57 at least on a part of the rear surface of the thickened portion 56. The thickened portion 56 formed in the thickening step projects rearward from the rear surface side of the colored layer 52. At least the periphery of the thickened portion 56 is provided with the concave curved portion 58 curved rearward in the cross-section in the thickness direction of the base sheet 10 due to the surface tension. Then, in the decoration step, the metallic reflective layer 57 is formed at least on a part of the rear surface of the concave curved portion 58, thereby forming the metallic concave reflective surface 59 by the formed metallic reflective layer 57.

The metallic reflective layer 57 is preferably formed by transferring a reflective foil, such as, e.g., a metallic foil and a holographic foil, by a transfer foil method. The metallic reflective layer 57 may also be formed by silk-printing (silver-paste ink or mirror ink), hot-stamping, evaporating, or sputtering. However, the use of a transfer foil is advantageous in that a higher metallic reflection effect can be obtained. More specifically, it is advantageous to use a transfer foil in that the transfer foil has a higher specular property than silk printing (silver paste ink or mirror ink) and in that a hologram foil, which cannot be produced by silk printing, can also be used.

When the metallic reflective layer 57 is formed by using a transfer foil method, a transfer binder layer (not shown) may be formed. The binder layer may be formed of any material capable of fixing the reflective foil and may be formed of, for example, transparent silk ink. In particular, it is suitable to use ink that does not cause breakage or cracking of the binder layer over time.

The thickness of the metallic reflective layer 57 may be appropriately changed and preferably ranges from about 0.3 μm to about 0.5 μm.

Outline of Step of Producing Metallic Tone Print Sheet 51: Second Example

In another production example of the metallic tone print sheet 51 according to the present application, the decorative portion is formed on the rear surface side of the base sheet 10 having light permeability. Specifically, a coloring step of forming the colored layer 52 by coloring ink having light permeability, a thickening step of forming the thickened portion 56 by thickening ink having light permeability, and a decoration step of forming the metallic reflective layer 57 on the rear surface side of the thickened portion 56 are performed.

The step of producing the metallic tone print sheet 51 may be performed in the order of the coloring step, the thickening step, and the decoration step (hereinafter referred to as a "first implementation step), or may be performed in the order of the thickening step, the coloring step, and the decoration step (hereinafter referred to as a "second implementation step").

Coloring Step

The coloring step is a step of forming the colored layer 52 by printing coloring ink having light permeability on the rear surface side of the base sheet 10 by various methods. In the coloring step, as viewed from the front side, the colored layer 52 is formed so as to provide a first colored region 53 located at a position where the thickened portion 56 does not exist and a second colored region 54 located at a position where the thickened portion 56 exists. The first colored region 53 and the second colored region 54 are colored so as to be different at least in one of hue, lightness, and saturation.

In the case where the step of producing the metallic tone print sheet 51 is performed in the first implementation step, both the first colored region 53 and the second colored region 54 are formed on the rear surface side of the base sheet 10. In the case where the step of producing the metallic tone print sheet 51 is performed in the second implementation step, the first colored region 53 is formed on the rear surface side of the base sheet 10, and the second colored region 54 is formed on the rear surface side of the thickened portion 56 formed on the rear surface side of the base sheet 10.

The printing method for forming the colored layer 52 and the thickness of the colored layer 52 are the same as those of the first embodiment of the present application, and therefore, the description thereof will be omitted.

Thickening Step

The thickening step is a step of forming the thickened portion 56 on the rear surface side of the base sheet 10.

In a case where the step of producing the metallic tone print sheet 51 is performed in the second implementation step, the thickened portion 56 is formed on the rear surface side of the base sheet 10. In a case where the step of producing the metallic tone print sheet 51 is performed in the first implementation step, the thickened portion 56 is formed on the rear surface side of the second colored region 54 formed on the rear surface side of the base sheet 10.

The method of forming the thickened portion 56 and the thickness and width of the thickened portion 56 are the same as those in the first embodiment of the present application, and therefore, the descriptions thereof will be omitted.

Decoration Step

The decoration step is a step of forming the metallic reflective layer 57 on the rear surface side of the thickened portion 56. The metallic reflective layer 57 is configured to reflect the light from the front surface side such that the front side viewer can visually recognize the reflected light transmitted through the colored layer 52 and reflected by the metallic reflective layer 57. Therefore, the metallic reflective layer 57 is formed on the rearmost surface side of the metallic tone print sheet 51.

In a case where the step of producing the metallic tone print sheet 51 is performed in the first implementation step, the metallic reflective layer 57 is formed on the rear surface side of the thickened portion 56. In a case where the step of producing the metallic tone print sheet 51 is performed in the second implementation step, the metallic reflective layer 57 is formed on the rear surface side of the second colored region 54 formed on the rear surface side of the thickened portion 56.

The method of forming the metallic reflective layer 57 and the thickness of the metallic reflective layer 57 are the same as those in the first embodiment of the present application, and therefore, the descriptions thereof will be omitted.

When forming the metallic reflective layer 57 by using a transfer foil method, a transfer binder layer (not shown) may be formed between the second colored region 54 formed on the rear surface side of the thickened portion 56 and the metallic reflective layer 57 in order to secure the fixing property thereof. The binder layer may be formed of any material capable of fixing the reflective foil and may be formed of, for example, transparent silk ink. In particular, it is suitable to use ink that does not cause breakage or cracking of the binder layer over time.

Integration of Metallic Tone Print Sheet 51 with Outer Shell Member 71

The metallic tone print sheet 51 may be integrated with the outer shell member 71 by various methods.

Method by Pasting

The metallic tone print sheet 51 can be used by being affixed to the main body of the outer shell member 71, such as, e.g., a casing and a protective case 2 of a smartphone 1.

The affixing method is not particularly limited and may be a method using an adhesive or a pressure-sensitive adhesive or a method using a molding technique. As the material of the outer shell member 71, various materials, such as, e.g., a metal, a synthetic resin, and composites thereof, can be used.

For the outer shell member 71 using a resin molded product made of synthetic resin, a lamination molding technique can be applied. As the method of the lamination molding technique, both in-mold molding and out-mold molding can be applied. Hereinafter, an example of affixing using an adhesive or a pressure-sensitive adhesive, an example of affixing using in-mold molding, and an example of affixing using out-mold molding are described.

Examples of Affixing Using Adhesive and Pressure-Sensitive Adhesive

Figure 12:
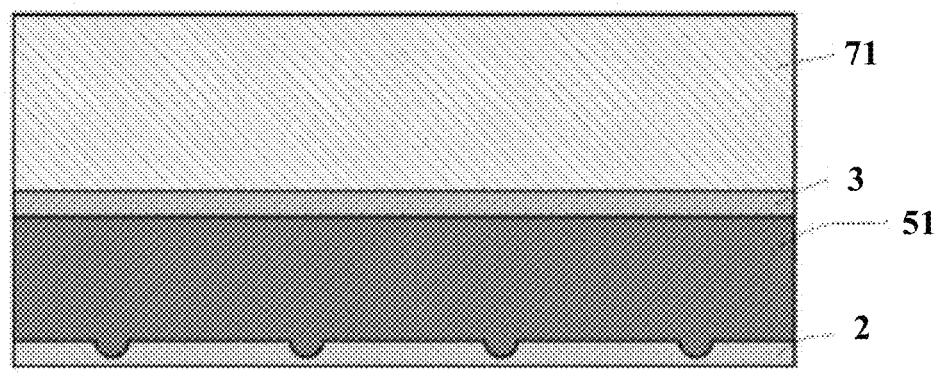
FIG. 12(A) is a cross-sectional view of an outer shell member in which a metallic tone print sheet according to the present invention is bonded on the rear surface side.
FIG. 12(B) is a cross-sectional view of an outer shell member in which a metallic tone print sheet according to the present invention is bonded to the front surface side.
Figure 12:
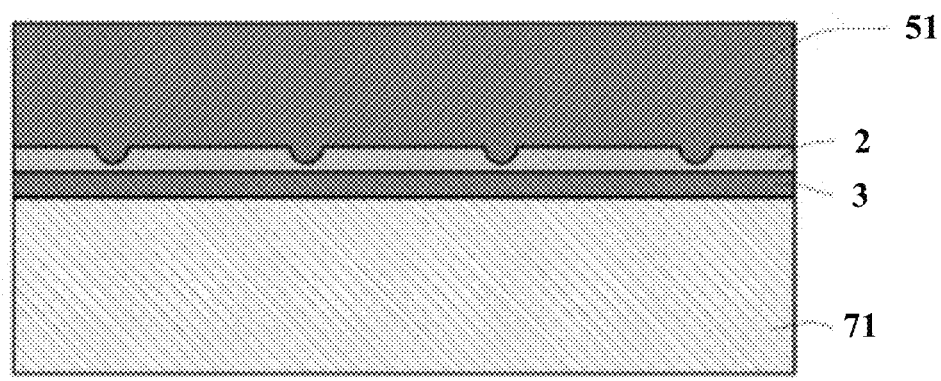

As shown in FIG. 12(A), it is possible to affix the front surface side of the metallic tone print sheet 51 on the rear surface side of the outer shell member 71. The outer shell member 71 is implemented as a transparent member, such as, e.g., an acrylic plate. The outer shell member 71 (in this instance, a transparent body) and the metallic tone print sheet 51 are bonded by a sheet-to-sheet bonding agent 62, such as, e.g., a pressure-sensitive adhesive and an adhesive. It is desirable to use a pressure-sensitive adhesive or an adhesive that is high in transparency and is less likely to mix air bubbles therebetween. For example, as the adhesive, it is advantageous to use an active energy ray (e.g., ultraviolet ray) curable adhesive agent represented by a UV adhesive agent.

When the outer shell member 71 is viewed from the front surface side, the metallic tone print sheet 51 is affixed to the position to be visually recognized. Accordingly, the reflected light from the metallic concave reflective surface 59 can be visually recognized through the transparent outer shell member 71 and the sheet-to-sheet bonding agent, thereby exerting three-dimensional decorative effects.

Further, as shown in FIG. 12(B), the metallic tone print sheet 51 may be arranged on the front surface side of the outer shell member 71 made of various materials. A sheet-to-sheet bonding agent 62, such as, e.g., various pressure-sensitive various adhesives and adhesives, capable of realizing good adhesion in relation to the metallic tone print sheet 51 and the outer shell member 71 can be selectively used. Forming a layer of the sheet-to-sheet bonding agent 62 on the rear surface side of the metallic tone print sheet 51 relaxes the unevenness of the rear surface of the metallic tone print sheet 51 to maintain the smoothness of the front surface of the metallic tone print sheet 51. Further, forming the layer prevents the appearance of the unevenness of the rear surface of the metallic tone print sheet 51 due to changes over time.

Instead of the pressure-sensitive adhesive agent or the adhesive agent, ink containing resin components or the like for relieving the unevenness of the rear surface of the metallic tone print sheet 51 may be printed on the rear surface of the metallic tone print sheet 51.

When the metallic tone print sheet 51 to which the outer shell member 71 is affixed on the rear surface side is viewed from the front, the metallic tone print sheet 51 is arranged at a position to be visually recognized. Therefore, reflected light from the metallic concave reflective surface 59 can be visually recognized, thereby exerting three-dimensional decorative effects.

Example of Affixing Using In-Mold Molding

Figure 13:
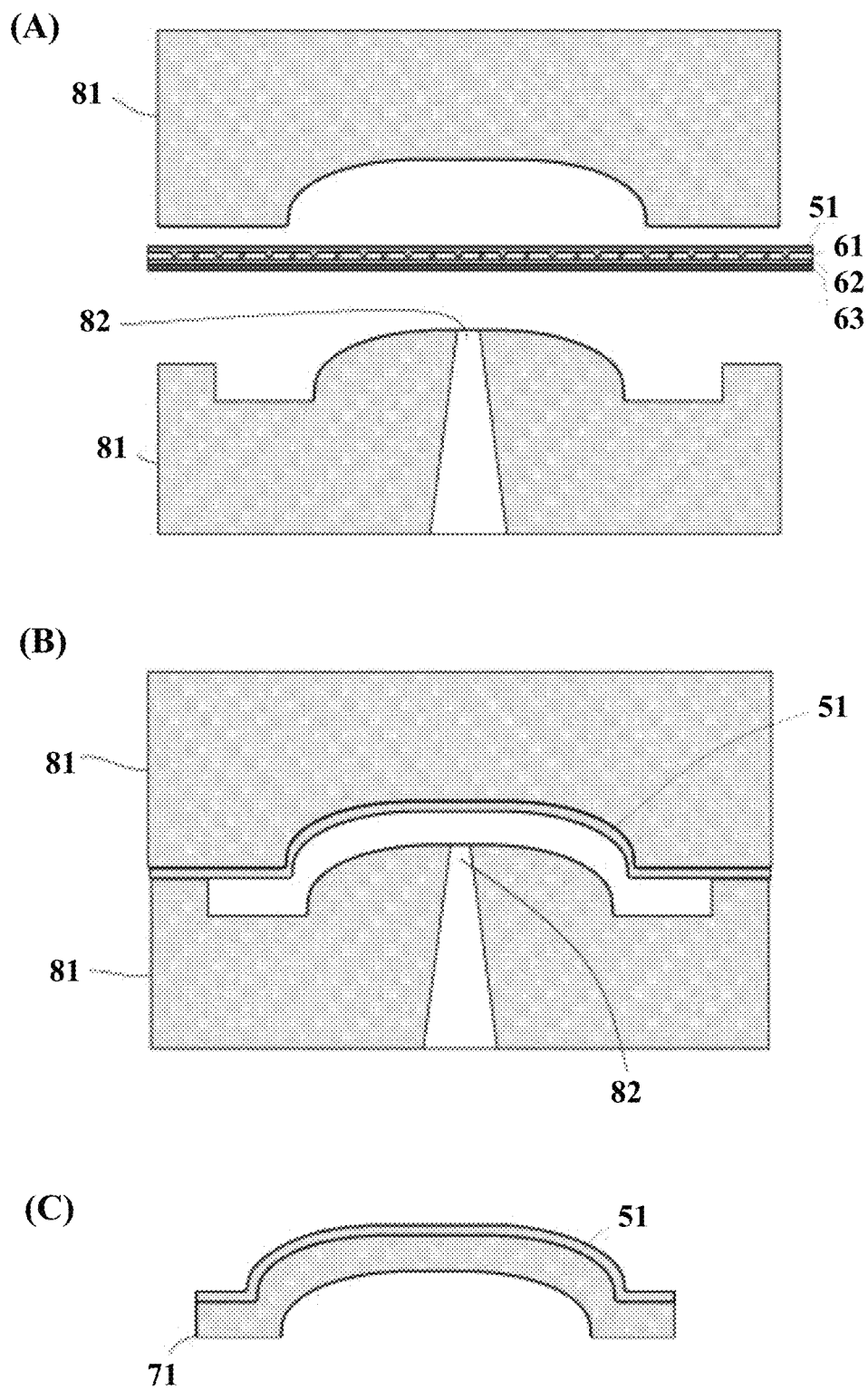
FIG. 13(A) is an explanatory view of a preparation step at the time of in-molding an outer shell member.
FIG. 13(B) is an explanatory view of a step of in-molding the outer shell member.
FIG. 13(C) is a cross-sectional view of the outer shell member.

FIG. 13 is an explanatory view showing in-mold molding. As shown in FIG. 13(A), molding dies 81 and 81 for resin-molding are opened, and a metallic tone print sheet 51 is arranged between the molding dies.

Next, as shown in FIG. 13(B), the molding dies 81 and 81 are closed, and a molten synthetic resin is injected from the injection port 82 to perform injection molding between the molding dies 81 and 81 to thereby affix the paste metallic tone print sheet 51 on the surface of the molded article. The synthetic resin to be injected from the injection port 82 is preferably a synthetic resin having light permeability. Examples of the synthetic resins include polyethylene terephthalate resin, polycarbonate resin, acrylic resin, olefin resin, ABS resin, and polystyrene resin. As shown in FIG. 13(A), an adjustment layer 61 or a backer sheet 63 coated with a sheet-to-sheet bonding agent 62 such as an adhesive may be arranged on the rear surface of the metallic tone print sheet 51 as required. By arranging the backer sheet 63, the shape of the metallic tone print sheet 51 during molding can be maintained to enhance the adhesion between the metallic tone print sheet 51 and the synthetic resin injected from the injection port 82. In a case where the adhesiveness between them is ensured, the backer sheet 63 may not be used.

Note that in FIG. 13(B) and FIG. 13(C), the unevenness (unevenness due to the presence or absence of the thickened portion 56 of the metallic tone print sheet 51) of the rear surface of the metallic tone print sheet 51, the adjustment layer 61, and the backer sheet 63 coated with the sheet-to-sheet bonding agent 62 are not illustrated.

As a result, as shown in FIG. 13(C), an insert molded product in which the outer shell member 71 (a resin molded product made of synthetic resin in this embodiment) and the metallic tone print sheet 51 arranged on the front surface of the outer shell member 71 are integrated can be obtained.

Figure 14:
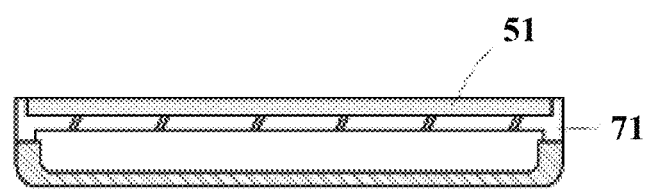
FIG. 14(A) is a cross-sectional view showing an example of an outer shell member.
FIG. 14(B) is a cross-sectional view of another example of an outer shell member.
Figure 14:
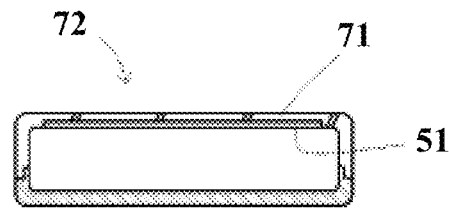

Other examples of the insert molded product are shown in FIG. 14(A) and FIG. 14(B). In the outer shell member 71 shown in FIG. 14(A), the metallic tone print sheet 51 is arranged on the front surface of the outer shell member 71. The metallic tone print sheet 51 itself is arranged with the front surface facing upward. The metallic tone print sheet 51 is arranged with its front surface exposed to the front surface side of the outer shell member 71 (the upper surface side of FIG. 14(A)). Consequently, when the outer shell member 71 is viewed from above, the front surface of the metallic tone print sheet 51 is directly recognized. Therefore, when the outer shell member 71 is viewed from above, it is possible to visually recognize the reflected light from the metallic concave reflective surface 59.

In the outer shell member 71 shown in FIG. 14(B), the metallic tone print sheet 51 is arranged on the rear surface of the outer shell member 71. The metallic tone print sheet 51 itself is arranged with the front surface facing upward. The front surface of the metallic tone print sheet 51 is arranged on the rear surface (the lower surface in FIG. 14(B) of the outer shell member 71. Consequently, when the outer shell member 71 is viewed from above, the front surface of the metallic tone print sheet 51 is visually recognized through the transparent outer shell member 71. Therefore, when the outer shell member 71 is viewed from above, the reflected light from the metallic concave reflective surface 59 can be visually recognized through the outer shell member 71.

Note that in FIG. 14(A) and FIG. 14(B), the unevenness (unevenness due to the presence or absence of the thickened portion 56 of the metallic tone print sheet 51) of the rear surface of the metallic tone print sheet 51 is not illustrated. In the case of FIG. 14(A), a backer sheet coated with an adjustment layer or an adhesive agent may be arranged on the rear surface of the metallic tone print sheet 51. In the case of FIG. 14(B), a backer sheet coated with an adhesive agent may be arranged on the front surface of the metallic tone print sheet 51, and an adjustment layer may be arranged on the rear surface of the metallic tone print sheet 51. A backer sheet coated with a sheet-to-sheet bonding agent 62 to be arranged on the front surface of the metallic tone print sheet 51 suitably has light permeability.

The metallic tone print sheet 51 to be inserted between the molding dies 81 may be shaped by the heat and the pressure of the injected molten resin. Alternatively, the metallic tone print sheet 51 may be inserted between the molding dies 81 after being preheated outside the molding dies, pre-formed by vacuuming, and then formed by injecting a resin. In some cases, the metallic tone print sheet 51 may not be shaped.

Example of Affixing Using Out-Mold Molding

Figure 15:
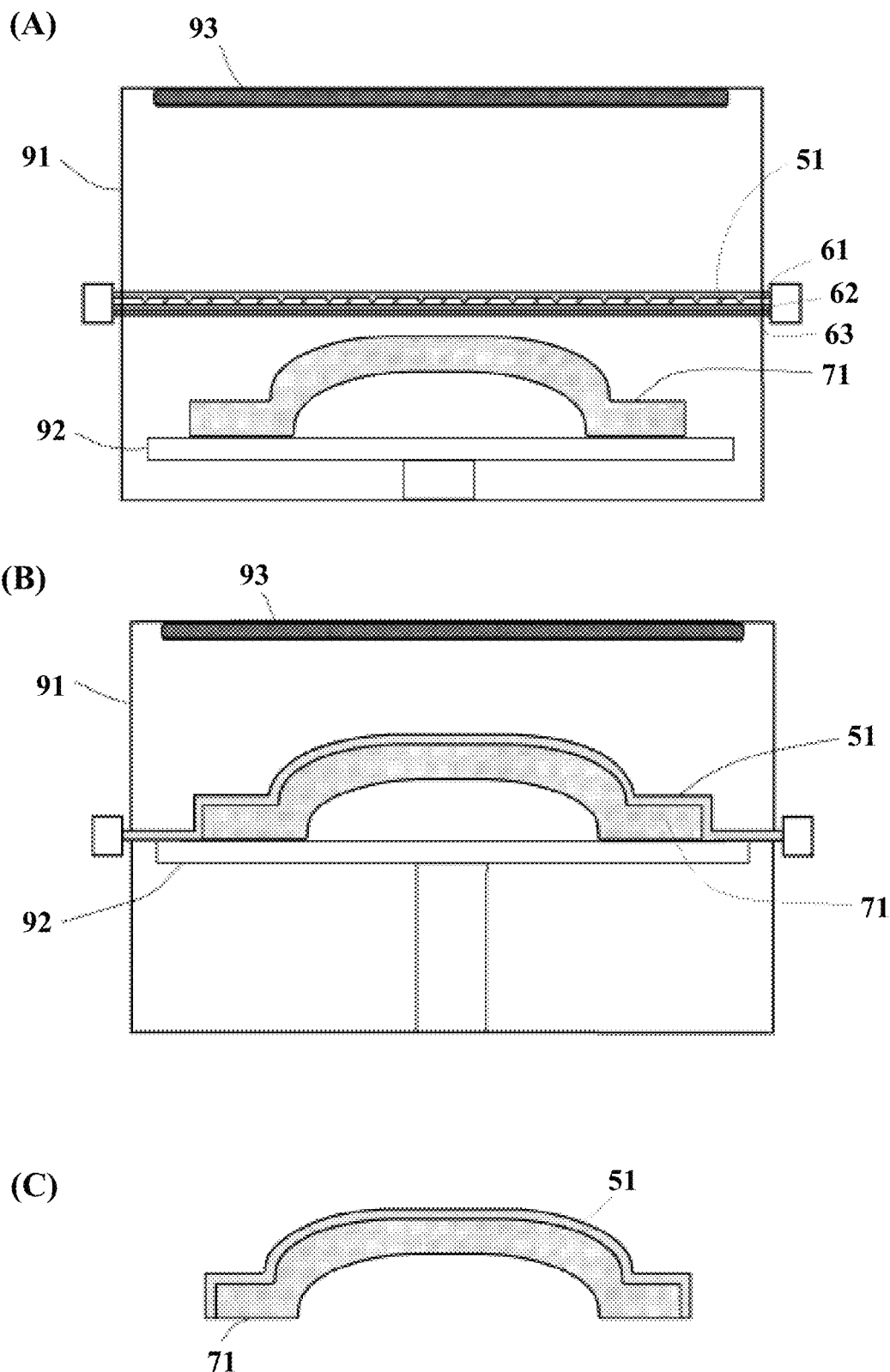
FIG. 15(A) is an explanatory view of a preparation step at the time of out-molding an outer shell member.
FIG. 15(B) is an explanatory view of a step of out-molding an outer shell member.
FIG. 15(C) is a cross-sectional view of the outer shell member.

Next, FIG. 15 shows an example of out-molding. In the out-molding, the metallic tone print sheet 51 is shaped by affixing to the outer shell member 71 by utilizing the pressure difference between the upper portion and the lower portion of the metallic tone print sheet 51. Various types of out-molding have been proposed and put into practical use, and they can be appropriately selected to be used.

An example thereof will be described with reference to FIG. 15. As shown in FIG. 15(A), an outer shell member 71 is arranged on a table 92 in a chamber 91. Then, the inner space of the chamber 91, which is a space above and below the metallic tone print sheet 51, is depressurized by a vacuum pump (not illustrated) connected to the chamber 91. The metallic tone print sheet 51 is heated by a heater 93 as required in the depressurized state. As shown in FIG. 15(A), the adjustment layer 61 or the backer sheet 63 coated with a sheet-to-sheet bonding agent 62 may be arranged on the rear surface of the metallic tone print sheet 51 as required. Note that in FIG. 15(B) and FIG. 15(C), the unevenness (unevenness due to the presence or absence of the thickened portion 56 of the metallic tone print sheet 51) of the rear surface of the metallic tone print sheet 51, the adjustment layer 61, and the backer sheet 63 coated with the sheet-to-sheet bonding agent 62 are not illustrated.

Next, as shown in FIG. 15(B), the table 92 is raised as required, and the atmospheric pressure is introduced into or pressurizing the space above the metallic tone print sheet 51 in the chamber 91. With this, the metallic tone print sheet 51 is pressed against the outer shell member 71 to be affixed thereto. Thus, as shown in FIG. 15(C), the metallic tone print sheet 51 can be affixed to the surface of the outer shell member 71. When the outer shell member 71 is viewed from the front, it is arranged at a position where the metallic tone print sheet 51 is visually recognized. So, it is possible to visually recognize the reflected light from the metallic concave reflective surface 59, thereby exerting a three-dimensional decorative effect. Note that even in a case where the outer shell member 71 is undercut, since the metallic tone print sheet 51 is wound on the undercut portion by the pressure difference, it can be affixed. A hot plate may be used instead of or in combination with the heat by the heater 93. Further, water vapor may be introduced at the time of compressing the air. Various methods can be employed.

In FIG. 1 and FIG. 2, the metallic tone print sheet 51 is provided only at the planar portion of the smartphone 1 or the protective case 2 of the smartphone, which is an outer shell member 71. However, the metallic tone print sheet 51 can be arranged at a bent portion or a curved portion such as a side surface. In this case, it can be implemented by using a metallic tone print sheet 51 in which a metallic tone print sheet 51 arranged at the bent portion or the curved portion and a metallic tone print sheet 51 arranged at the plane portion are continuously formed.

Examples

Figure 16:
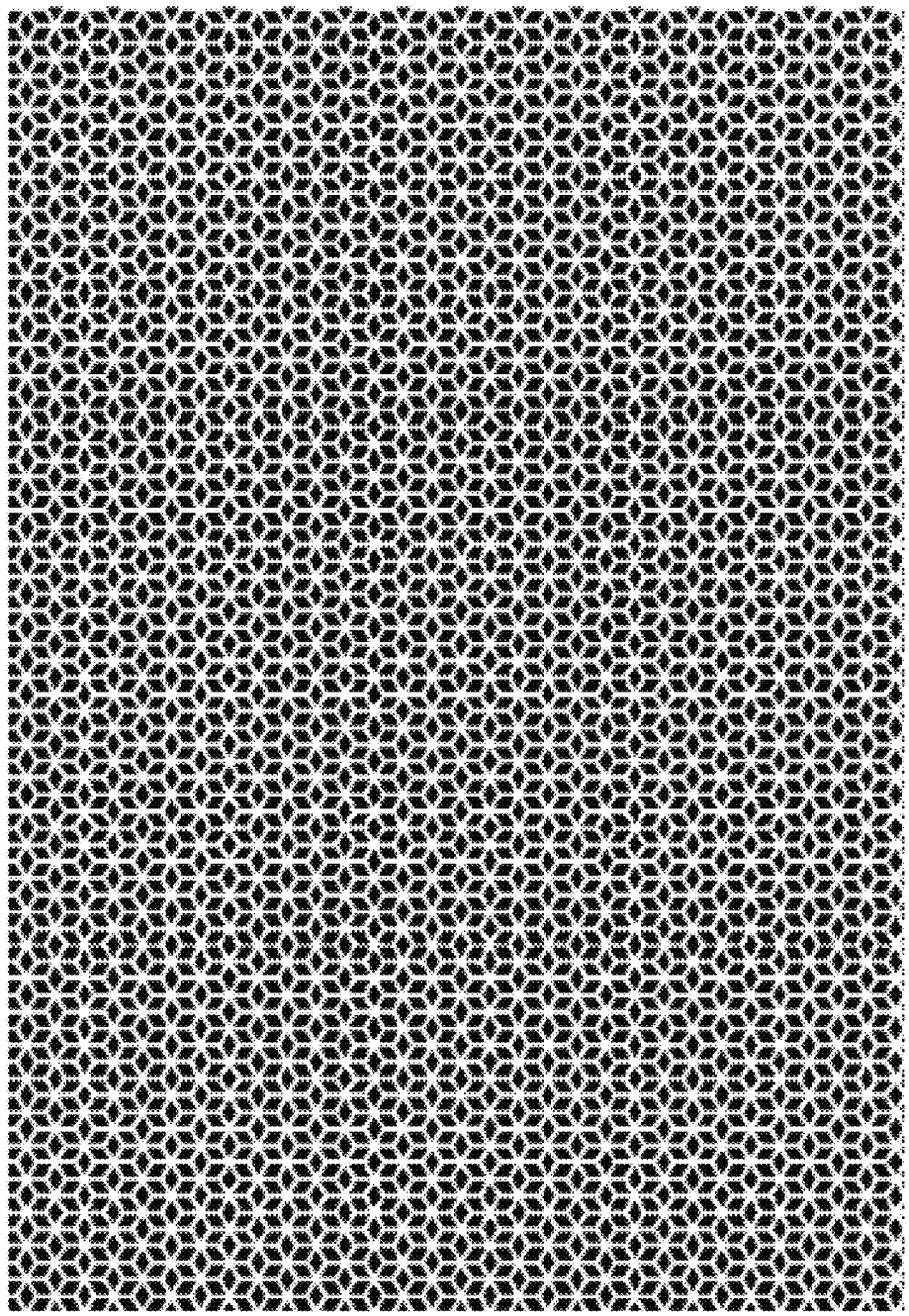
FIG. 16 is an enlarged plan view of a metallic reflective layer of Sample No. 01 according to an example of the present invention.
Figure 17:
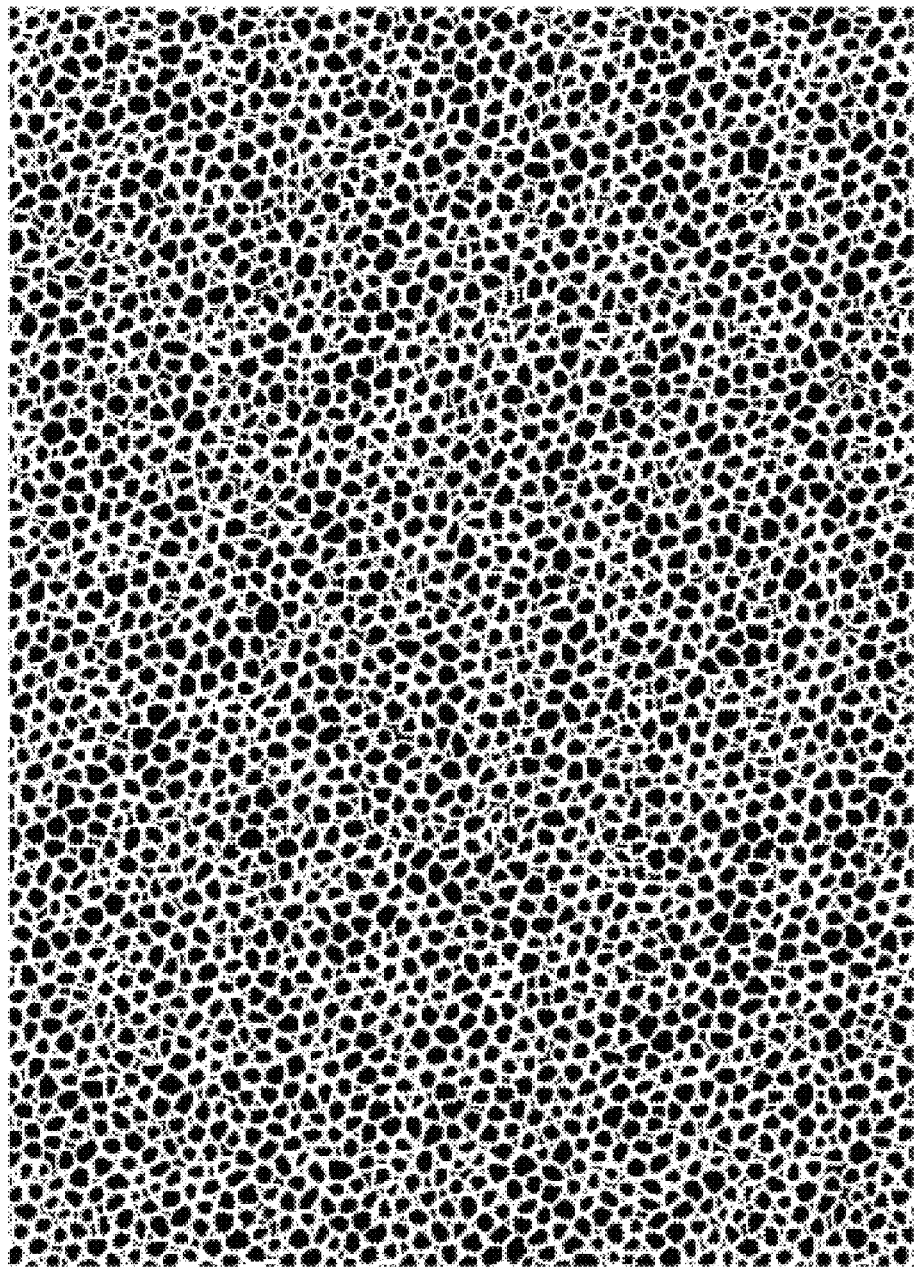
FIG. 17 is an enlarged plan view of a metallic reflective layer of Sample No. 02 according to an example of the present invention.
Figure 18:
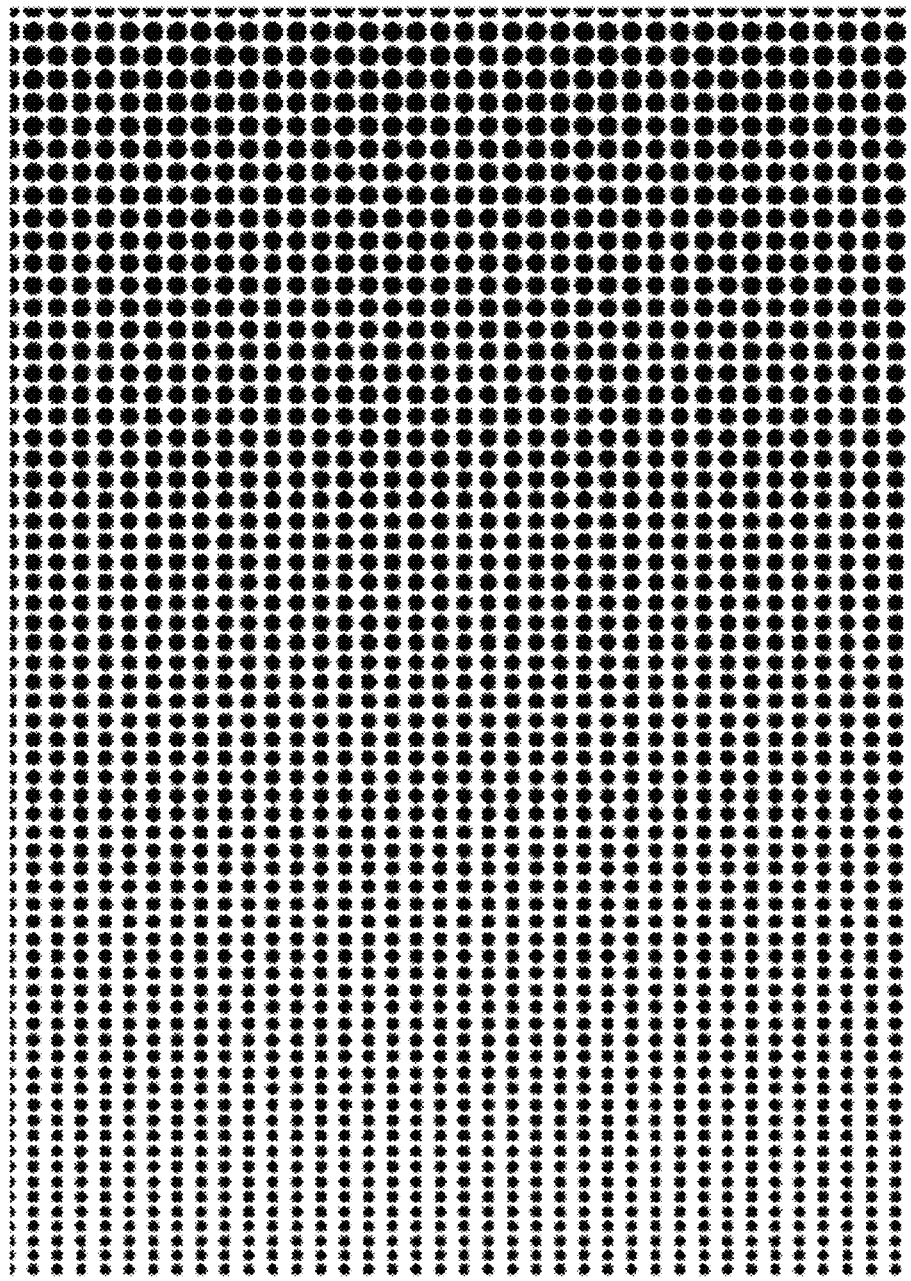
FIG. 18 is an enlarged plan view of a metallic reflective layer of Sample No. 03 according to an example of the present invention.
Figure 19:
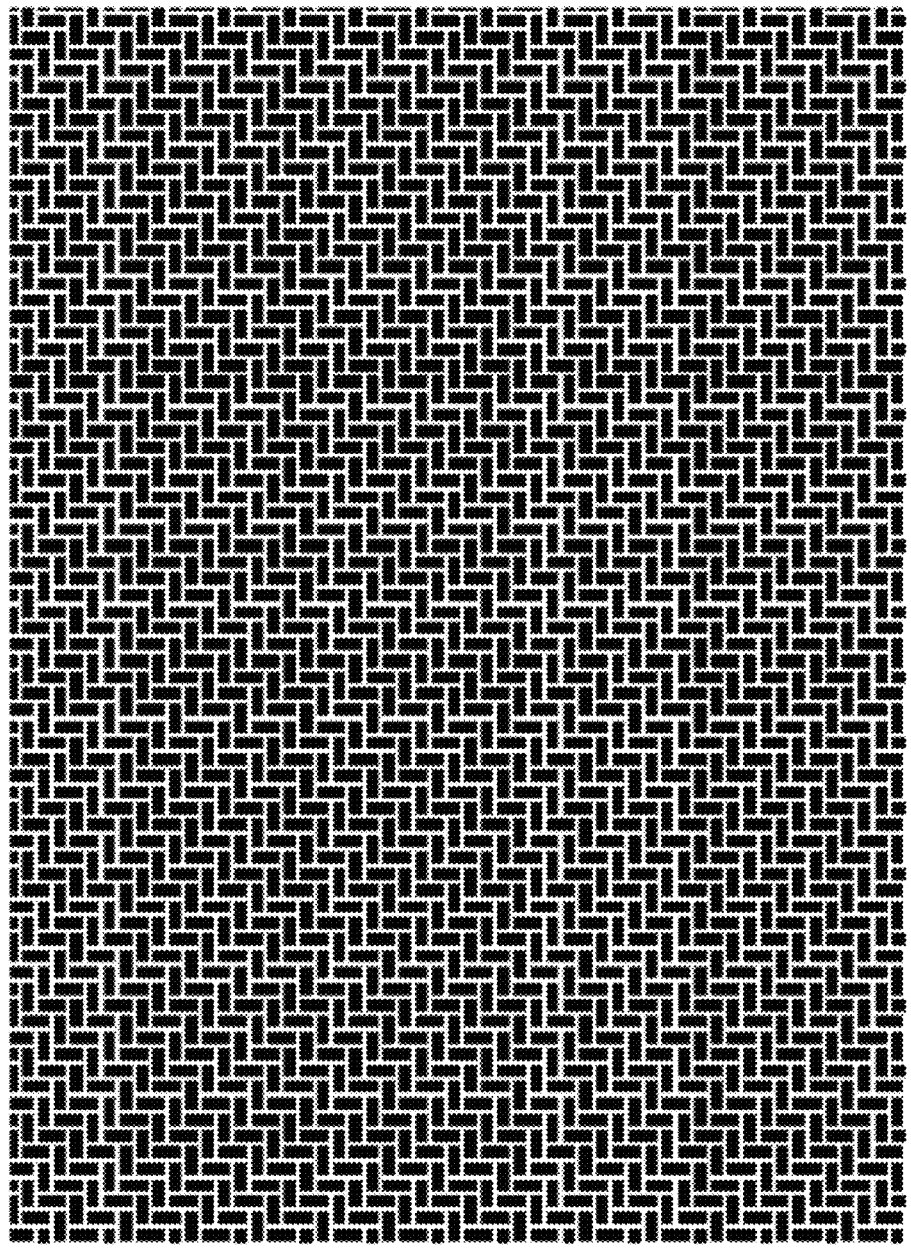
FIG. 19 is an enlarged plan view of a metallic reflective layer of Sample No. 04 according to an example of the present invention.
Figure 20:
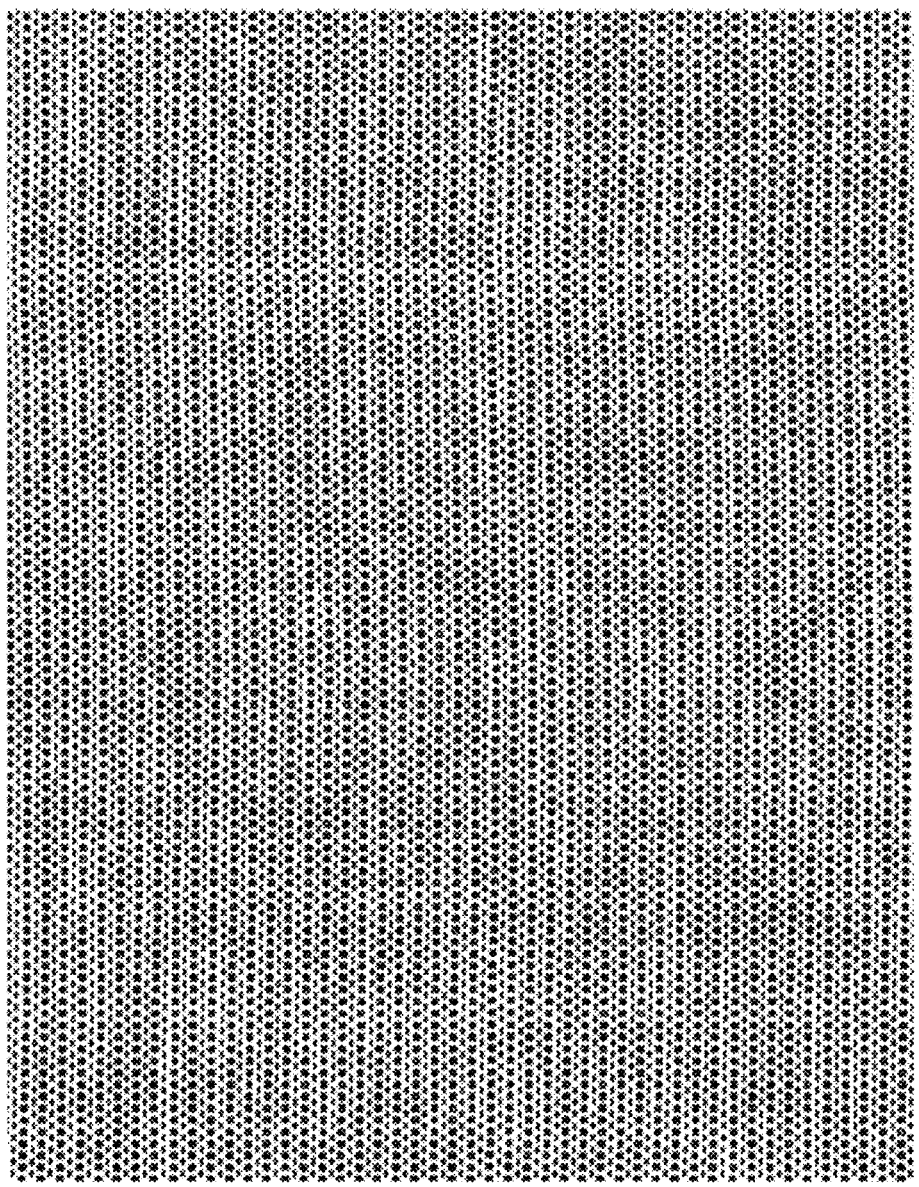
FIG. 20 is an enlarged plan view of a metallic reflective layer of Sample No. 05 according to an example of the present invention.
Figure 21:
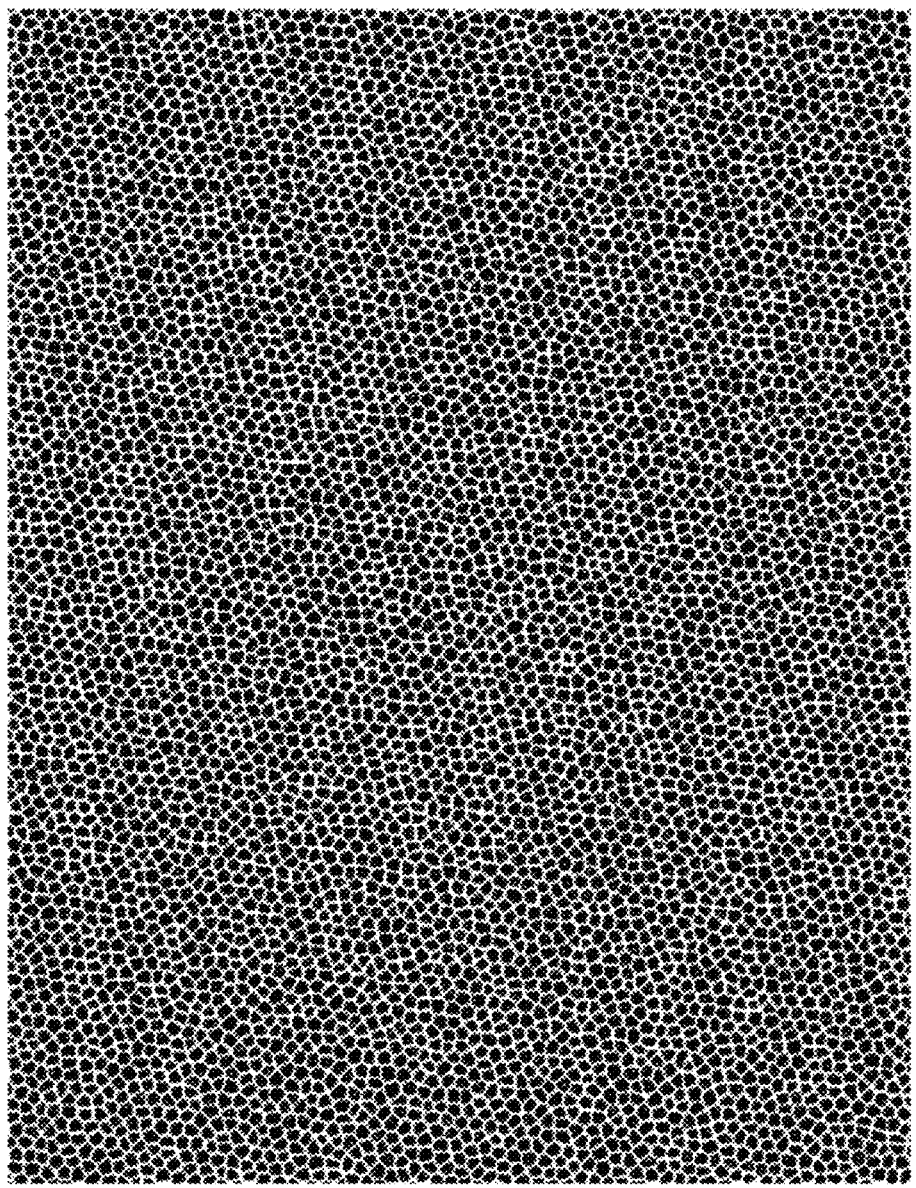
FIG. 21 is an enlarged plan view of a metallic reflective layer of Sample No. 06 according to an example of the present invention.
Figure 22:
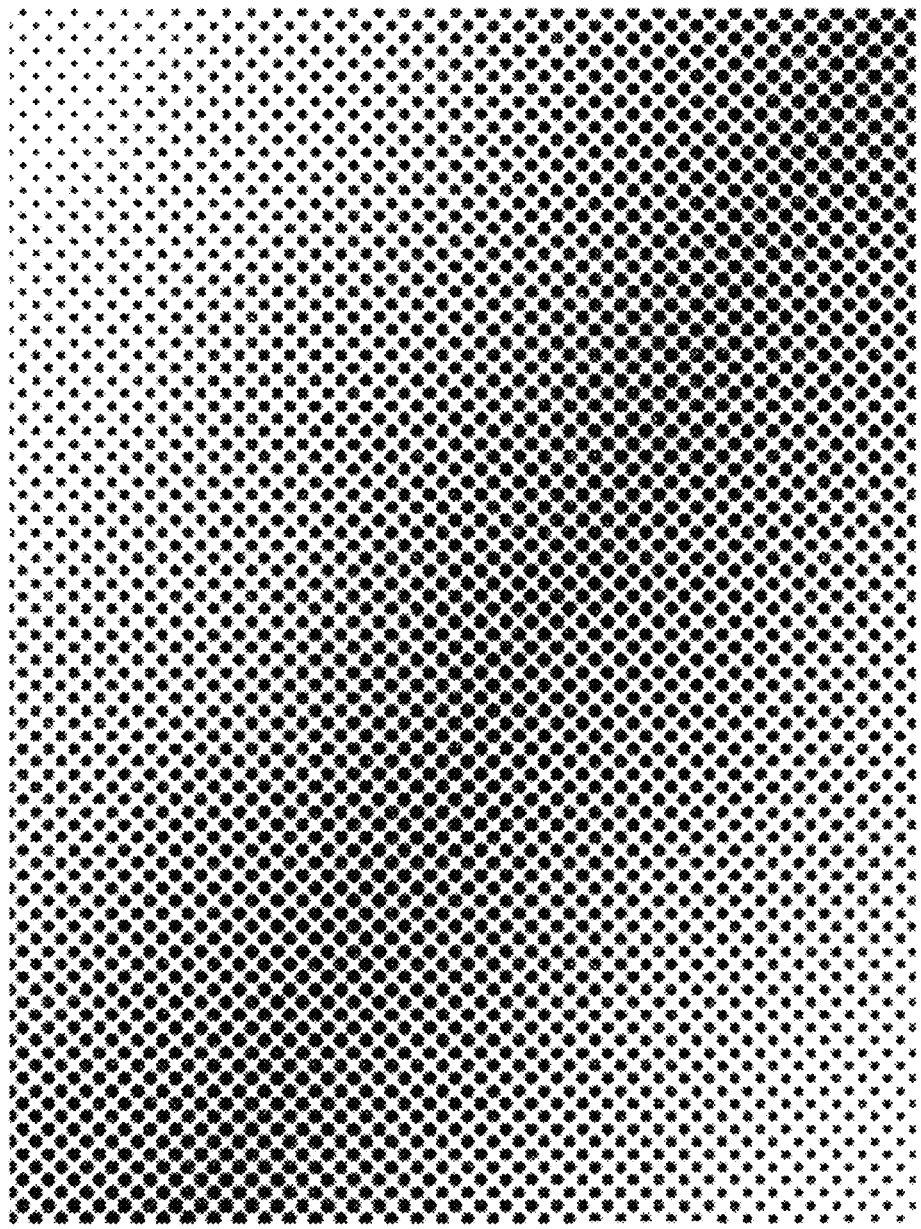
FIG. 22 is an enlarged plan view of a metallic reflective layer of Sample No. 07 according to an example of the present invention.
Figure 23:
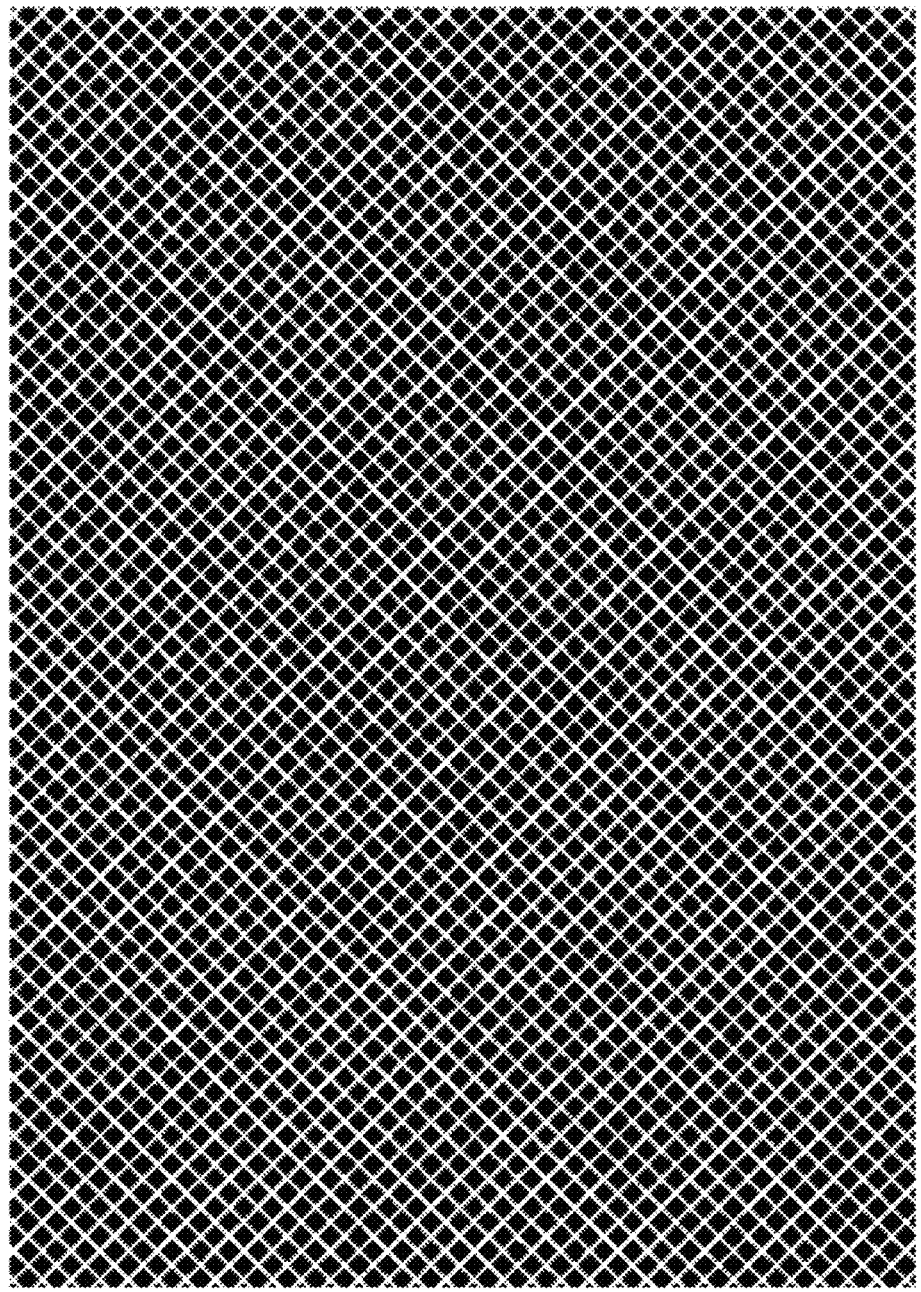
FIG. 23 is an enlarged plan view of a metallic reflective layer of Sample No. 08 according to an example of the present invention.
Figure 24:
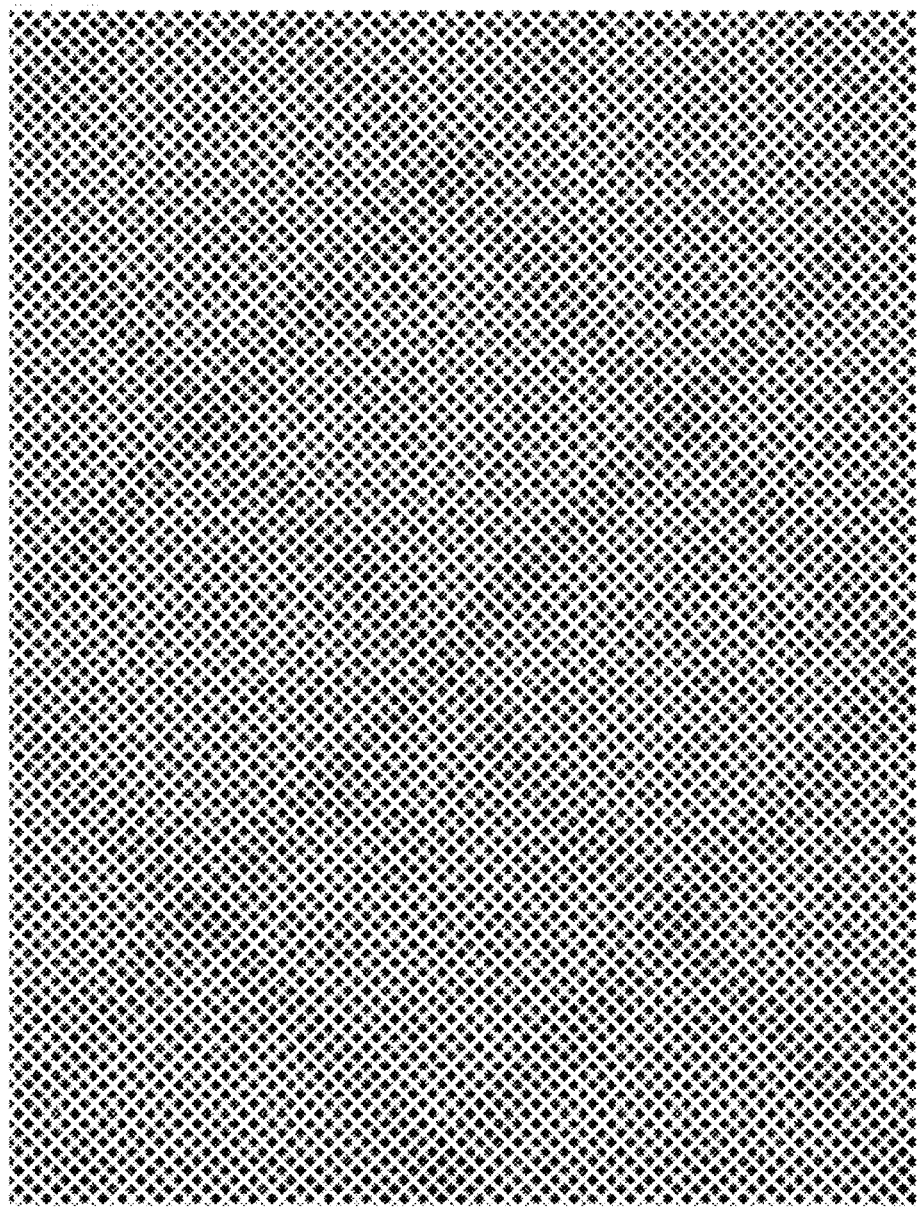
FIG. 24 is an enlarged plan view of a metallic reflective layer of Sample No. 09 according to an example of the present invention.
Figure 25:
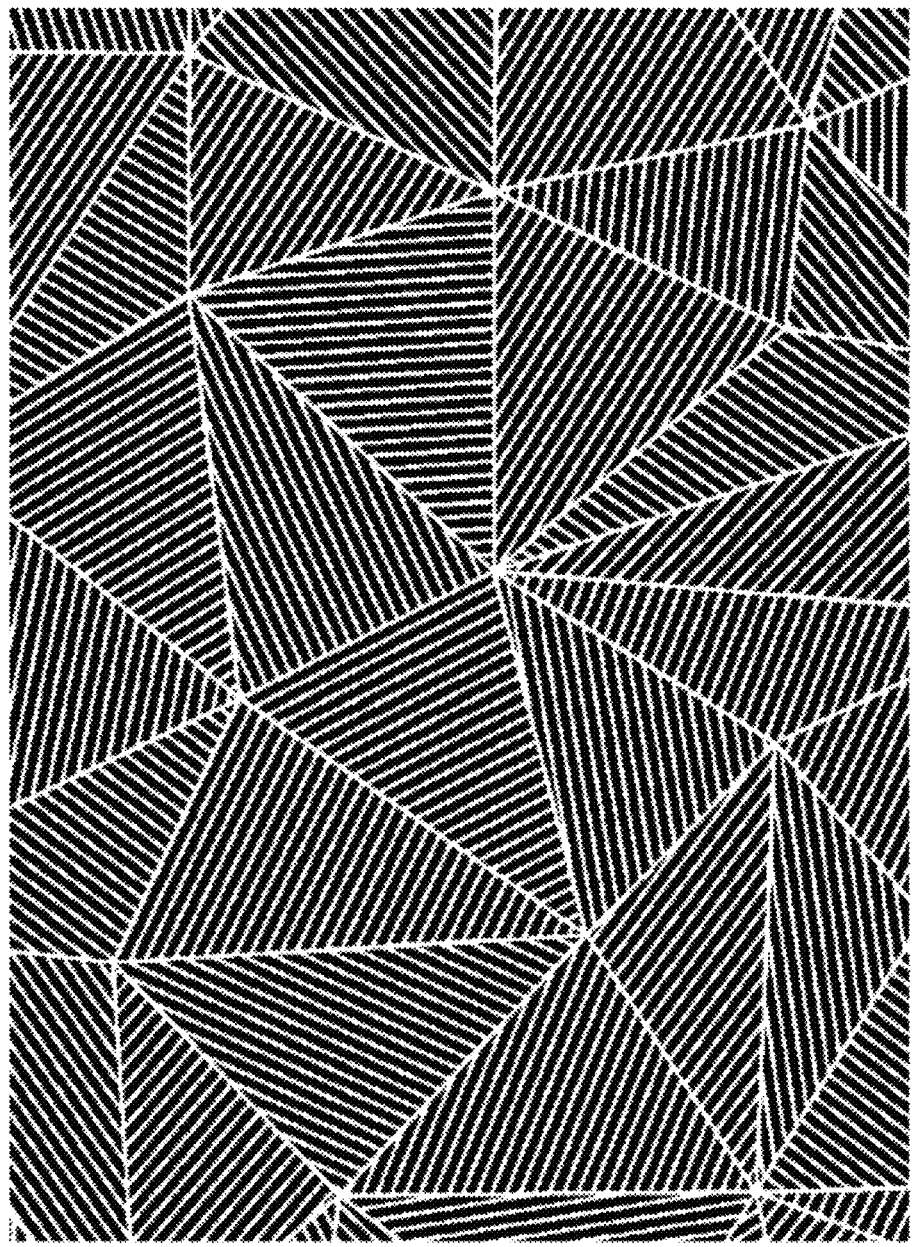
FIG. 25 is an enlarged plan view of a metallic reflective layer of Sample No. 10 according to an example of the present invention.

Referring now to FIG. 16 and the subsequent figures, examples of the present invention will be described, but the present invention should not be understood as being limited to these examples, and various modifications may be made without changing the gist of the invention recited in claims.

Production of Samples No. 01 to No. 18 shown in FIG. 16 to FIG. 35

These samples are metallic tone print sheets produced based on the embodiments according to FIG. 3 and FIG. 4 described above. Twenty types of metallic reflective layers shown in FIG. 16 to FIG. 35 have been adopted. In each of FIG. 16 to FIG. 35, the black portion indicates a metal foil of a metallic reflective layer, and the white portion indicates a transmission portion not provided with a metal foil of the metallic reflective layer.

In addition, although not illustrated, Sample No. 18 in which a metallic reflective layer was provided on the entire surface of the metallic tone print sheet was prepared as Comparative Example. This sample No. 18 is not provided with a minute region, and when it is expressed in accordance with the figures of FIG. 16 to FIG. 35, the entire surface is expressed in black.

The width of each of the samples shown in FIG. 16 to FIG. 35 is about 100 mm. These metallic reflective layers were each formed by transferring a metallic foil by a transfer foil method, and the thickness was about 0.04 mm.

Tests of Samples No. 01 to No. 18

Twenty one types of samples of Sample No. 01 to Sample No. 18 were tested for the field shielding (dB) in a band of 1 MHz to 1 GHz by a KEC-method. The KEC method is a method for measuring an electric field shielding property developed by Kansai Electronic Industry Development Center of Japan, and the measurements were made by the following devices installed in Osaka Prefectural National Institute of Advanced Industrial Science and Technology.

Equipment Used

Spectrum Analyzer R3361C (manufactured by Advantest Corporation)
RF preamplifier MH-648A (manufactured by Anritsu Corporation)
Shielding-effect measurement jig MA8602B (manufactured by Anritsu Co., Ltd.)

The test method was performed by an electromagnetic wave (electric field and magnetic field) shielding factor measurement in the vicinity field using a KEC method. The reception voltage Vo in the absence of a sample and the reception voltage V in the presence of a sample were measured, and the electromagnetic wave shielding ratio was obtained by the following expression.

Expression: Electromagnetic wave shielding factor (dB) =20log (Vo/V)

Test Results

Tables 1 to 3 show electromagnetic wave shielding ratios (dB) in a band of 1 MHz to 1 GHz by the KEC method obtained by the above-described Expression for 21 types of samples of Sample No. 01 to Sample No. 18.

For Sample No. 01 to Sample No. 17, it was confirmed that the electromagnetic wave shielding ratio (dB) was lowered at the respective frequencies than that of Sample No. 18. It is noted that the higher the electromagnetic wave shielding factor (dB), the worse the radio wave permeability is. Therefore, it was confirmed that the radio wave permeability of Sample No. 01 to Sample No. 17 was improved as compared with that of Sample No. 18.

It was confirmed that Sample No. 01 to Sample No. 10, Sample No. 11b, Sample No. 12b and Sample No. 13b, which were equipped with the seal-island structure, were better in transmittance of radio waves as compared with Sample No. 11a, Sample No. 12a, Sample No. 13a, and Sample No. 14 to Sample No. 17, which were not equipped with the sea-island structure.

In particular, it was confirmed that Sample No. 01 to Sample No. 10 and Sample No. 11a had electromagnetic wave shielding factor (dB) of 1 (dB) or less and were extremely transparent to radio waves.

Each of Sample No. 11b, Sample No. 12b, and Sample No. 13b was provided with a sea-island structure by providing a plurality of linear transmission portions for each of Sample No. 11a, Sample No. 12a, and Sample No. 13a, which were not equipped with a sea-island structure. It was confirmed that the electromagnetic wave shielding factor (dB) was lowered by providing a sea-island structure and that the permeability of the radio wave was improved.

Among those equipped with the sea-island structure, it was appropriate that the average length of the island-like portion was 20 mm or less and that the average length of the island-like portion was preferably 10 mm or less, as confirmed by Sample No. 01 to Sample No. 10 and Sample No. 11b.

However, even if a sea-island structure provided with an island-like portion having a length exceeding 20 mm is provided, it was confirmed by Sample No. 10 that it was possible to attain the electric field shielding of 1 (dB) or less and high permeability of radio waves.

TABLE 1

| | FIG. No. | | | | | | | |
|---|---|---|---|---|---|---|---|---|
| | 16 | 17 | 18 | 19 | 20 | 21 | 22 | 23 |
| | Sample No. | | | | | | | |
| Frequency (MHz) | 1 (dB) | 2 (dB) | 3 (dB) | 4 (dB) | 5 (dB) | 6 (dB) | 7 (dB) | 8 (dB) |
| 1 | −0.8 | −0.7 | −0.7 | −0.7 | −0.5 | −0.4 | −0.4 | −0.2 |
| 1.5 | −0.7 | −0.7 | −0.6 | −0.6 | −0.4 | −0.4 | −0.4 | −0.2 |
| 2 | −0.7 | −0.7 | −0.6 | −0.6 | −0.4 | −0.4 | −0.4 | −0.1 |
| 3 | −0.8 | −0.8 | −0.7 | −0.7 | −0.5 | −0.5 | −0.5 | −0.2 |
| 5 | −0.8 | −0.8 | −0.7 | −0.7 | −0.5 | −0.5 | −0.5 | −0.2 |
| 7.5 | −0.8 | −0.8 | −0.7 | −0.7 | −0.5 | −0.5 | −0.5 | −0.2 |
| 10 | −0.9 | −0.9 | −0.9 | −0.8 | −0.6 | −0.6 | −0.6 | −0.3 |
| 15 | −1.0 | −1.0 | −0.9 | −0.9 | −0.7 | −0.7 | −0.7 | −0.4 |
| 20 | −1.0 | −1.0 | −0.9 | −0.9 | −0.7 | −0.7 | −0.7 | −0.4 |
| 30 | −1.0 | −1.0 | −0.9 | −0.9 | −0.7 | −0.7 | −0.7 | −0.4 |
| 50 | −1.0 | −0.9 | −0.9 | −0.8 | −0.7 | −0.7 | −0.7 | −0.4 |
| 75 | −0.9 | −0.9 | −0.9 | −0.8 | −0.7 | −0.6 | −0.6 | −0.4 |
| 100 | −1.0 | −1.0 | −0.9 | −0.9 | −0.7 | −0.7 | −0.7 | −0.4 |
| 150 | −0.9 | −0.9 | −0.8 | −0.8 | −0.6 | −0.6 | −0.6 | −0.3 |
| 200 | −0.9 | −0.9 | −0.9 | −0.8 | −0.7 | −0.7 | −0.7 | −0.4 |
| 300 | −0.9 | −0.9 | −0.8 | −0.8 | −0.6 | −0.6 | −0.6 | −0.3 |
| 500 | −0.8 | −0.7 | −0.8 | −0.7 | −0.6 | −0.6 | −0.5 | −0.4 |
| 750 | −0.7 | −0.6 | −0.7 | −0.5 | −0.6 | −0.6 | −0.5 | −0.3 |
| 1000 | −0.5 | −0.5 | −0.5 | −0.4 | −0.5 | −0.3 | −0.4 | −0.3 |

TABLE 2

| | FIG. No. | | | | | | | |
|---|---|---|---|---|---|---|---|---|
| | 24 | 25 | 26 | 27 | 28 | 29 | 30 | 31 |
| | Sample No. | | | | | | | |
| Frequency (MHz) | 9 (dB) | 10 (dB) | 11a (dB) | 11b (dB) | 12a (dB) | 12b (dB) | 13a (dB) | 13b (dB) |
| 1 | −0.0 | 0.0 | 12.9 | 0.1 | 16.2 | 2.8 | 20.9 | 12.4 |
| 1.5 | −0.0 | 0.0 | 12.9 | 0.1 | 16.2 | 2.8 | 20.9 | 12.3 |
| 2 | −0.0 | 0.0 | 12.9 | 0.1 | 16.1 | 2.7 | 20.9 | 12.4 |
| 3 | −0.1 | −0.0 | 12.8 | 0.1 | 16.1 | 2.8 | 20.9 | 12.3 |
| 5 | −0.1 | −0.1 | 12.5 | 0.0 | 15.8 | 2.4 | 20.5 | 11.9 |
| 7.5 | −0.2 | −0.1 | 12.3 | 0.0 | 15.6 | 2.6 | 20.4 | 11.8 |
| 10 | −0.2 | −0.2 | 12.4 | −0.1 | 15.6 | 2.5 | 20.4 | 11.8 |
| 15 | −0.3 | −0.3 | 12.6 | −0.2 | 15.9 | 2.5 | 20.6 | 12.0 |
| 20 | −0.3 | −0.2 | 12.6 | −0.2 | 15.9 | 2.4 | 20.6 | 12.0 |
| 30 | −0.3 | −0.3 | 12.6 | −0.2 | 15.8 | 2.5 | 20.6 | 12.0 |
| 50 | −0.3 | −0.2 | 12.4 | −0.2 | 15.7 | 2.2 | 20.3 | 11.8 |
| 75 | −0.3 | −0.2 | 12.3 | −0.2 | 15.7 | 2.4 | 20.4 | 11.7 |
| 100 | −0.3 | −0.2 | 12.5 | −0.2 | 15.9 | 2.4 | 20.5 | 11.9 |
| 150 | −0.2 | −0.2 | 12.9 | −0.2 | 16.6 | 2.4 | 21.1 | 12.4 |
| 200 | −0.3 | −0.2 | 12.9 | −0.2 | 17.1 | 2.3 | 22.0 | 12.7 |
| 300 | −0.2 | −0.1 | 13.3 | −0.1 | 14.3 | 2.5 | 23.7 | 13.7 |
| 500 | −0.2 | 0.0 | 10.1 | 0.0 | 17.1 | 3.0 | 27.4 | 19.9 |
| 750 | −0.2 | 0.4 | 8.0 | 0.3 | 17.6 | 4.0 | 16.4 | 11.5 |
| 1000 | −0.2 | 0.7 | 5.8 | 0.5 | 10.3 | 4.9 | 8.4 | 4.7 |

TABLE 3

| Sample No. | 32 | 33 | 34 | 35 | 36 |
|---|---|---|---|---|---|
| Frequency (MHz) | 14 (dB) | 15 (dB) | 16 (dB) | 17 (dB) | 18 (dB) |
| 1 | 25.0 | 16.5 | 19.2 | 34.2 | 35.8 |
| 1.5 | 25.0 | 16.5 | 19.2 | 34.2 | 35.8 |
| 2 | 24.9 | 16.4 | 19.2 | 34.1 | 35.8 |
| 3 | 24.9 | 16.3 | 19.0 | 34.1 | 35.9 |
| 5 | 24.5 | 16.0 | 18.8 | 33.7 | 35.6 |
| 7.5 | 24.2 | 15.8 | 18.7 | 33.6 | 35.5 |
| 10 | 24.2 | 15.8 | 18.6 | 33.6 | 35.5 |
| 15 | 24.3 | 16.1 | 18.9 | 33.9 | 35.8 |
| 20 | 24.0 | 16.0 | 18.9 | 33.8 | 35.7 |
| 30 | 23.7 | 16.0 | 18.8 | 33.8 | 35.7 |
| 50 | 22.9 | 15.9 | 18.5 | 33.4 | 35.6 |
| 75 | 22.2 | 15.9 | 18.4 | 33.2 | 35.5 |
| 100 | 21.8 | 16.0 | 18.2 | 33.1 | 35.4 |
| 150 | 21.0 | 16.7 | 17.8 | 32.6 | 35.0 |
| 200 | 20.1 | 16.8 | 16.9 | 31.8 | 34.3 |
| 300 | 19.5 | 14.6 | 15.2 | 32.4 | 33.8 |
| 500 | 17.4 | 18.6 | 12.9 | 30.8 | 33.5 |
| 750 | 16.1 | 16.8 | 9.7 | 31.8 | 33.9 |
| 1000 | 14.1 | 9.5 | 5.7 | 30.3 | 31.6 |

Example of Samples No. A1 to No. E3

Samples No. A1 to No. E3 shown in FIG. 36 to FIG. 42 are metallic tone print sheets produced according to the embodiments of FIG. 3 and FIG. 4 described above, in the same manner as in the examples previously shown. Twenty seven types of metallic reflective layers, shown in FIG. 36 to FIG. 42, were used. In each of FIG. 36 to FIG. 42, the black portion indicates a metal foil of the metallic reflective layer, and the white portion indicates a transmission portion not provided with a metal foil of the metallic reflective layer. These metallic reflective layers were formed by transferring a metallic foil by a transfer foil method and have a thickness of about 0.04 μm.

Tests of Samples No. A1 to No. E3

These 27 samples were tested for electric field shielding (dB) in a band of 1 MHz to 1 GHz by the KEC-method in the same manner as in the previous example. The KEC method is a method of measuring an electric field shielding property developed by Kansai Electronic Industry Development Center in Japan and was measured using the following devices installed in Osaka Prefectural National Institute of Advanced Industrial Science and Technology.

Test Results

Tables 4 to 10 show the electromagnetic wave shielding factors (dB) in a band of 1 MHz to 1 GHz obtained by the KEC method in the same manner as in the previous example for these 27 types of samples.

Figure 36:
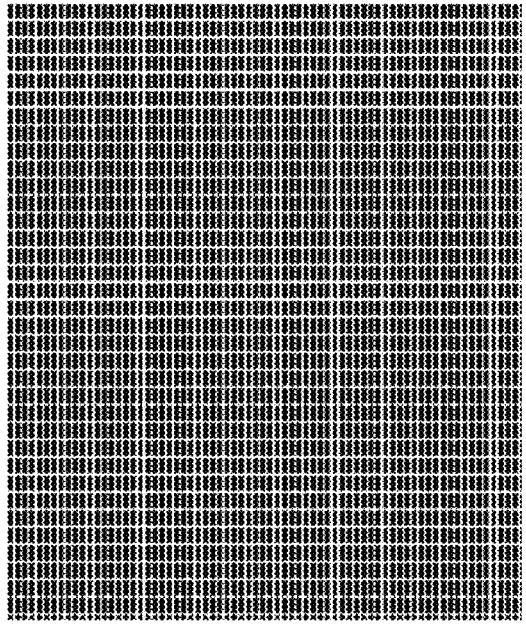
FIG. 36 is an enlarged plan view of a metallic reflective layer of Sample Nos. A1, A2, A3, and A4 according to examples of the present invention.
Figure 36:
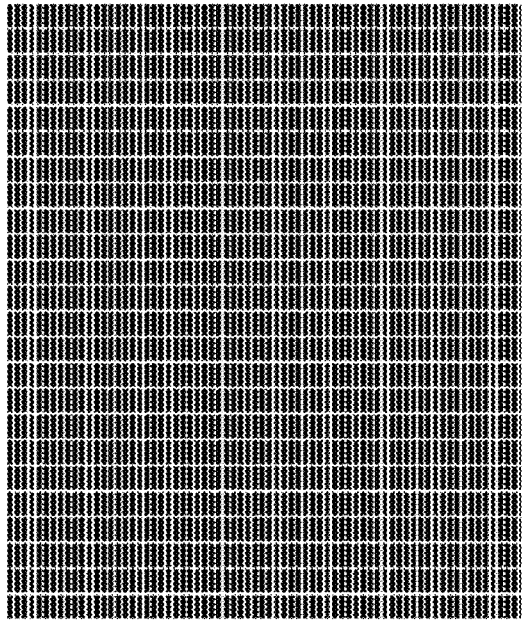
Figure 36:
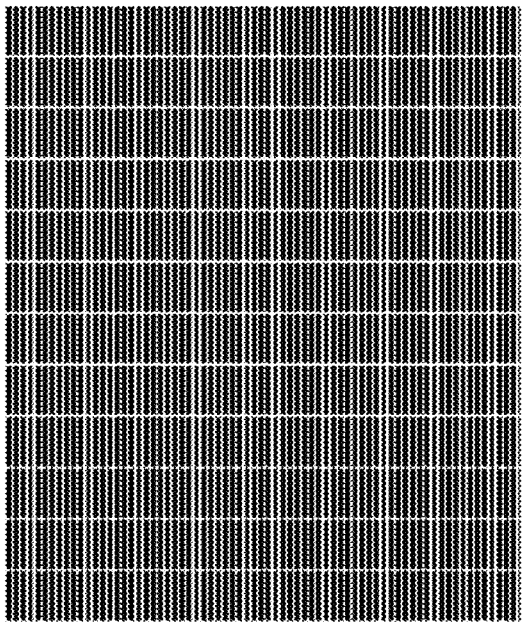
Figure 36:
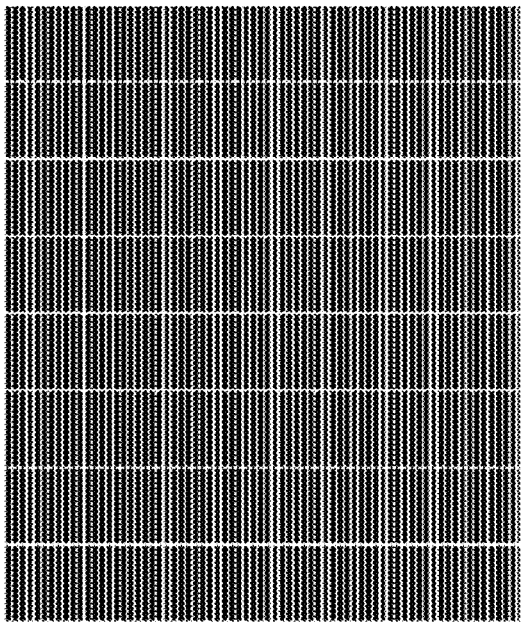

Samples No. A1 to No. A4: FIG. 36, Table 4

In Sample No. A1, the black portion (metallic foil of the metallic reflective layer, hereinafter the same) was obtained by arranging vertical stripes having a width of 1 mm at intervals of the white portion (transmission portion, hereinafter the same) having a width of 0.4 mm, while the white portions of the horizontal lines having a width of 0.4 mm were arranged such that the vertical length of the black portion was 3 mm.

Therefore, in Sample No. A1, the black portion, which was one island-like portion, had a rectangular shape having a width of 1 mm and a longitudinal length of 3 mm, and the distance (width of white portion) between the black portions adjacent to each other in the longitudinal and lateral directions was 0.4 mm.

In Sample No. A2, the black portion, which was one island-like portion, had a rectangular shape having a width of 1 mm and a length of 4.6 mm and a distance (width of white portion) between adjacent black portions in the vertical and horizontal directions was 0.4 mm.

In Sample No. A3, the black portion, which was one island-like portion, had a rectangular shape having a width of 1 mm and a longitudinal length of 9.6 mm, and the distance (width of the white portion) between adjacent black portions in the longitudinal and lateral directions was 0.4 mm.

In Sample No. A4, the black portion, which was one island-like portion, had a rectangular shape having a width of 1 mm, and a longitudinal length of 14.6 mm and the distance (width of white portion) between adjacent black portions in the longitudinal and lateral directions was 0.4 mm.

From the results of Table 4, it was clarified that even if the distance (width of the white portion) between adjacent black portions in the vertical and horizontal directions was 0.4 mm or less, which was 1 mm or less, good radio wave permeability was exhibited. Further, it has been shown that the vertical length of the black portion is most preferably 1 cm or less but may be more than 1 cm.

TABLE 4

| (MHz) | (dB) |
|---|---|
| A1 | |
| 0.1 | 0.3 |
| 0.15 | 0.2 |
| 0.2 | 0.2 |
| 0.3 | 0.3 |
| 0.5 | 0.2 |
| 0.75 | 0.2 |
| 1 | 0.2 |
| 1.5 | 0.2 |
| 2 | 0.2 |
| 3 | 0.1 |
| 5 | 0.2 |
| 7.5 | 0.1 |
| 10 | 0.1 |
| 15 | 0.2 |
| 20 | 0.1 |
| 30 | 0.1 |
| 50 | 0.2 |
| 75 | 0.2 |
| 100 | 0.2 |
| 150 | 0.2 |
| 200 | 0.2 |
| 300 | 0.2 |
| 500 | 0.2 |
| 750 | 0.2 |
| 1000 | 0.3 |
| A2 | |
| 0.1 | 0.3 |
| 0.15 | 0.3 |
| 0.2 | 0.3 |
| 0.3 | 0.4 |
| 0.5 | 0.3 |
| 0.75 | 0.3 |
| 1 | 0.4 |
| 1.5 | 0.3 |
| 2 | 0.3 |
| 3 | 0.3 |

TABLE 4-continued

| (MHz) | (dB) |
|---|---|
| 5 | 0.3 |
| 7.5 | 0.3 |
| 10 | 0.3 |
| 15 | 0.3 |
| 20 | 0.3 |
| 30 | 0.3 |
| 50 | 0.3 |
| 75 | 0.3 |
| 100 | 0.3 |
| 150 | 0.3 |
| 200 | 0.3 |
| 300 | 0.3 |
| 500 | 0.3 |
| 750 | 0.3 |
| 1000 | 0.4 |
| A3 | |
| 0.1 | 0.7 |
| 0.15 | 0.6 |
| 0.2 | 0.6 |
| 0.3 | 0.7 |
| 0.5 | 0.6 |
| 0.75 | 0.6 |
| 1 | 0.6 |
| 1.5 | 0.6 |
| 2 | 0.6 |
| 3 | 0.6 |
| 5 | 0.5 |
| 7.5 | 0.5 |
| 10 | 0.5 |
| 15 | 0.5 |
| 20 | 0.6 |
| 30 | 0.5 |
| 50 | 0.5 |
| 75 | 0.5 |
| 100 | 0.5 |
| 150 | 0.6 |
| 200 | 0.5 |
| 300 | 0.5 |
| 500 | 0.6 |
| 750 | 0.7 |
| 1000 | 0.8 |
| A4 | |
| 0.1 | 0.9 |
| 0.15 | 0.9 |
| 0.2 | 0.9 |
| 0.3 | 1.0 |
| 0.5 | 0.8 |
| 0.75 | 0.9 |
| 1 | 0.9 |
| 1.5 | 0.8 |
| 2 | 0.8 |
| 3 | 0.8 |
| 5 | 0.7 |
| 7.5 | 0.8 |
| 10 | 0.8 |
| 15 | 0.8 |
| 20 | 0.8 |
| 30 | 0.8 |
| 50 | 0.8 |
| 75 | 0.8 |
| 100 | 0.8 |
| 150 | 0.8 |
| 200 | 0.8 |
| 300 | 0.8 |
| 500 | 0.9 |
| 750 | 1.1 |
| 1000 | 1.3 |

Figure 37:
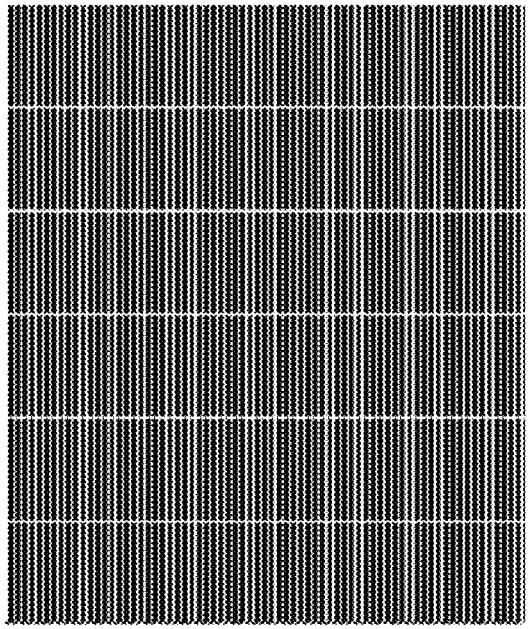
FIG. 37 is an enlarged plan view of a metallic reflective layer of Sample Nos. A5, A6, A7, and A8 according to examples of the present invention.
Figure 37:
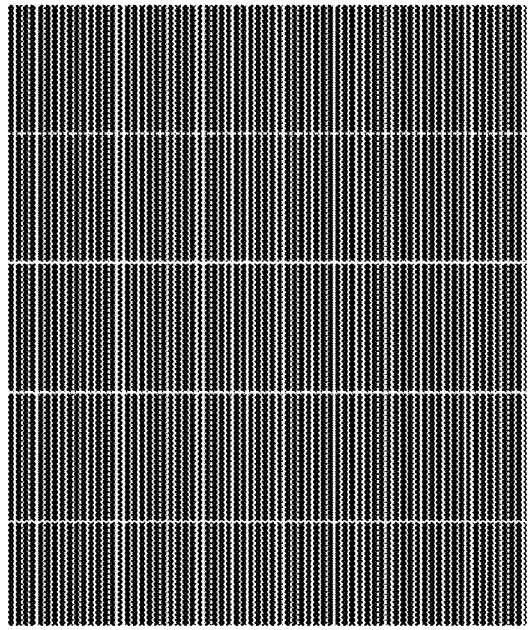
Figure 37:
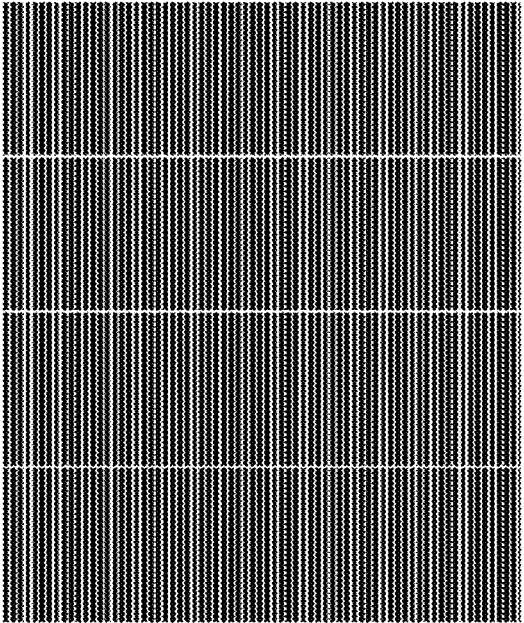
Figure 37:
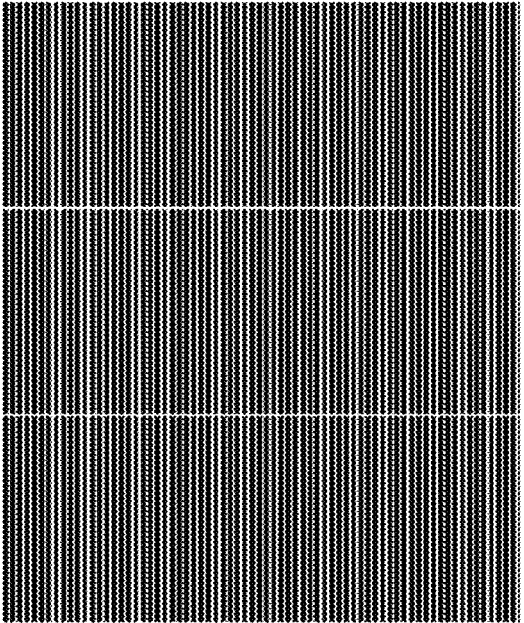

(Samples No. A5 to No. A8: FIG. 37, Table 5)

Samples No. A5 to No. A8 also show the sequence patterns similar to those of the previous Samples No. A1 to No. A4.

In Sample No. A5, the black portion, which was one island-like portion, had a rectangular shape having a width of 1 mm and a longitudinal length of 14.6 mm, and the distance (the width of the white portion) between adjacent black portions in the longitudinal and lateral directions is 0.4 mm.

In Sample No. A6, the black portion, which was one island-like portion, had a rectangular shape having a width of 1 mm and a longitudinal length of 24.6 mm, and the distance (the width of the white portion) between adjacent black portions in the longitudinal and lateral directions was 0.4 mm.

In Sample No. A7, the black portion, which was one island-like portion, had a rectangular having a width of 1 mm and a longitudinal length of 29.6 mm, and the distance (the width of the white portion) between black portions adjacent to each other in the longitudinal and lateral directions was 0.4 mm.

In Sample No. A8, the black portion, which was one island-like portion, had a rectangular having a width of 1 mm and a length of 39.6 mm, and the distance (the width of the white portion) between black portions adjacent to each other in the vertical and horizontal directions was 0.4 mm.

From the results of Table 5, it was shown that the vertical length of the black portion, which was one island-like portion, is preferably shorter, and its vertical length is most preferably 3 cm or less, but even if it exceeds 3 cm, the radio wave permeability is improved.

TABLE 5

| (MHz) | (dB) |
|---|---|
| A5 | |
| 0.1 | 1.4 |
| 0.15 | 1.2 |
| 0.2 | 1.2 |
| 0.3 | 1.3 |
| 0.5 | 1.2 |
| 0.75 | 1.3 |
| 1 | 1.3 |
| 1.5 | 1.2 |
| 2 | 1.2 |
| 3 | 1.3 |
| 5 | 1.1 |
| 7.5 | 1.1 |
| 10 | 1.2 |
| 15 | 1.2 |
| 20 | 1.1 |
| 30 | 1.2 |
| 50 | 1.1 |
| 75 | 1.1 |
| 100 | 1.1 |
| 150 | 1.2 |
| 200 | 1.1 |
| 300 | 1.1 |
| 500 | 1.3 |
| 750 | 1.7 |
| 1000 | 2.5 |
| A6 | |
| 0.1 | 1.3 |
| 0.15 | 1.2 |
| 0.2 | 1.2 |
| 0.3 | 1.3 |
| 0.5 | 1.2 |
| 0.75 | 1.3 |
| 1 | 1.3 |
| 1.5 | 1.2 |
| 2 | 1.2 |
| 3 | 1.2 |
| 5 | 1.1 |
| 7.5 | 1.1 |
| 10 | 1.2 |

TABLE 5-continued

| (MHz) | (dB) |
|---|---|
| 15 | 1.2 |
| 20 | 1.2 |
| 30 | 1.2 |
| 50 | 1.1 |
| 75 | 1.2 |
| 100 | 1.2 |
| 150 | 1.2 |
| 200 | 1.1 |
| 300 | 1.2 |
| 500 | 1.3 |
| 750 | 1.8 |
| 1000 | 3.1 |
| A7 | |
| 0.1 | 2.7 |
| 0.15 | 2.7 |
| 0.2 | 2.6 |
| 0.3 | 2.8 |
| 0.5 | 2.5 |
| 0.75 | 2.6 |
| 1 | 2.7 |
| 1.5 | 2.6 |
| 2 | 2.6 |
| 3 | 2.7 |
| 5 | 2.3 |
| 7.5 | 2.5 |
| 10 | 2.6 |
| 15 | 2.6 |
| 20 | 2.6 |
| 30 | 2.7 |
| 50 | 2.5 |
| 75 | 2.6 |
| 100 | 2.6 |
| 150 | 2.7 |
| 200 | 2.4 |
| 300 | 2.6 |
| 500 | 3.1 |
| 750 | 4.5 |
| 1000 | 3.6 |
| A8 | |
| 0.1 | 6.1 |
| 0.15 | 6.0 |
| 0.2 | 5.9 |
| 0.3 | 6.0 |
| 0.5 | 5.6 |
| 0.75 | 5.6 |
| 1 | 5.8 |
| 1.5 | 6.0 |
| 2 | 5.8 |
| 3 | 5.9 |
| 5 | 5.6 |
| 7.5 | 5.4 |
| 10 | 5.8 |
| 15 | 5.9 |
| 20 | 5.8 |
| 30 | 6.0 |
| 50 | 5.5 |
| 75 | 5.6 |
| 100 | 5.8 |
| 150 | 6.1 |
| 200 | 5.9 |
| 300 | 5.9 |
| 500 | 7.6 |
| 750 | 11.2 |
| 1000 | 21.9 |

Figure 38:
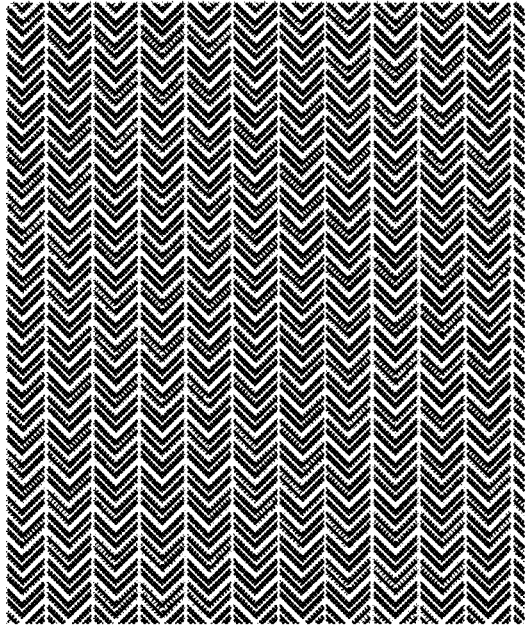
FIG. 38 is an enlarged plan view of a metallic reflective layer of Sample Nos. B1, B2, C1, and C2 according to examples of the present invention.
Figure 38:
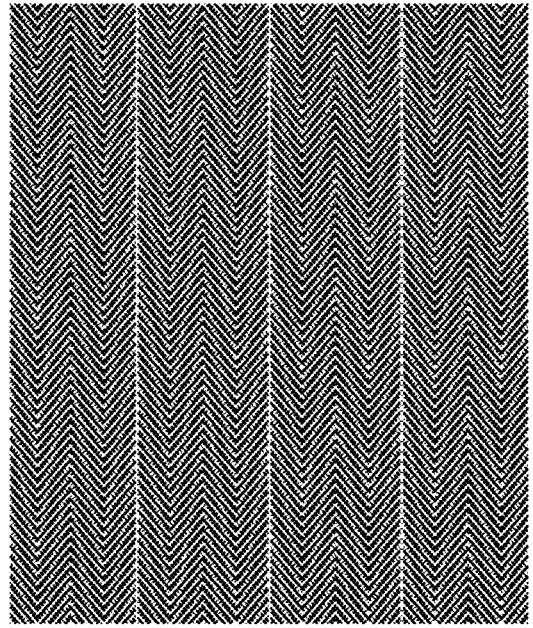
Figure 38:
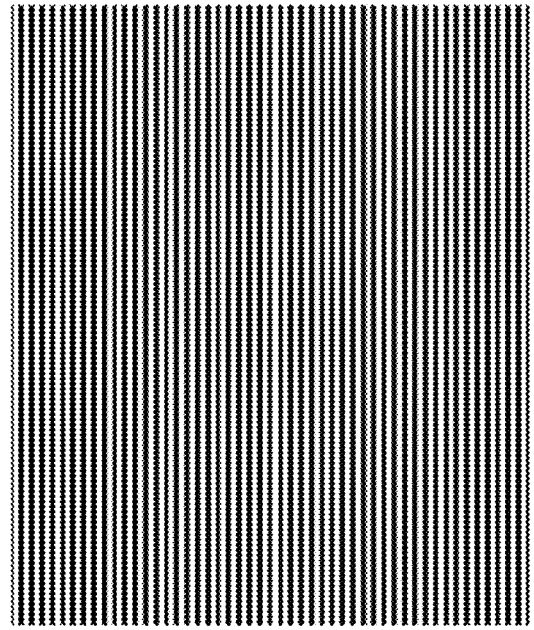
Figure 38:
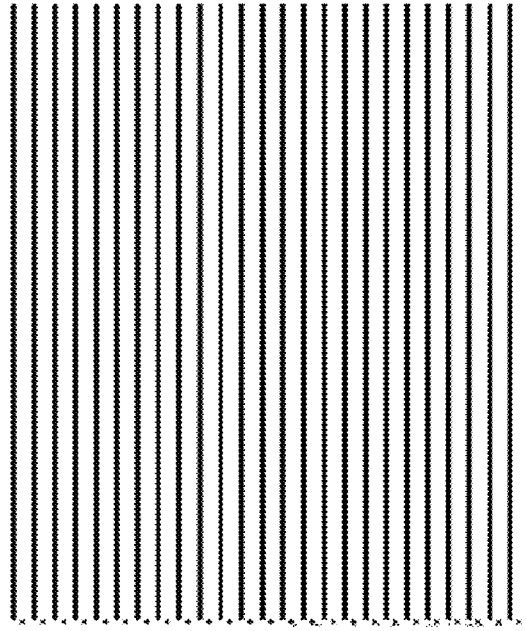

Samples No. B1, No. B2, No. C1, and No. C2: FIG. 38, Table 6)

Figure 26:
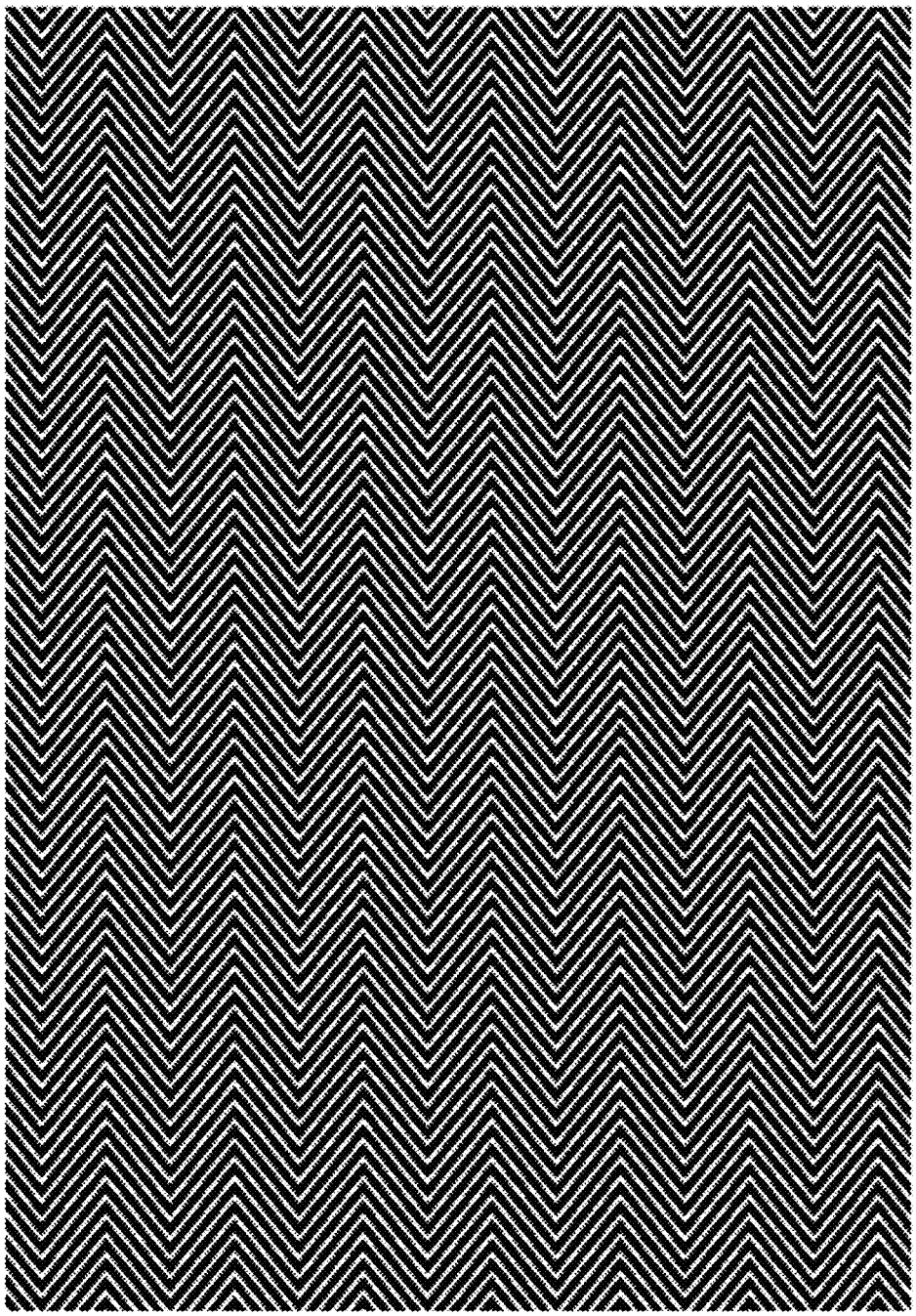
FIG. 26 is an enlarged plan view of a metallic reflective layer of Sample No. 11a according to an example of the present invention.
Figure 27:
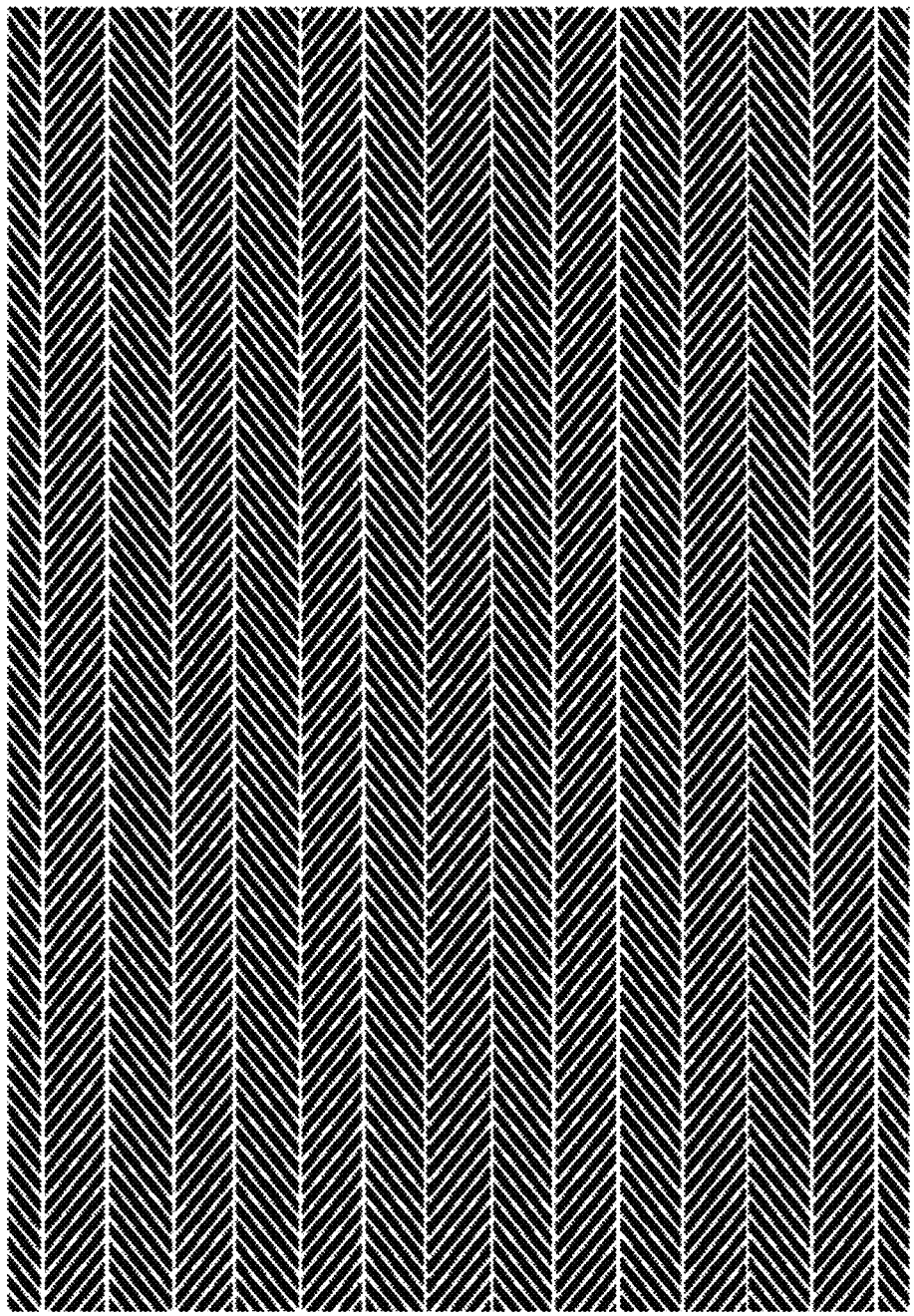
FIG. 27 is an enlarged plan view of a metallic reflective layer of Sample No. 11b according to an example of the present invention.
Figure 28:
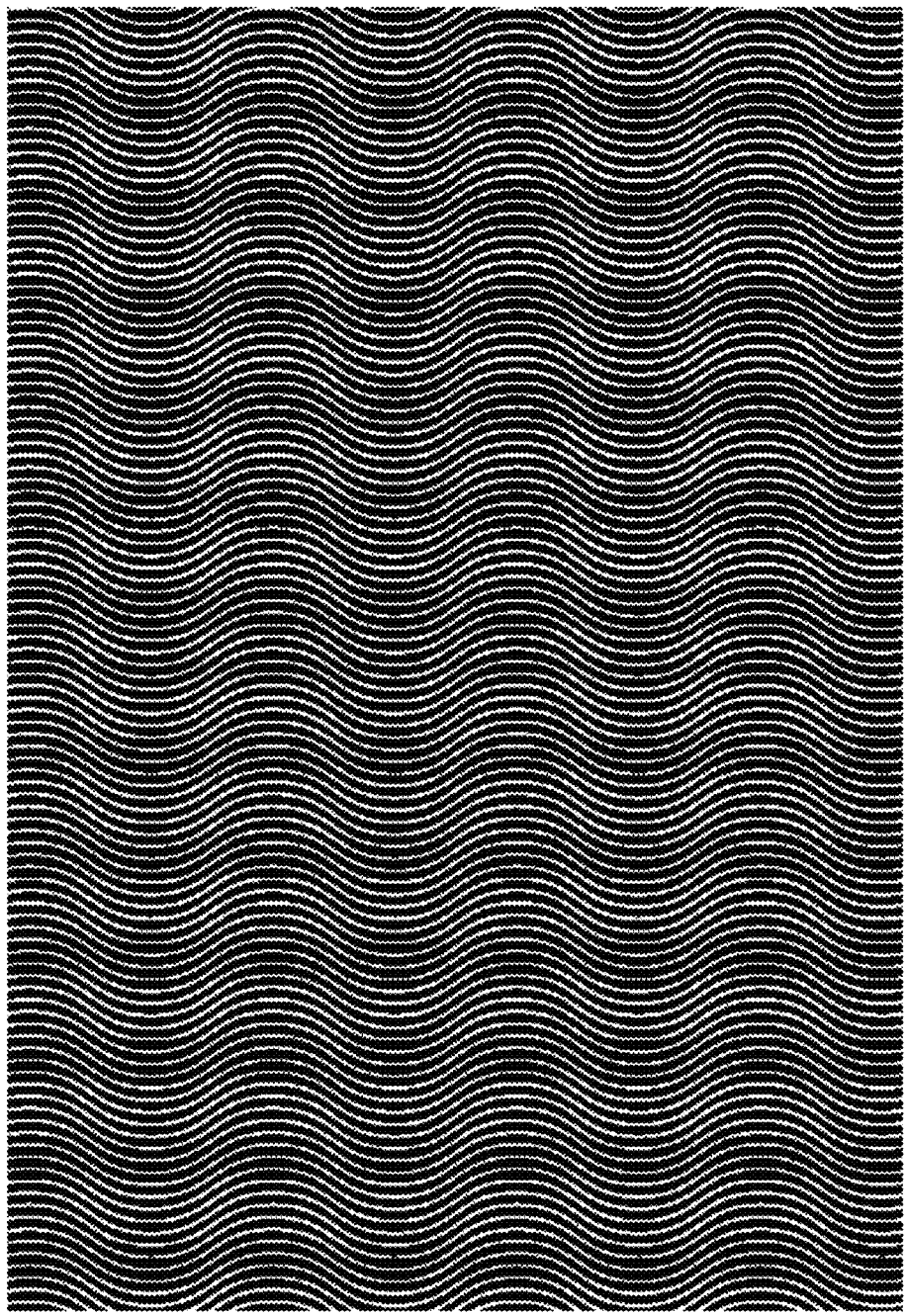
FIG. 28 is an enlarged plan view of a metallic reflective layer of Sample No. 12a according to an example of the present invention.
Figure 29:
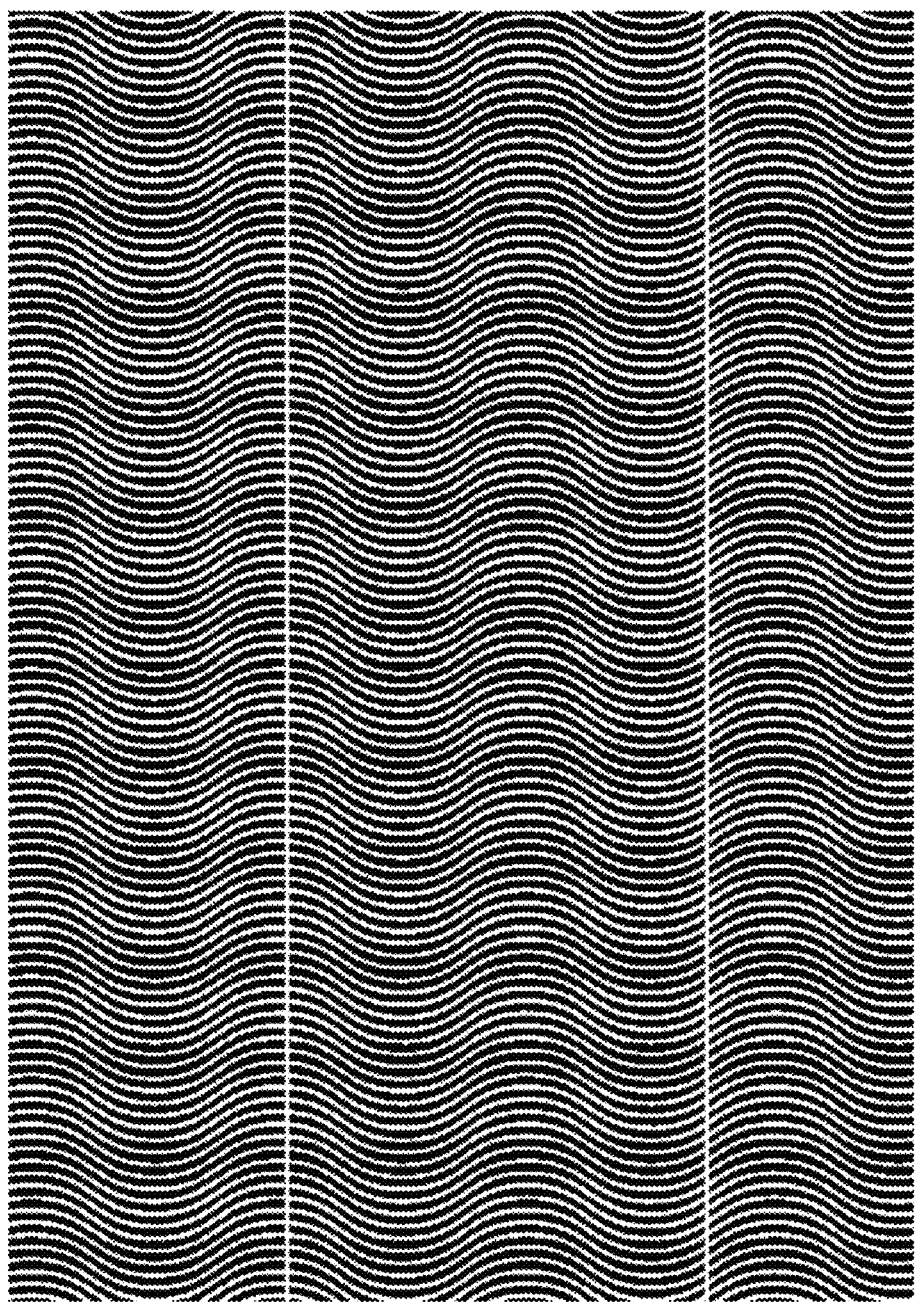
FIG. 29 is an enlarged plan view of a metallic reflective layer of Sample No. 12b according to an example of the present invention.
Figure 30:
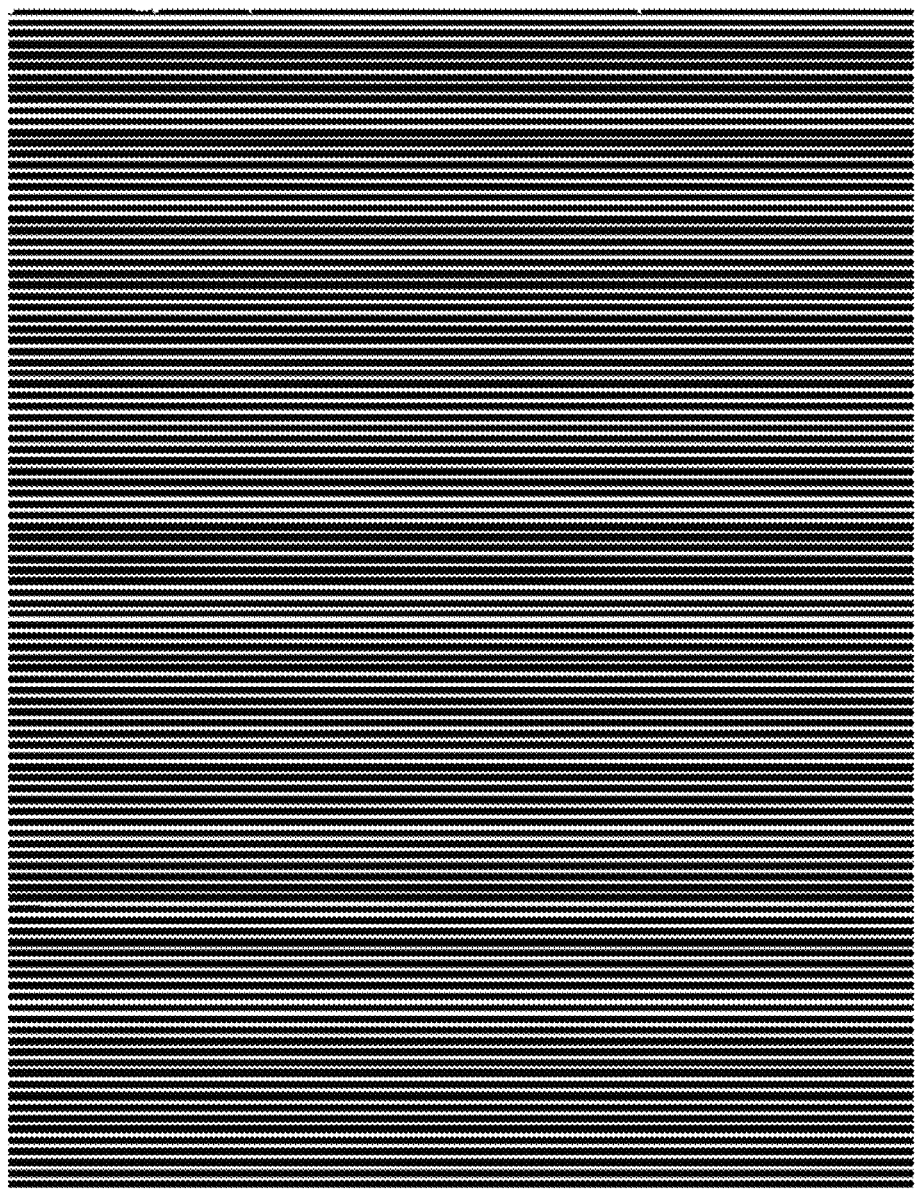
FIG. 30 is an enlarged plan view of a metallic reflective layer of Sample No. 13a according to an example of the present invention.
Figure 31:
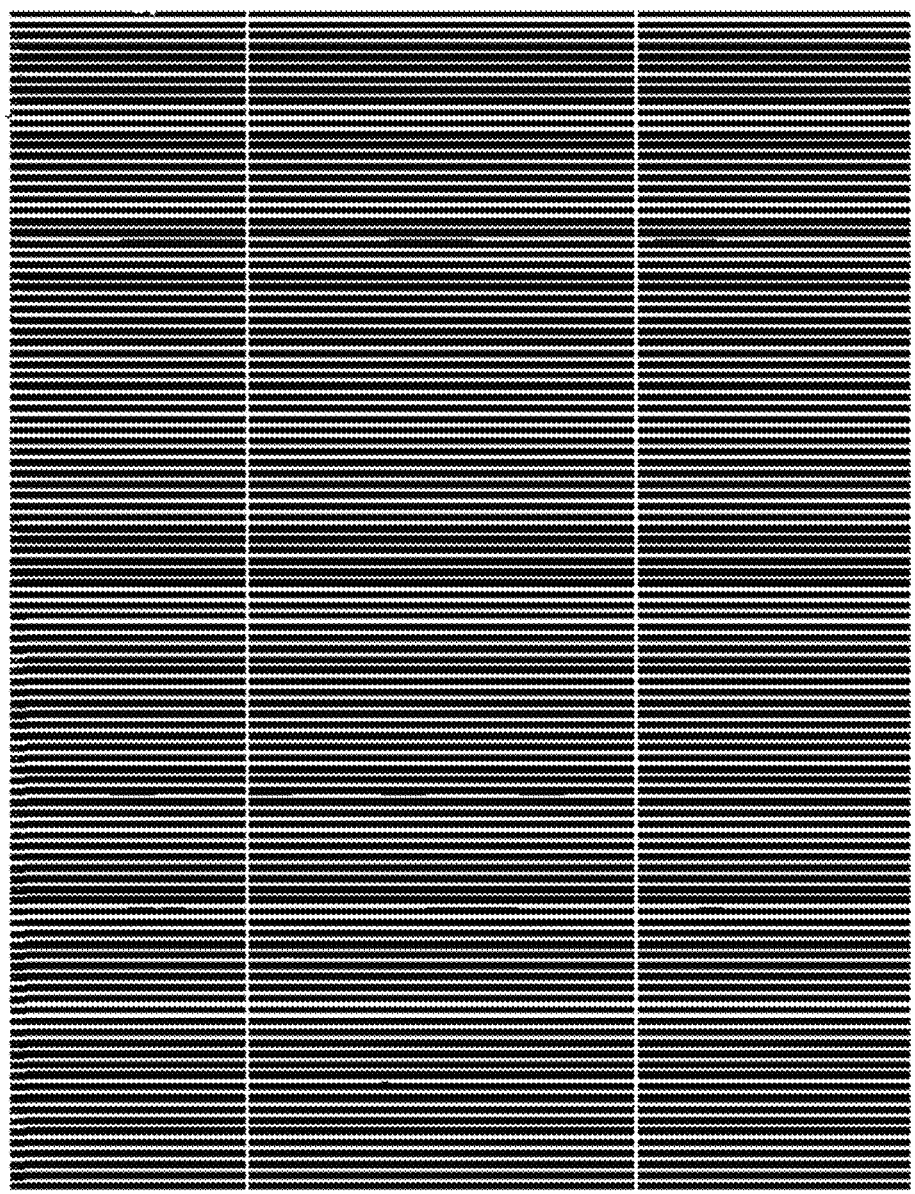
FIG. 31 is an enlarged plan view of a metallic reflective layer of Sample No. 13b according to an example of the present invention.
Figure 32:
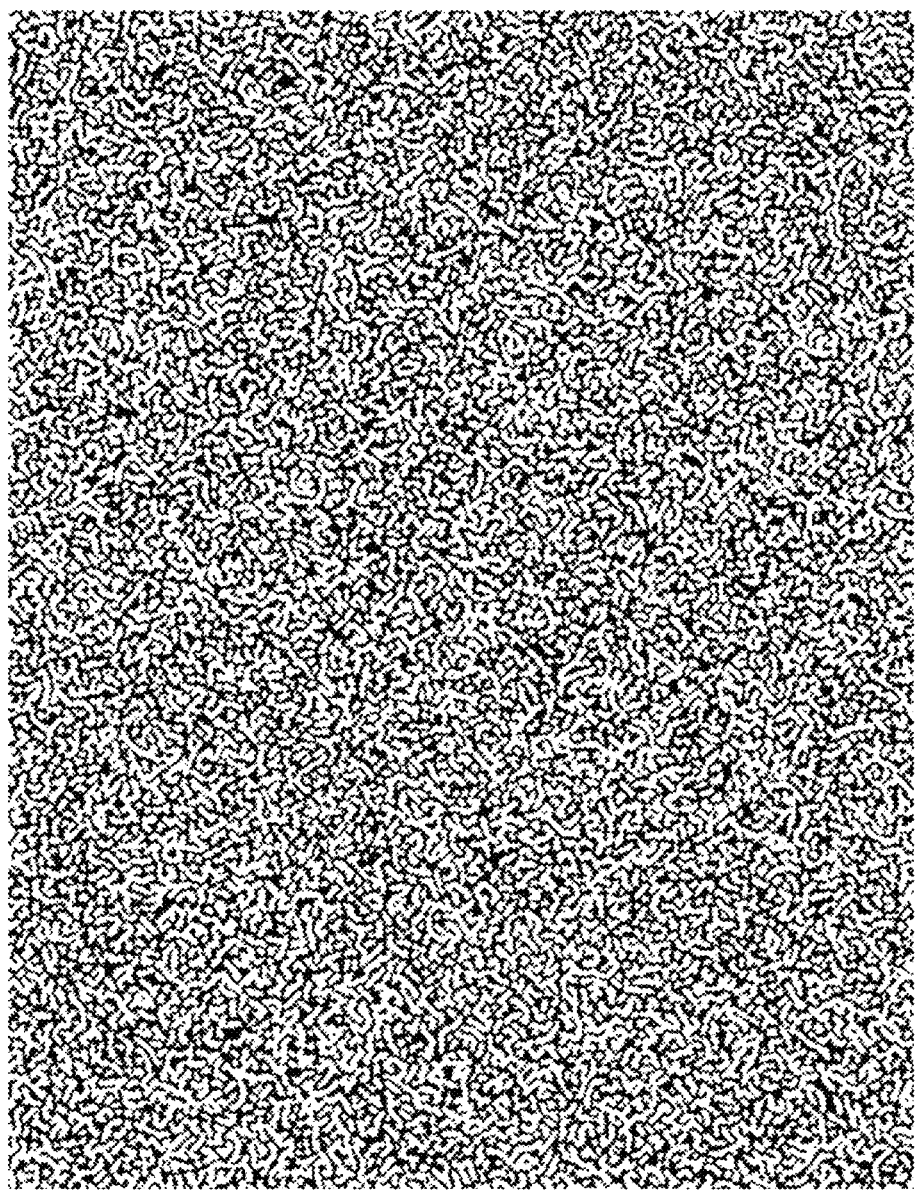
FIG. 32 is an enlarged plan view of a metallic reflective layer of Sample No. 14 according to an example of the present invention.
Figure 33:
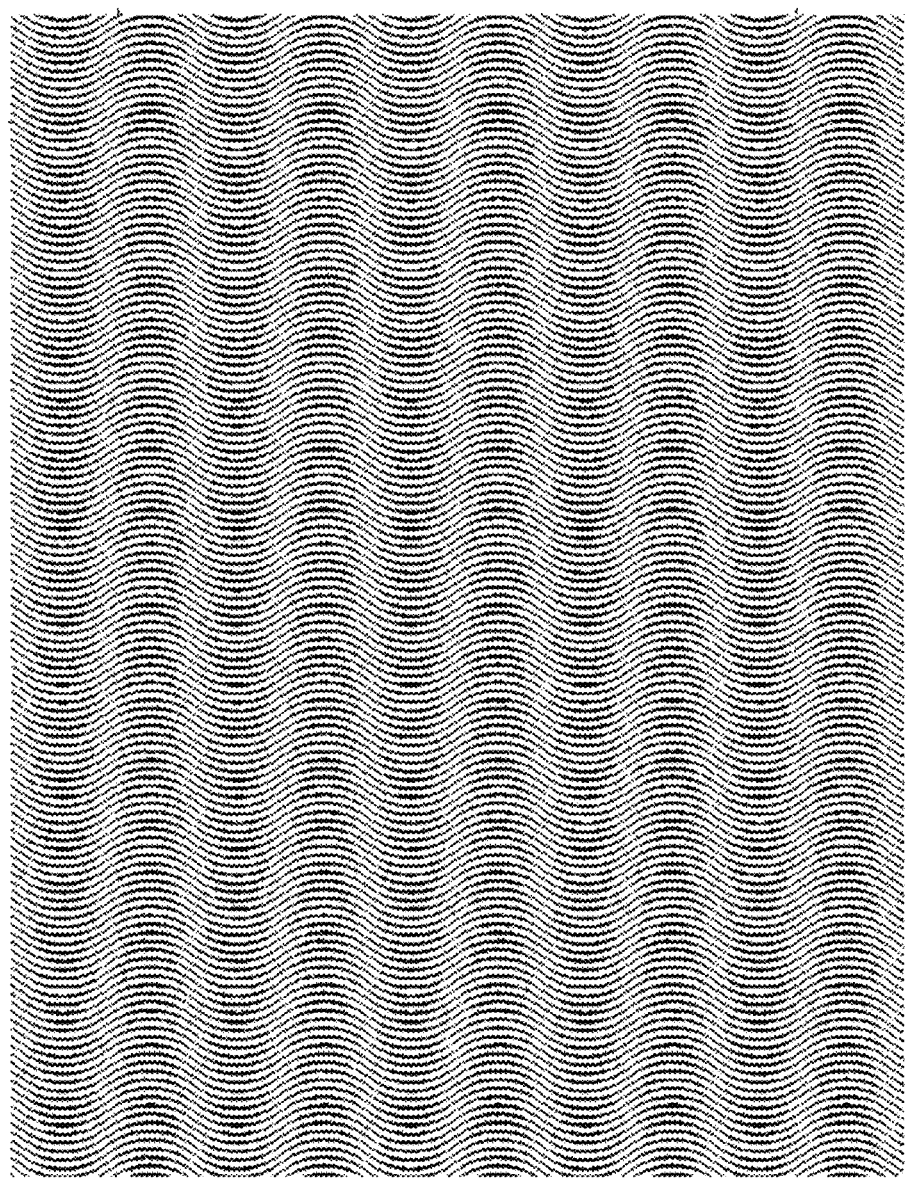
FIG. 33 is an enlarged plan view of a metallic reflective layer of Sample No. 15 according to an example of the present invention.
Figure 34:
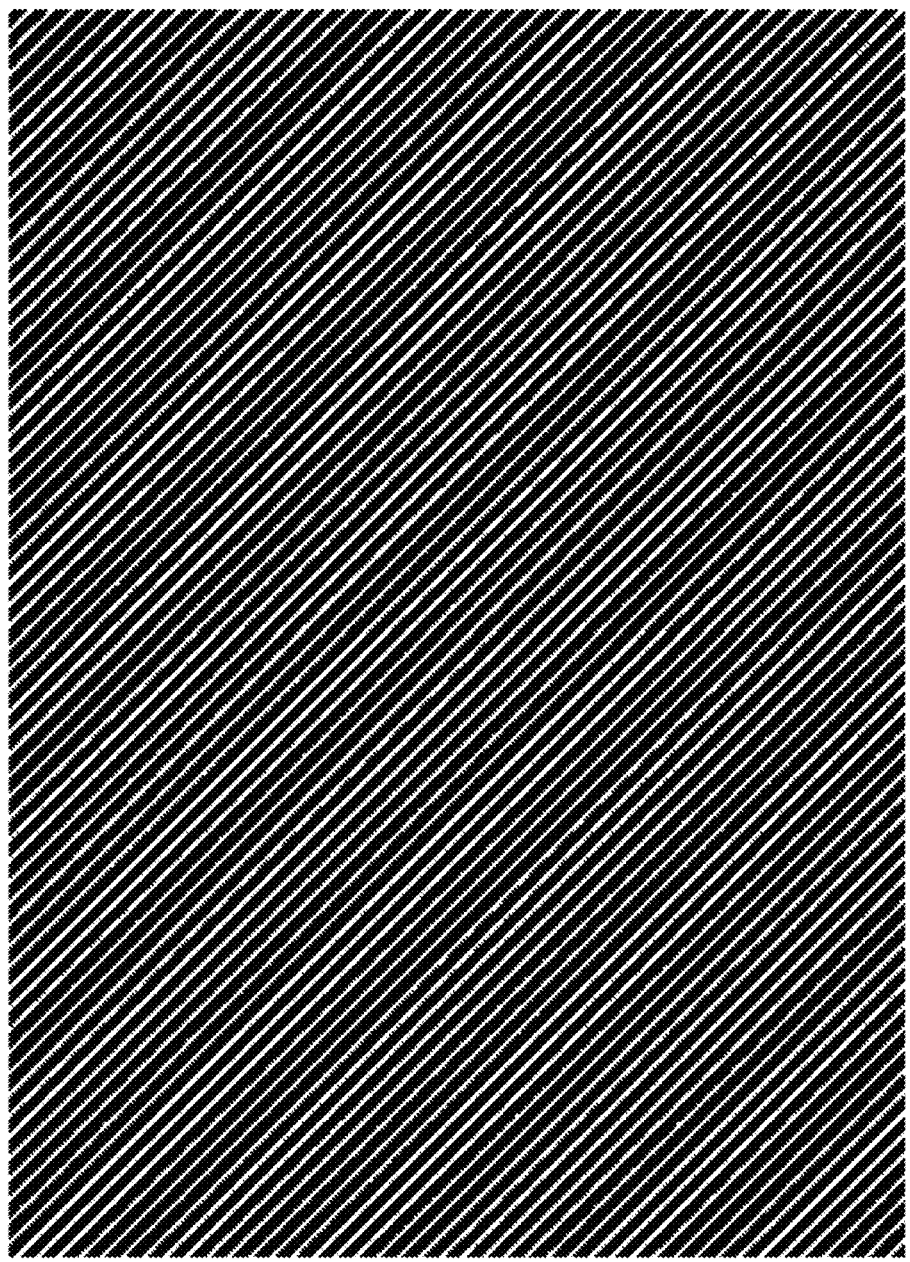
FIG. 34 is an enlarged plan view of a metallic reflective layer of Sample No. 16 according to an example of the present invention.
Figure 35:
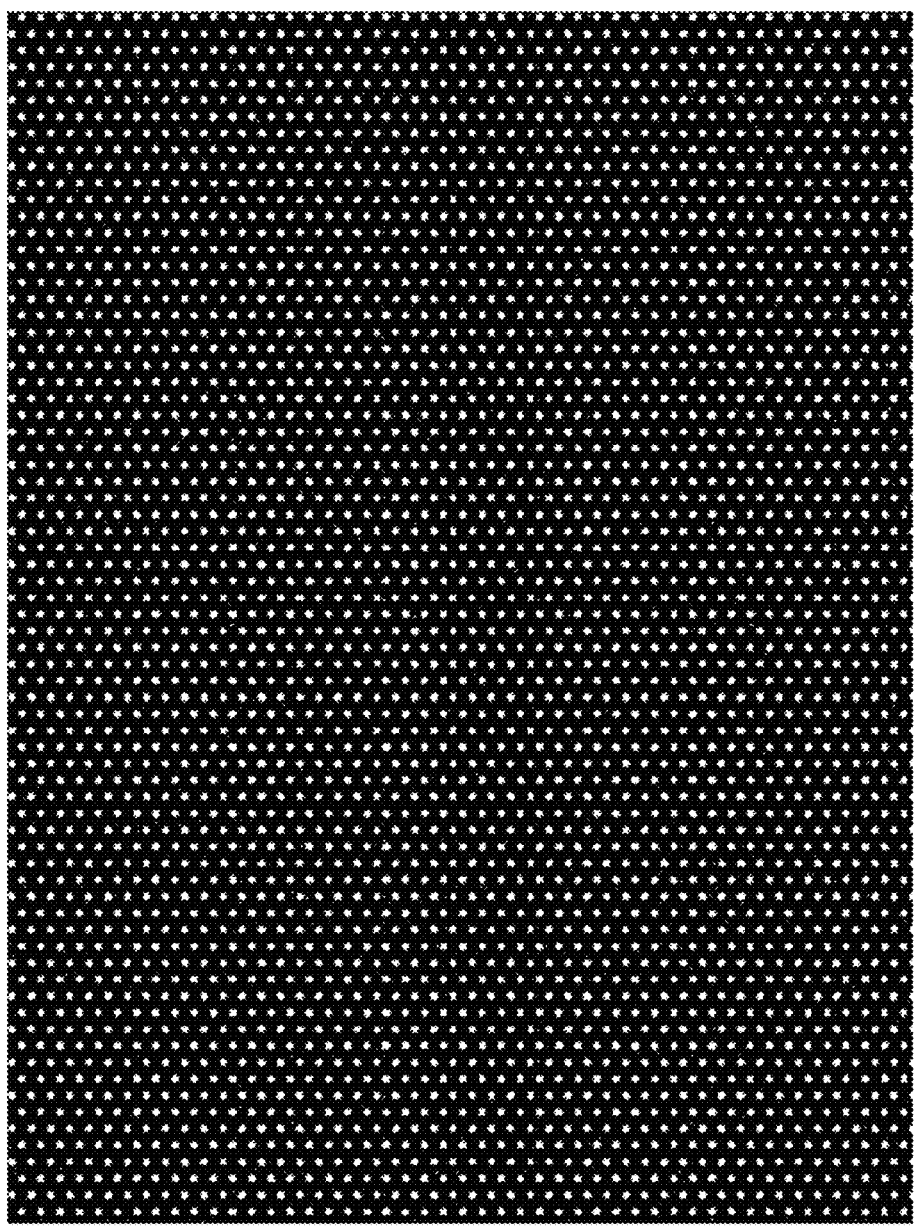
FIG. 35 is an enlarged plan view of a metallic reflective layer of Sample No. 17 according to an example of the present invention.

Sample No. B1 was obtained by increasing or decreasing the number of vertical white portions, for Sample No. 11a of FIG. 26 and Sample No. 11b of FIG. 27.

From the results of Samples No. B1 and No. B2 in Table 6, it was confirmed that the shorter the length of the V-shaped black portion, the better the results.

Sample No. B1 was obtained by arranging V-shaped black portions having a width of 0.9 mm, repeatedly in the vertical direction, and the intervals (white portion widths) between longitudinally adjacent black portions alternately repeat a narrow width of 0.4 mm, a wide width of 0.8 nm, and a large width. The open width of the V-shaped black portion was 9 mm.

Sample No. B1 was obtained by arranging V-shaped black portions having a width of 0.8 mm, repeatedly in the vertical direction, and the distance (width of white portion) between longitudinally adjacent black portions was 0.4 mm. The open width of the V-shaped black portion was 13 mm.

For Samples No. C1 and No. C2, the vertical stripes of 1 mm wide black portion were arranged across a white portion.

Sample No. C1 was striped with a black portion of a width of 1 mm and a white portion of a width of 1 mm.

Sample No. C2 was striped with a black portion of a width of 1 mm and a white portion of a width of 3 mm.

The results of Samples No. C1 and No. C2 in Table 6 show that the radio wave permeability is improved even if it is striped as long as the width of the white portion has an appropriate width such as 3 mm or more, particularly the ratio of the area of the black portion to the entire area is 25% or less.

TABLE 6

| (MHz) | (dB) |
|---|---|
| B1 | |
| 0.1 | 0.9 |
| 0.15 | 0.8 |
| 0.2 | 0.8 |
| 0.3 | 0.9 |
| 0.5 | 0.8 |
| 0.75 | 0.8 |
| 1 | 0.9 |
| 1.5 | 0.8 |
| 2 | 0.8 |
| 3 | 0.8 |
| 5 | 0.7 |
| 7.5 | 0.7 |
| 10 | 0.8 |
| 15 | 0.7 |
| 20 | 0.8 |
| 30 | 0.7 |
| 50 | 0.7 |
| 75 | 0.8 |
| 100 | 0.8 |
| 150 | 0.7 |
| 200 | 0.7 |
| 300 | 0.7 |
| 500 | 0.7 |
| 750 | 0.9 |
| 1000 | 0.9 |
| B2 | |
| 0.1 | 2.7 |
| 0.15 | 2.6 |
| 0.2 | 2.5 |
| 0.3 | 2.7 |
| 0.5 | 2.4 |
| 0.75 | 2.5 |
| 1 | 2.6 |
| 1.5 | 2.5 |
| 2 | 2.4 |
| 3 | 2.5 |
| 5 | 2.2 |
| 7.5 | 2.4 |
| 10 | 2.5 |
| 15 | 2.4 |
| 20 | 2.4 |
| 30 | 2.5 |

TABLE 6-continued

| (MHz) | (dB) |
|---|---|
| 50 | 2.3 |
| 75 | 2.4 |
| 100 | 2.4 |
| 150 | 2.5 |
| 200 | 2.2 |
| 300 | 2.3 |
| 500 | 2.6 |
| 750 | 3.1 |
| 1000 | 3.9 |
| C1 | |
| 0.1 | 15.7 |
| 0.15 | 15.3 |
| 0.2 | 14.9 |
| 0.3 | 15.0 |
| 0.5 | 14.5 |
| 0.75 | 14.4 |
| 1 | 14.5 |
| 1.5 | 14.9 |
| 2 | 14.7 |
| 3 | 14.8 |
| 5 | 14.5 |
| 7.5 | 14.3 |
| 10 | 14.4 |
| 15 | 14.7 |
| 20 | 14.7 |
| 30 | 14.9 |
| 50 | 14.5 |
| 75 | 14.5 |
| 100 | 14.8 |
| 150 | 15.7 |
| 200 | 15.9 |
| 300 | 18.0 |
| 500 | 20.7 |
| 750 | 9.2 |
| 1000 | 3.4 |
| C2 | |
| 0.1 | 8.8 |
| 0.15 | 8.6 |
| 0.2 | 8.4 |
| 0.3 | 8.4 |
| 0.5 | 8.1 |
| 0.75 | 7.9 |
| 1 | 8.1 |
| 1.5 | 8.4 |
| 2 | 8.3 |
| 3 | 8.3 |
| 5 | 8.0 |
| 7.5 | 7.9 |
| 10 | 7.9 |
| 15 | 8.3 |
| 20 | 8.2 |
| 30 | 8.2 |
| 50 | 8.0 |
| 75 | 7.8 |
| 100 | 8.1 |
| 150 | 8.5 |
| 200 | 8.5 |
| 300 | 9.0 |
| 500 | 10.6 |
| 750 | 9.9 |
| 1000 | 8.8 |

Figure 39:
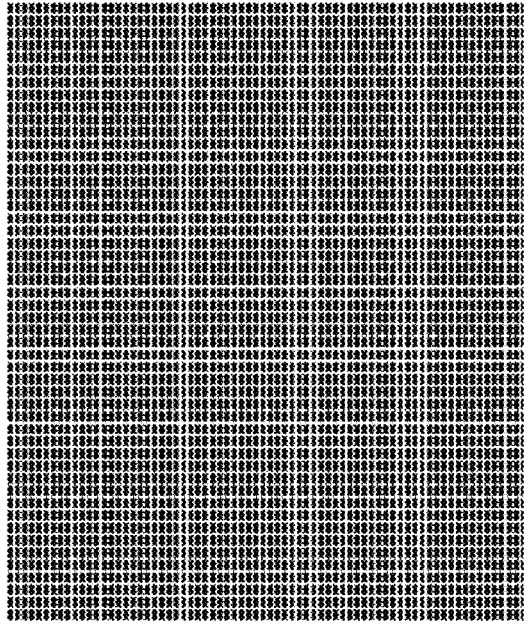
FIG. 39 is an enlarged plan view of a metallic reflective layer of Sample Nos. D1, D2, D3, and D4 according to examples of the present invention.
Figure 39:
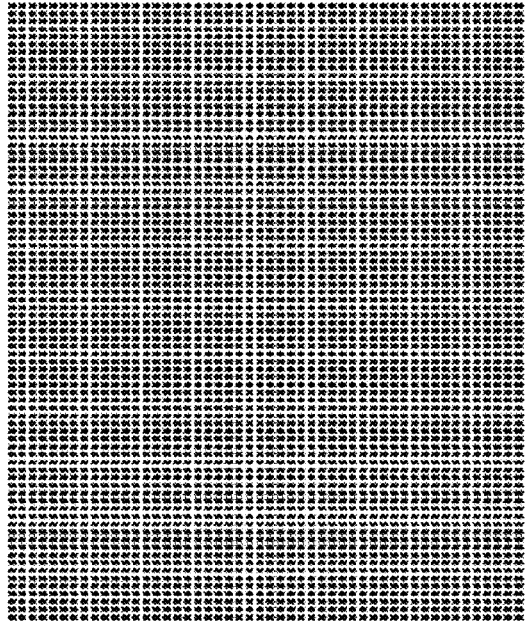
Figure 39:
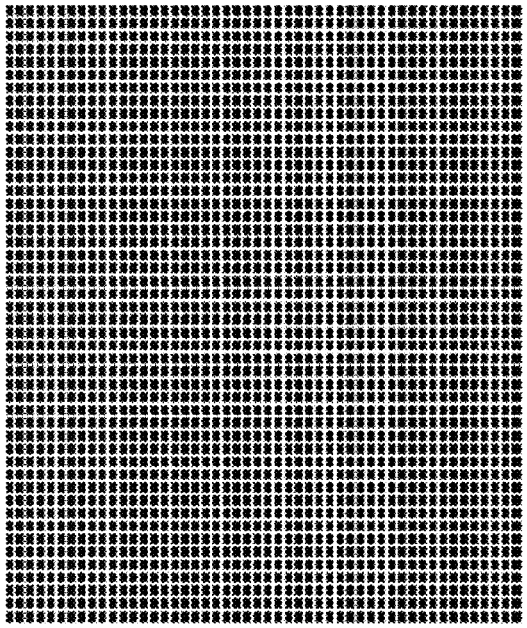
Figure 39:
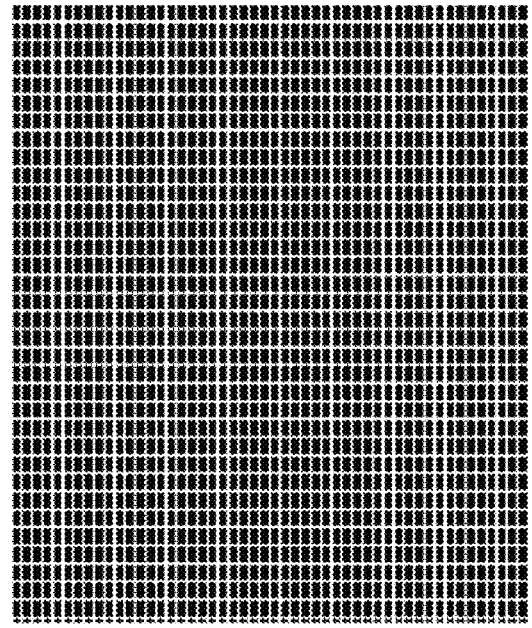

Samples No. D1 to No. D4: FIG. 39, Table 7)

Sample No. D1 was obtained by arranging the black portions (the metallic foil of the metallic reflective layer, hereinafter the same) and vertical stripes having a width of 1 mm at intervals of a white portion (the transmission portion, hereinafter the same) having a width of 0.4 mm, and by arranging horizontal lines of a white portion having a width of 0.4 mm such that the vertical length of the black portion was 2 mm.

Therefore, Sample No. D1 had a rectangular shape, which was one island-like portion of black portion, having a width of 1 mm and a longitudinal length of 2 mm and had a distance (the width of the white portion) of 0.4 mm between the black portions adjacent to each other in the longitudinal and lateral directions.

In Sample No. D2, the black portion, which was one island-like portion, had a rectangular shape having a width of 1.5 mm and a length of 1 mm, and the distance (the width of the white portion) between the adjacent black portions in the vertical and horizontal directions was 0.5 mm.

In Sample No. D3, the black portion, which was one island-like portion, had a rectangular shape having a width of 1.5 mm and a length of 2 mm, and the distance (the width of the white portion) between the black portions adjacent to each other in the vertical and horizontal directions was 0.5 mm.

In Sample No. D4, the black portion, which was one island-like portion, had a rectangular shape having a width of 1.5 mm and a length of 3 mm, and the distance (the width of the white portion) between the black portions adjacent to each other in the vertical and horizontal directions was 0.5 mm.

From the results of Table 7, it was clarified that even if the distance (the width of the white portion) between the adjacent black portions in the vertical and horizontal directions was 0.4 mm or less, which is 1 mm or less, good radio wave permeability was exhibited. It was also shown that the longitudinal length of the black portion is more preferably 3 mm or less.

TABLE 7

| (MHz) | (dB) |
|---|---|
| D1 | |
| 0.1 | 0.6 |
| 0.15 | 0.5 |
| 0.2 | 0.6 |
| 0.3 | 0.6 |
| 0.5 | 0.5 |
| 0.75 | 0.6 |
| 1 | 0.4 |
| 1.5 | 0.3 |
| 2 | 0.2 |
| 3 | 0.2 |
| 5 | 0.2 |
| 7.5 | 0.1 |
| 10 | 0.1 |
| 15 | 0.1 |
| 20 | 0.0 |
| 30 | 0.0 |
| 50 | 0.1 |
| 75 | 0.1 |
| 100 | 0.1 |
| 150 | 0.1 |
| 200 | 0.1 |
| 300 | 0.1 |
| 500 | 0.1 |
| 750 | 0.1 |
| 1000 | 0.1 |
| D2 | |
| 0.1 | 0.3 |
| 0.15 | 0.3 |
| 0.2 | 0.3 |
| 0.3 | 0.3 |
| 0.5 | 0.3 |
| 0.75 | 0.3 |
| 1 | 0.3 |
| 1.5 | 0.3 |
| 2 | 0.3 |
| 3 | 0.2 |

TABLE 7-continued

| (MHz) | (dB) |
|---|---|
| 5 | 0.2 |
| 7.5 | 0.2 |
| 10 | 0.2 |
| 15 | 0.2 |
| 20 | 0.2 |
| 30 | 0.2 |
| 50 | 0.2 |
| 75 | 0.3 |
| 100 | 0.2 |
| 150 | 0.2 |
| 200 | 0.2 |
| 300 | 0.3 |
| 500 | 0.1 |
| 750 | 0.2 |
| 1000 | 0.2 |
| D3 | |
| 0.1 | 0.2 |
| 0.15 | 0.2 |
| 0.2 | 0.2 |
| 0.3 | 0.3 |
| 0.5 | 0.2 |
| 0.75 | 0.2 |
| 1 | 0.2 |
| 1.5 | 0.2 |
| 2 | 0.2 |
| 3 | 0.1 |
| 5 | 0.1 |
| 7.5 | 0.2 |
| 10 | 0.2 |
| 15 | 0.1 |
| 20 | 0.1 |
| 30 | 0.1 |
| 50 | 0.1 |
| 75 | 0.2 |
| 100 | 0.2 |
| 150 | 0.1 |
| 200 | 0.2 |
| 300 | 0.2 |
| 500 | 0.1 |
| 750 | 0.1 |
| 1000 | 0.2 |
| D4 | |
| 0.1 | 0.3 |
| 0.15 | 0.2 |
| 0.2 | 0.3 |
| 0.3 | 0.3 |
| 0.5 | 0.2 |
| 0.75 | 0.2 |
| 1 | 0.2 |
| 1.5 | 0.2 |
| 2 | 0.2 |
| 3 | 0.2 |
| 5 | 0.1 |
| 7.5 | 0.1 |
| 10 | 0.2 |
| 15 | 0.2 |
| 20 | 0.2 |
| 30 | 0.1 |
| 50 | 0.1 |
| 75 | 0.2 |
| 100 | 0.2 |
| 150 | 0.1 |
| 200 | 0.2 |
| 300 | 0.2 |
| 500 | 0.1 |
| 750 | 0.2 |
| 1000 | 0.2 |

Figure 40:
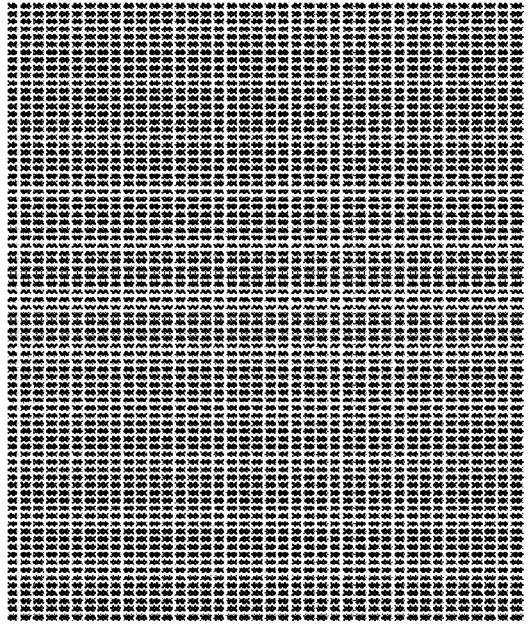
FIG. 40 is an enlarged plan view of a metallic reflective layer of Sample Nos. D5, D6, D7, and D8 according to examples of the present invention.
Figure 40:
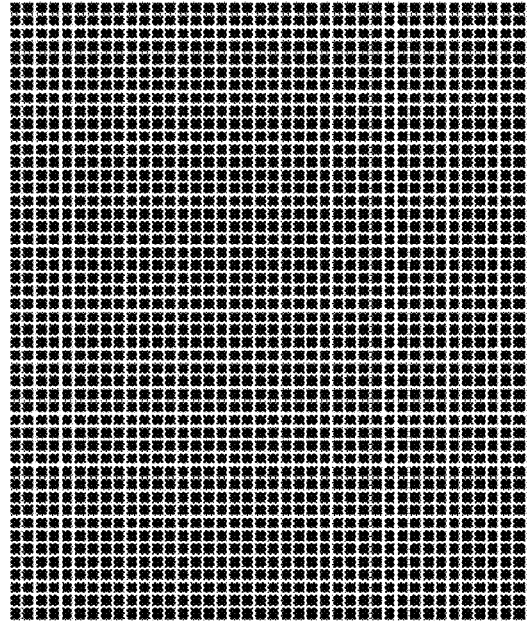
Figure 40:
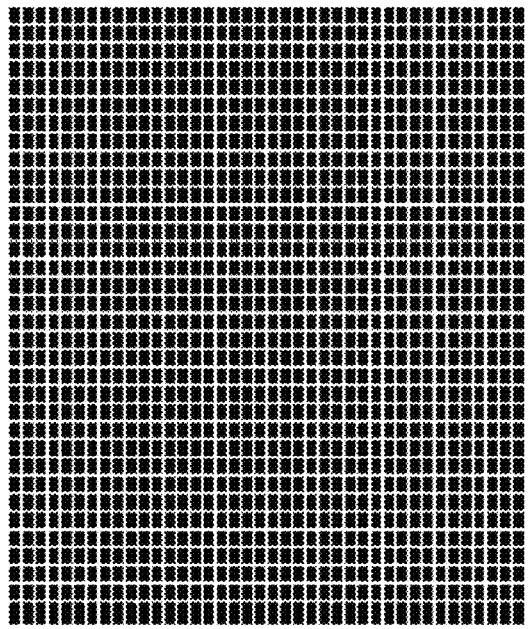
Figure 40:
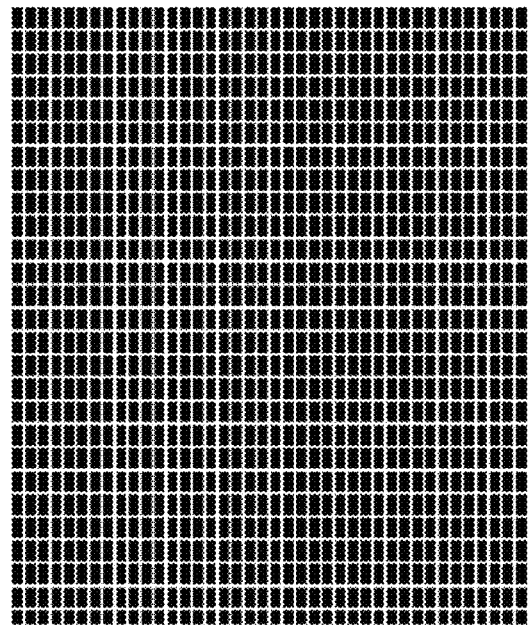

Samples No. D5 to No. D8: FIG. 40, Table 8

Samples No. D5 to No. D8 also show sequence patterns similar to those of the previous Samples No. D1 to D4.

In Sample No. D5, the black portion, which was one island-like portion, had a rectangular having a width of 2 mm and a longitudinal length of 1 mm, and the distance (the width of the white portion) between the adjacent black portions in the longitudinal and lateral directions was 0.5 mm.

In Sample No. D6, the black portion, which was one island-like portion, had a square having a width of 2 mm and a longitudinal length of 2 mm, and the distance (the width of the white portion) between the adjacent black portions in the longitudinal and lateral directions was 0.5 mm.

In Sample No. D7, the black portion, which was one island-like portion, had a rectangular shape having a width of 2 mm and a length of 3 mm, and the distance (the width of the white portion) between the black portions adjacent to each other in the vertical and horizontal directions was 0.5 mm.

In Sample No. D8, the black portion, which was one island-like portion, had a rectangular shape having a width of 2 mm and a longitudinal length of 4 mm, and the distance (the width of the white portion) between the black portions adjacent to each other in the longitudinal and lateral directions was 0.5 mm.

From the results of Table 8, it was confirmed that even if the vertical length of the black portion, which was one island-like portion, was 4 mm, preferable results were exhibited.

TABLE 8

| (MHz) | (dB) |
|---|---|
| D5 | |
| 0.1 | 0.6 |
| 0.15 | 0.5 |
| 0.2 | 0.6 |
| 0.3 | 0.6 |
| 0.5 | 0.5 |
| 0.75 | 0.6 |
| 1 | 0.5 |
| 1.5 | 0.4 |
| 2 | 0.3 |
| 3 | 0.3 |
| 5 | 0.1 |
| 7.5 | 0.1 |
| 10 | 0.1 |
| 15 | 0.1 |
| 20 | 0.1 |
| 30 | 0.1 |
| 50 | 0.1 |
| 75 | 0.2 |
| 100 | 0.2 |
| 150 | 0.1 |
| 200 | 0.1 |
| 300 | 0.2 |
| 500 | 0.1 |
| 750 | 0.1 |
| 1000 | 0.2 |
| D6 | |
| 0.1 | 0.3 |
| 0.15 | 0.3 |
| 0.2 | 0.3 |
| 0.3 | 0.3 |
| 0.5 | 0.3 |
| 0.75 | 0.3 |
| 1 | 0.3 |
| 1.5 | 0.2 |
| 2 | 0.2 |
| 3 | 0.2 |
| 5 | 0.2 |
| 7.5 | 0.2 |
| 10 | 0.2 |
| 15 | 0.2 |
| 20 | 0.2 |
| 30 | 0.2 |

TABLE 8-continued

| (MHz) | (dB) |
|---|---|
| 50 | 0.2 |
| 75 | 0.3 |
| 100 | 0.2 |
| 150 | 0.2 |
| 200 | 0.2 |
| 300 | 0.2 |
| 500 | 0.1 |
| 750 | 0.2 |
| 1000 | 0.3 |
| D7 | |
| 0.1 | 0.3 |
| 0.15 | 0.2 |
| 0.2 | 0.2 |
| 0.3 | 0.3 |
| 0.5 | 0.2 |
| 0.75 | 0.3 |
| 1 | 0.2 |
| 1.5 | 0.2 |
| 2 | 0.1 |
| 3 | 0.1 |
| 5 | 0.1 |
| 7.5 | 0.1 |
| 10 | 0.2 |
| 15 | 0.1 |
| 20 | 0.1 |
| 30 | 0.1 |
| 50 | 0.1 |
| 75 | 0.2 |
| 100 | 0.2 |
| 150 | 0.2 |
| 200 | 0.1 |
| 300 | 0.2 |
| 500 | 0.1 |
| 750 | 0.2 |
| 1000 | 0.2 |
| D8 | |
| 0.1 | 0.5 |
| 0.15 | 0.4 |
| 0.2 | 0.4 |
| 0.3 | 0.4 |
| 0.5 | 0.4 |
| 0.75 | 0.4 |
| 1 | 0.4 |
| 1.5 | 0.4 |
| 2 | 0.3 |
| 3 | 0.3 |
| 5 | 0.3 |
| 7.5 | 0.3 |
| 10 | 0.3 |
| 15 | 0.3 |
| 20 | 0.3 |
| 30 | 0.3 |
| 50 | 0.3 |
| 75 | 0.3 |
| 100 | 0.3 |
| 150 | 0.3 |
| 200 | 0.3 |
| 300 | 0.3 |
| 500 | 0.3 |
| 750 | 0.3 |
| 1000 | 0.4 |

Figure 41:
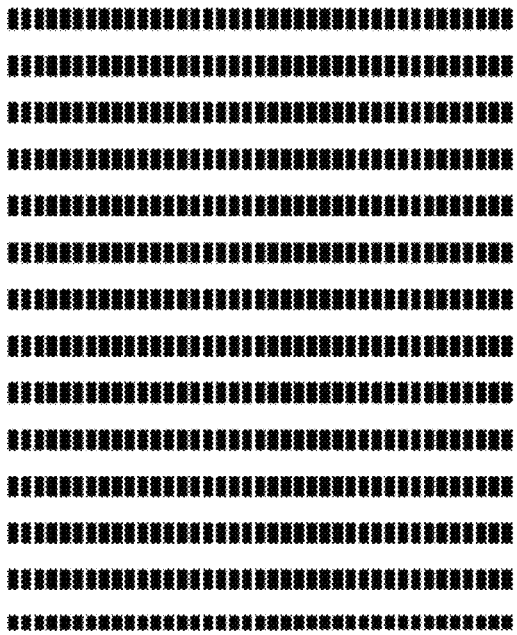
FIG. 41 is an enlarged plan view of a metallic reflective layer of Sample Nos. D9, D10, D11, and D12 according to examples of the present invention.
Figure 41:
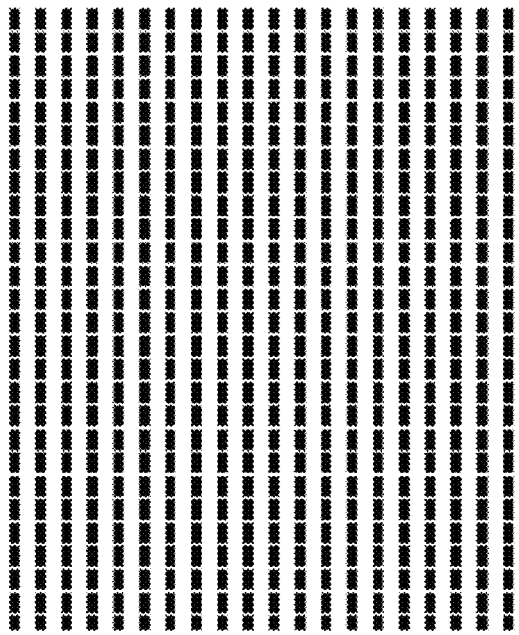
Figure 41:
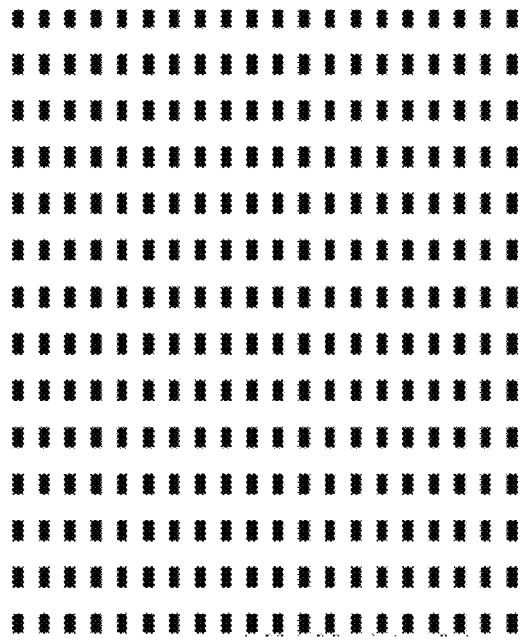
Figure 41:
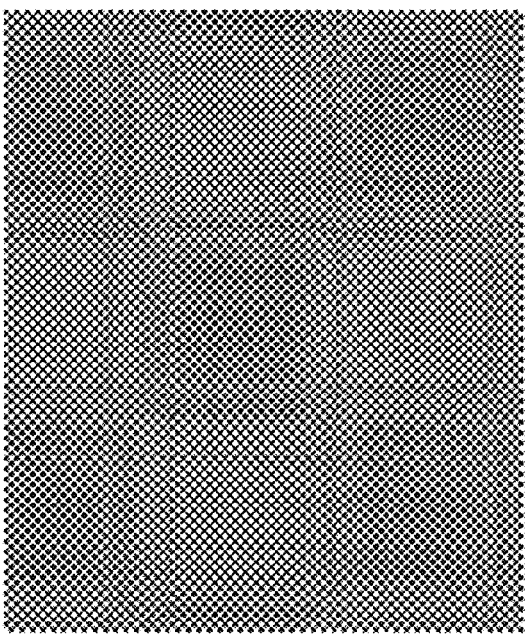

Samples No. D9 to No. D12: FIG. 41, Table 9

Samples No. D9 to No. D11 also show the same sequence patterns as Samples No. D1 to No. D4 described above.

In Sample No. D9, the black portion, which was one island-like portion, had a rectangular shape having a width of 2 mm and a vertical length of 4 mm, the distance (the width of the white portion) between the black portions adjacent to each other was 0.5 mm, and the distance (the width of the white portion) between the black portions adjacent to each other was 5 mm.

In Sample No. D10, the black portion, which was one island-like portion, was a rectangular shape having a width of 2 mm and a vertical length of 4 mm, the distance (the width of the white portion) between the black portions adjacent to each other was 3 mm, and the distance (the width of the white portion) between the black portions adjacent to each other was 0.5 mm.

In Sample No. D11, the black portion, which was one island-like portion, had a rectangular shape having a width of 2 mm and a vertical length of 4 mm, the distance (the width of the white portion) between the black portions adjacent to each other was 3 mm, and the distance (the width of the white portion) between the black portions adjacent to each other was 5 mm.

From the results of Table 9 and Table 8, it was confirmed that good results were obtained when the area of the black portion, which was one island-like portion, was 8 square millimeters or less.

Sample No. D12 shows a pattern in which a square black portion and a square white portion are arranged in a checker flag shape, and the area ratio of the black portion to the white portion is 1:1.

In this Sample No. D12, the black portion, which was one island-like portion, had a square shape having a width of 1 mm and a length of 1 mm, and one white portion had a square shape having a width of 1 mm and a length of 1 mm.

The results of D12 in Table 9 revealed that even in the form of a checker flag array, radio wave permeability was as good as Samples No. D1 to No. D12. Thus, it has been clarified that those in which the black portion is in point contact with another black portion should be understood to be included in a sea-island structure in the present invention.

TABLE 9

| (MHz) | (dB) |
|---|---|
| D9 | |
| 0.1 | 0.3 |
| 0.15 | 0.3 |
| 0.2 | 0.3 |
| 0.3 | 0.3 |
| 0.5 | 0.2 |
| 0.75 | 0.3 |
| 1 | 0.2 |
| 1.5 | 0.2 |
| 2 | 0.2 |
| 3 | 0.2 |
| 5 | 0.2 |
| 7.5 | 0.1 |
| 10 | 0.2 |
| 15 | 0.2 |
| 20 | 0.1 |
| 30 | 0.1 |
| 50 | 0.1 |
| 75 | 0.2 |
| 100 | 0.1 |
| 150 | 0.2 |
| 200 | 0.1 |
| 300 | 0.2 |
| 500 | 0.1 |
| 750 | 0.1 |
| 1000 | 0.2 |
| D10 | |
| 0.1 | 0.5 |
| 0.15 | 0.4 |
| 0.2 | 0.4 |
| 0.3 | 0.4 |
| 0.5 | 0.4 |
| 0.75 | 0.4 |
| 1 | 0.3 |
| 1.5 | 0.2 |

TABLE 9-continued

| (MHz) | (dB) |
|---|---|
| 2 | 0.2 |
| 3 | 0.1 |
| 5 | 0.1 |
| 7.5 | 0.1 |
| 10 | 0.1 |
| 15 | 0.1 |
| 20 | 0.1 |
| 30 | 0.1 |
| 50 | 0.1 |
| 75 | 0.1 |
| 100 | 0.1 |
| 150 | 0.1 |
| 200 | 0.1 |
| 300 | 0.2 |
| 500 | 0.1 |
| 750 | 0.1 |
| 1000 | 0.2 |
| D11 | |
| 0.1 | 0.2 |
| 0.15 | 0.2 |
| 0.2 | 0.2 |
| 0.3 | 0.2 |
| 0.5 | 0.1 |
| 0.75 | 0.2 |
| 1 | 0.1 |
| 1.5 | 0.1 |
| 2 | 0.1 |
| 3 | 0.0 |
| 5 | 0.0 |
| 7.5 | 0.0 |
| 10 | 0.1 |
| 15 | 0.0 |
| 20 | 0.0 |
| 30 | 0.0 |
| 50 | 0.1 |
| 75 | 0.1 |
| 100 | 0.1 |
| 150 | 0.1 |
| 200 | 0.1 |
| 300 | 0.1 |
| 500 | 0.0 |
| 750 | 0.0 |
| 1000 | 0.1 |
| D12 | |
| 0.1 | 0.3 |
| 0.15 | 0.3 |
| 0.2 | 0.2 |
| 0.3 | 0.3 |
| 0.5 | 0.3 |
| 0.75 | 0.3 |
| 1 | 0.3 |
| 1.5 | 0.2 |
| 2 | 0.2 |
| 3 | 0.2 |
| 5 | 0.2 |
| 7.5 | 0.2 |
| 10 | 0.2 |
| 15 | 0.2 |
| 20 | 0.2 |
| 30 | 0.2 |
| 50 | 0.2 |
| 75 | 0.2 |
| 100 | 0.2 |
| 150 | 0.2 |
| 200 | 0.2 |
| 300 | 0.2 |
| 500 | 0.2 |
| 750 | 0.2 |
| 1000 | 0.2 |

Figure 42:
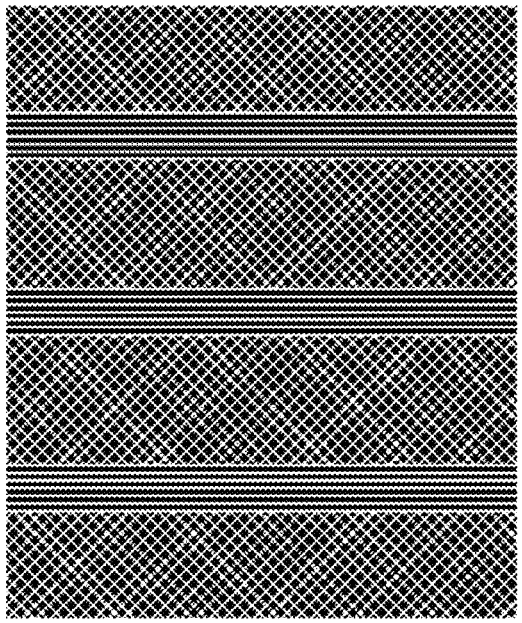
FIG. 42 is an enlarged plan view of a metallic reflective layer of Sample Nos. E1, E2, and E4 according to examples of the present invention.
Figure 42:
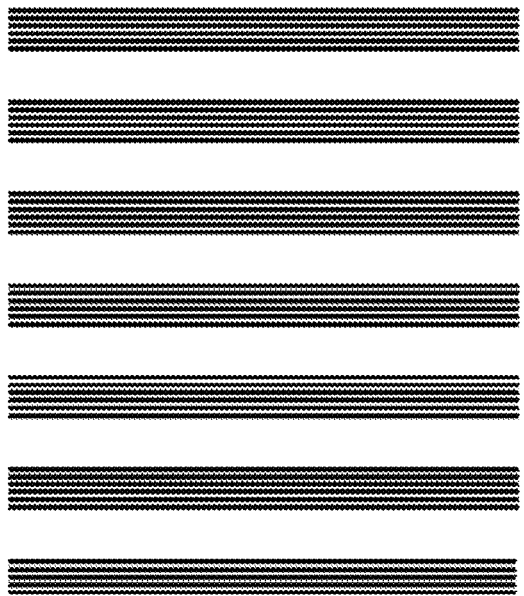
Figure 42:
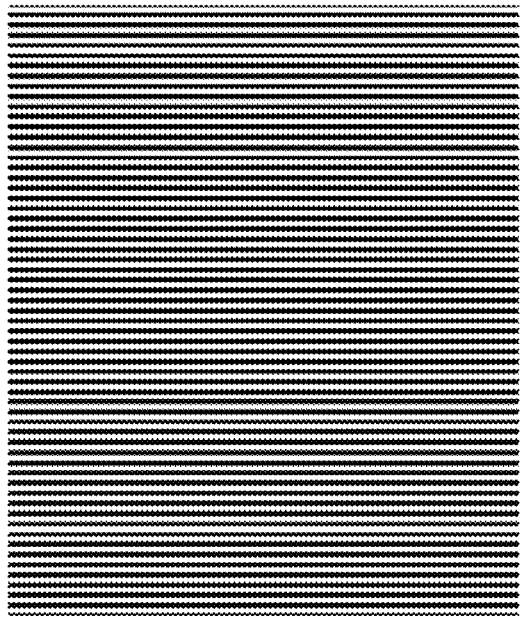

Samples No. E1 to No. E3: FIG. 42 to Table 10

In Sample No. E1, the black portion was obtained by arranging six horizontal stripes having a width of 1 mm and six stripes with a vertical spacing of 0.5 mm, and between these horizontal stripe groups, a white portion of an oblique grid with a width of 0.5 mm was provided between black portions.

In Sample No. E2, the black portion was obtained by arranging six horizontal stripes with a width of 1 mm with a vertical spacing of 0.5 mm, and a white portion with a vertical width substantially the same as that of the horizontal stripe group was provided between these horizontal stripe groups.

In Sample No. E3, the black portion was obtained by arranging horizontal stripes with a width of 1 mm in length at intervals of 1 mm above and below.

From the results in Table 10, it was confirmed that the larger the interval between the horizontal stripe groups, the better the result.

TABLE 10

| (MHz) | (dB) |
|---|---|
| E1 | |
| 0.1 | 4.6 |
| 0.15 | 4.5 |
| 0.2 | 4.4 |
| 0.3 | 4.5 |
| 0.5 | 4.1 |
| 0.75 | 4.2 |
| 1 | 4.4 |
| 1.5 | 4.4 |
| 2 | 4.2 |
| 3 | 4.4 |
| 5 | 4.0 |
| 7.5 | 4.1 |
| 10 | 4.3 |
| 15 | 4.3 |
| 20 | 4.3 |
| 30 | 4.5 |
| 50 | 3.9 |
| 75 | 4.2 |
| 100 | 4.2 |
| 150 | 4.5 |
| 200 | 4.1 |
| 300 | 4.2 |
| 500 | 4.9 |
| 750 | 6.6 |
| 1000 | 9.9 |
| E2 | |
| 0.1 | 9.8 |
| 0.15 | 9.6 |
| 0.2 | 9.5 |
| 0.3 | 9.4 |
| 0.5 | 9.0 |
| 0.75 | 8.9 |
| 1 | 8.9 |
| 1.5 | 9.4 |
| 2 | 9.3 |
| 3 | 9.3 |
| 5 | 8.9 |
| 7.5 | 8.9 |
| 10 | 8.9 |
| 15 | 9.3 |
| 20 | 9.2 |
| 30 | 9.2 |
| 50 | 8.9 |
| 75 | 8.8 |
| 100 | 9.0 |
| 150 | 9.4 |
| 200 | 9.2 |
| 300 | 9.4 |
| 500 | 11.2 |
| 750 | 17.0 |
| 1000 | 16.7 |

TABLE 10-continued

| (MHz) | (dB) |
|---|---|
| E3 | |
| 0.1 | 28.5 |
| 0.15 | 26.3 |
| 0.2 | 25.5 |
| 0.3 | 25.0 |
| 0.5 | 24.4 |
| 0.75 | 24.2 |
| 1 | 24.4 |
| 1.5 | 24.8 |
| 2 | 24.6 |
| 3 | 24.7 |
| 5 | 24.4 |
| 7.5 | 24.1 |
| 10 | 24.3 |
| 15 | 24.7 |
| 20 | 24.6 |
| 30 | 24.7 |
| 50 | 24.4 |
| 75 | 24.4 |
| 100 | 24.7 |
| 150 | 253.8 |
| 200 | 26.4 |
| 300 | 29.9 |
| 500 | 25.7 |
| 750 | 15.3 |
| 1000 | 7.5 |

DESCRIPTION OF SYMBOLS

1: Smartphone
2: Protective case of smartphone
3: Metallic portion
4: Transmission portion
10: Base sheet
11: Overlapped portion
12: Plane colored portion
13: Non-colored metallic reflective portion
14: Non-colored non-reflective portion
50: Minute thickened portion
51: Metallic tone print sheet
52: Colored layer
53: Colored region
54: Colored region
55: Fine thickened portion
56: Thickened portion
57: Metallic reflective layer
58: Concave curved portion
59: Metallic concave reflective surface
71: Outer shell member

The invention claimed is:

1. An outer shell member for communication equipment, the outer shell member including communication equipment equipped with a communication device having an antenna for radio communication and a protective case to be attached to the communication equipment, the outer shell member comprising:
a metallic tone print sheet arranged at least at a part of the outer shell member, the metallic tone print sheet being composed of a base sheet on which metallic printing is applied,
wherein the metallic tone print sheet includes, when viewed from a front surface side, a metallic portion provided with a metallic reflective layer on a rear surface side of the base sheet and a transmission portion not provided with a metallic reflective layer,
wherein the transmission portion has radio wave permeability that allows transmission of radio waves to the communication device,
wherein the metallic portion is provided with a colored layer with light permeability and a thickened portion with light permeability, the colored layer and the thickened portion being arranged at least at a part of the metallic portion on a rear surface side of the base sheet,
wherein the metallic reflective layer is provided with a metallic concave reflective surface curved in accordance with a change in a thickness of the thickened portion in a cross-section in a thickness direction of the metallic tone print sheet by being arranged at least on a rear surface side of the thickened portion,
wherein the metallic tone print sheet is provided with a minute region having the metallic portion smaller in a plane area than the colored layer at least in a partial region as viewed from the front surface side, and
wherein the minute region has, when viewed from the front surface side, a sea-island structure composed of a sea-like portion in which the transmission portions are continuously connected and an island-like portion in which the metallic portion is surrounded by the transmission portion.

2. The outer shell member for communication equipment as recited in claim 1, wherein the metallic tone print sheet has an electric field shielding property of 1 (dB) or less in a band of 1 MHz to 1 GHz according to a KEC method.

3. The outer shell member for communication equipment as recited in claim 1, wherein in the minute region, there exist three or more dot-like or linear-like fine metallic portions per square centimeter, and the transmission portion is arranged between the metallic portions.

4. The outer shell member for communication equipment as recited in claim 1, wherein in the minute region, a plurality of island-like portions is arranged via the sea-like portion, and a width of the sea-like portion between the island-like portions is a fine width of 10 mm or less.

5. The outer shell member for communication equipment as recited in claim 1, wherein the island-like portion is formed in a dot-like or line-like shape having an average length of 20 mm or less.

6. The outer shell member for communication equipment as recited in claim 1, wherein among the island-like portions, an island-like portion having the longest length is 40 mm or less in length.

7. The outer shell member for communication equipment as recited in claim 1, wherein a plurality of minute regions is provided, and the metallic portion having a length exceeding 40 mm is arranged between the plurality of minute regions.

8. The outer shell member for communication equipment as recited in claim 1,
wherein the colored layer has light permeability and radio wave permeability and gives color to the metallic tone print sheet when viewed from the front surface side,
wherein the thickened portion has light permeability and radio wave permeability and gives a three-dimensional decorative effect to the metallic tone print sheet when viewed from the front surface side,
wherein the metallic reflective layer is arranged on a rear surface side of the colored layer and the thickened portion,
wherein the thickened portion protrudes rearward in a cross-section in a thickness direction of the base sheet, a periphery of the thickened portion forms a curved portion, and the metallic concave reflective surface is configured by the metallic reflective layer arranged on a rear surface of the curved portion of at least a part of the thickened portion to enable visual recognition of reflected light from the metallic concave reflective surface when the metallic tone print sheet is viewed from a front surface side.

9. The outer shell member for communication equipment as recited in claim 1,
wherein the metallic reflective layer and the colored layer superposed on a front surface side of the metallic reflective layer in the minute region are shifted from each other when viewed from the front surface side, and
when viewed from the front surface side, the metallic portion is configured by an overlapped portion in which the colored layer, the thickened portion, and the metallic reflective layer are overlapped, and a non-colored metallic reflective portion in which only the thickened portion and the metallic reflective layer exist and the colored layer does not exist, and
when viewed from the front surface side, the transmission portion is configured by a plane colored portion in which only the colored layer exists, and the thickened portion and the metallic reflective layer do not exist and a non-colored non-reflective portion in which none of the colored layer, the thickened portion, and the metallic reflective layer exist.

10. The outer shell member for communication equipment as recited in claim 1,
wherein a rear surface side colored layer formed by coloring ink is provided at least at a portion between the minute regions on a rear surface side of the base sheet when viewed from the front surface side.

11. Communication equipment equipped with a communication device having an antenna, comprising:
an outer shell member for the communication device as recited in claim 1,
wherein the metallic tone print sheet is arranged on the front surface side of the antenna.

12. A protective case to be attached to communication equipment, comprising:
the outer shell member for communication equipment as recited in claim 1, the outer shell member being configured to be arranged at least on a front surface of the protective case, and
wherein a metallic tone print sheet is arranged at a portion positioned on a front surface side of the antenna.

13. An outer shell member for communication equipment, the outer shell member including a mobile device equipped with a communication device and a protective case to be attached to the mobile device, the outer shell member comprising:
a metallic tone print sheet arranged at least at a part of the outer shell member, the metallic tone print sheet being composed of a base sheet on which metallic printing is applied,
wherein the metallic tone print sheet includes, when viewed from a front surface side, a metallic portion provided with a metallic reflective layer and a transmission portion not provided with a metallic reflective layer,
wherein the transmission portion has radio wave permeability that allows transmission of radio waves to the communication device,
wherein the metallic reflective layer is configured by a transfer foil or printing ink arranged on a rear surface side of the base sheet having light permeability and radio wave permeability,
wherein the colored layer and the thickened portion are arranged on the rear surface side of the base sheet,
wherein the metallic reflective layer includes a metallic concave reflective surface curved in a cross-section in a thickness direction of the metallic tone print sheet,
wherein the colored layer has light permeability and radio wave permeability and gives color to the metallic tone print sheet when viewed from the front surface side,
wherein the thickened portion has light permeability and radio wave permeability and gives a three-dimensional decorative effect to the metallic tone print sheet when viewed from the front surface side,
wherein the metallic reflective layer is arranged on a rear surface side of the colored layer and the thickened portion,
wherein the thickened portion protrudes rearward in a cross-section in a thickness direction of the base sheet, a periphery of the thickened portion forms a curved portion, and the metallic concave reflective surface is configured by the metallic reflective layer arranged on a rear surface of the curved portion of at least a part of the thickened portion to enable visual recognition of reflected light from the metallic concave reflective surface when the metallic tone print sheet is viewed from a front surface side,
wherein the metallic tone print sheet is provided with a minute region at least in a partial region as viewed from the front surface side,
wherein the minute region is a region in which the transmission portion having an area smaller than the colored layer and the metallic portion are arranged in a mixed manner,
wherein the thickened portion in the minute region is a minute thickened portion,
wherein the minute thickened portion is a portion where the minute thickened portions having an area smaller than the colored layer on the front surface side are gathered,
wherein the metallic reflective layer is arranged on a rear surface of at least a plurality of the fine thickened portions,
wherein the metallic concave reflective surface is provided at least at a plurality of the fine thickened portions,
when viewed from the from side, in the colored layer on the front surface side of the minute thickened portion, reflected light from the metallic concave reflective surface in the plurality of the fine thickened portions is configured to be visually recognized, and
wherein the minute region has, when viewed from the front surface side, a sea-island structure composed of a sea-like portion in which the transmission portions are continuously connected and an island-like portion in which the metallic portion is surrounded by the transmission portion.

14. A metallic tone print sheet for use at least in a portion of an outer shell member for communication equipment, the outer shell member including communication equipment equipped with a communication device having an antenna for radio communication and a protective case to be attached to the communication equipment, the metallic tone print sheet comprising:
- a base sheet on which metallic tone printing is applied,
- wherein the metallic tone print sheet includes, when viewed from a front surface side, a metallic portion provided with a metallic reflective layer on a rear surface side of the base sheet and a transmission portion not provided with a metallic reflective layer,
- wherein the transmission portion has radio wave permeability that allows transmission of radio waves to the communication device,
- wherein the metallic portion includes a colored layer having light permeability and a thickened portion having light permeability at least at a part of the metallic portion, the colored layer and the thickened portion being arranged on a rear surface side of the base sheet,
- wherein the metallic reflective layer is provided with a metallic concave reflective surface curved in accordance with a change in a thickness of the thickened portion in a cross-section in a thickness direction of the metallic tone print sheet by being arranged at least on a rear surface side of the thickened portion,
- wherein the metallic tone print sheet is provided with a minute region having the metallic portion smaller in a plane area than the colored layer at least in a partial region as viewed from the front surface side, and
- wherein the minute region has, when viewed from the front surface side, a sea-island structure composed of a sea-like portion in which the transmission portions are continuously connected and an island-like portion in which the metallic portion is surrounded by the transmission portion.

* * * * *